United States Patent
Tadokoro et al.

(10) Patent No.: US 6,838,388 B2
(45) Date of Patent: Jan. 4, 2005

(54) FABRICATION METHOD OF SEMICONDUCTOR INTEGRATED CIRCUIT DEVICE

(75) Inventors: Masahiro Tadokoro, Hachioji (JP); Masahiro Shioya, Tama (JP); Masayuki Kojima, Kokubunji (JP); Takenobu Ikeda, Ome (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 23 days.

(21) Appl. No.: 09/893,577

(22) Filed: Jun. 29, 2001

(65) Prior Publication Data
US 2002/0001963 A1 Jan. 3, 2002

(30) Foreign Application Priority Data
Jul. 3, 2000 (JP) ...................................... 2000-200986

(51) Int. Cl.[7] ............................................ H01L 21/302
(52) U.S. Cl. ...................... 438/714; 438/723; 438/724
(58) Field of Search ................................ 438/706, 710, 438/712, 714, 715, 723, 724

(56) References Cited

U.S. PATENT DOCUMENTS

| 5,242,539 | A | | 9/1993 | Kumihashi et al. | |
|---|---|---|---|---|---|
| 5,282,925 | A | * | 2/1994 | Jeng et al. | ..................... 134/31 |
| 6,136,643 | A | * | 10/2000 | Jeng et al. | ................... 438/253 |
| 6,159,862 | A | * | 12/2000 | Yamada et al. | ............. 438/712 |
| 6,238,588 | B1 | * | 5/2001 | Collins et al. | ......... 204/192.32 |
| 6,238,937 | B1 | * | 5/2001 | Toprac et al. | .................. 216/59 |
| 6,403,491 | B1 | * | 6/2002 | Liu et al. | ..................... 438/710 |
| 6,423,242 | B1 | | 7/2002 | Kojima et al. | |
| 6,432,318 | B1 | * | 8/2002 | Ding et al. | ................... 216/67 |

FOREIGN PATENT DOCUMENTS

| JP | 8-45917 | 2/1996 | ....... H01L/21/3065 |
|---|---|---|---|
| JP | 11-317392 | 11/1999 | ....... H01L/21/3065 |
| JP | 2000-173993 | 6/2000 | |

OTHER PUBLICATIONS

Patent Abstracts of Japan 11317392 A Nov. 16, 1999.
Patent Abstracts of Japan 08045917 A Feb. 16, 1996.

* cited by examiner

*Primary Examiner*—Kin-Chan Chen
(74) *Attorney, Agent, or Firm*—Antonelli, Terry, Stout & Kraus, LLP

(57) ABSTRACT

A fabrication method of a semiconductor integrated circuit device comprises, in an SAC process or HARC process, subjecting a semiconductor substrate to plasma etching to make contact holes in an oxide film made of a silicon oxide film formed on the semiconductor substrate. For improving the ease-in-etching property of the silicon oxide film and selectivity to a nitride film, a residence time of an etching gas within a chamber is so set as to be in a range where selectivity to an insulating film made of silicon nitride is improved by using etching conditions of a low pressure and a large flow rate of the etching gas of $C_5H_8/O_2/Ar$.

19 Claims, 44 Drawing Sheets

FIG. 13

| PARAMETERS | |
|---|---|
| PRESSURE [Pa] | 2.66 |
| RF POWER   UPPER PORTION   [W] | 800 |
| LOWER PORTION   [W] | 700 |
| FLOW RATE OF $C_5F_8$   [cm³/minute] | 16 |
| FLOW RATE OF $O_2$   [cm³/minute] | 18 |
| FLOW RATE OF Ar   [cm³/minute] | 800 |
| ELECTRODE TEMPERATURE   UPPER PORTION (°C) | 60 |
| LOWER PORTION (°C) | 20 |
| TEMPERATURE OF WALL SURFACE [°C] | 50 |
| ELECTRODE GAP [mm] | 21 |

FIG. 14

| PARAMETERS | | |
|---|---|---|
| PRESSURE [Pa] | | 2.66 |
| RF POWER   UPPER PORTION [W] | | 1800 |
| LOWER PORTION [W] | | 1500 |
| FLOW RATE OF $C_5F_8$ [cm³/minute] | | 24 |
| FLOW RATE OF $O_2$ [cm³/minute] | | 28 |
| FLOW RATE OF Ar [cm³/minute] | | 700 |
| ELECTRODE TEMPERATURE | | |
| UPPER PORTION (°C) | | 60 |
| LOWER PORTION (°C) | | 20 |
| TEMPERATURE OF WALL SURFACE [°C] | | 50 |
| ELECTRODE GAP [mm] | | 19 |

FABRICATION METHOD OF SEMICONDUCTOR INTEGRATED CIRCUIT DEVICE

BACKGROUND OF THE INVENTION

This invention relates to a technique of fabricating a semiconductor integrated circuit device and more particularly, to a technique effective for application, for example, to a self-aligned contact (hereinafter referred to simply as SAC) process or a high aspect ratio contact (hereinafter referred to simply as HARC) process in the fabrication method of a semiconductor integrated circuit device.

This type of technique is described, for example, in Japanese Laid-open Patent Application No. Hei 11 (1999)-317392. In this application, there is disclosed a technique wherein when a silicon oxide layer is etched while ensuring great selectivity to a silicon nitride layer, the use of perfluorocycloolefins (containing $C_5F_8$) as an etching gas permits a selection ratio to be high and an in-plane variation of the selection ratio to be lowered.

In Japanese Laid-open Patent Application No. Hei 8 (1996)-45917, for example, there is disclosed a technique of high-speed etching of a deep groove or a hole wherein the residence time of a reaction gas in a low pressure condition within a chamber is set at 100 ms or below for etching.

SUMMARY OF THE INVENTION

In the SAC process which we have studied, an etching gas made of a mixed gas including aside from $C_4F_8$, a fluorocarbon gas such as $C_5F_8$, $CH_2F_2$, $CHF_3$ or $CF_4$ and oxygen is employed. Etching of a silicon oxide ($SiO_2$) film proceeds through reaction with a fluorocarbon compound formed by dissociation of a fluorocarbon gas, whereas an underlying silicon nitride (SiN) film is lower in reactivity with the fluorocarbon compound than the silicon oxide film, so that a polymer layer is deposited on the silicon nitride film relatively thickly. The thickness of the polymer layer and a C/F ratio (i.e. a ratio in number between carbon atoms and fluorine atoms) is optimized depending on the type of gas species and the like, thereby realizing high selectivity between the silicon oxide film and the silicon nitride film.

With respect to the tendency toward a high aspect ratio accompanied by scale down of a design rule, conditions have been changed so that a pressure within a treating chamber is lowered from the standpoint of improving an ease-in-etching property such as for a hole or groove, and a total flow rate of a gas fed into the treating chamber is increased. The lowering of a selection ratio to the silicon nitride film caused by the change is compensated for by addition of a gas, such as $CH_2F_2$ or the like, which is capable of strong deposition.

In the HARC process that we have studied, a similar type of etching gas as in the SAC process is fundamentally used, and a similar measure as in the SAC process has been taken so as to ensure good ease-in-hole or groove etching property and selectivity.

However, in the techniques of the SAC process and HARC process, the aspect ratio (depth/width) of a hole or groove increases still more, and we have found that there arises a problem as to how the ease-in-etching property and the selectivity stand together.

In the SAC process, for example, when etching is carried out so as to enhance the ease-in-etching property of the silicon oxide film, it is possible to make a hole or groove. However, the selection ratio between the silicon oxide film and the silicon nitride film cannot be ensured, so that the margin for short-circuiting between a conductor film buried in the hole or groove and an underlying conductor film becomes insufficient, thereby causing these conductor films to be short-circuited. In contrast, when etching is carried out so as to increase the selection ratio, a hole or groove per se cannot be formed satisfactorily. In the HARC process, for example, etching is effected so as to enhance the opening property of a silicon oxide film, it becomes possible to make a hole or groove, the selection ratio between the silicon oxide film and a hard mask or the like cannot be ensured, thereby causing a plane processing size and a vertical shape in section of a hole to be worsened. In contrast, when the etching is effected so that the selection ratio increases, a hole or groove cannot be made satisfactorily.

An object of the invention is to provide a technique of improving a ease-in-etching property of a silicon oxide film and selectivity to a nitride film in a plasma etching process.

Another object of the invention is to provide a technique of improving a yield of a semiconductor integrated circuit device used in a plasma etching process.

Another object of the invention is to provide a technique of improving mass production property of a semiconductor integrated circuit device used in a plasma etching process.

Another object of the invention is to provide a technique of improving reliability of a semiconductor integrated circuit device used in a plasma etching process.

Another object of the invention is to provide a technique of improving the performance of a semiconductor integrated circuit device used in a plasma etching process.

The above and other objects and novel features of the invention will become apparent from the description of the specification with reference to the accompanying drawings.

Typical embodiments of the invention are briefly described below.

The invention contemplates to provide a method of fabricating a semiconductor integrated circuit device, which comprises subjecting a semiconductor substrate to plasma etching with an etching gas containing a fluorocarbon gas, oxygen and a dilution gas to process a silicon oxide insulating film on the semiconductor substrate, wherein the etching is carried out in such a state that a residence time within an etching chamber is set in a range where selectivity to a silicon nitride insulating film is improved by establishing a low pressure within the chamber and passing the etching gas at a large flow rate.

The invention also provides a method of fabricating a semiconductor integrated circuit device, which comprises subjecting a semiconductor substrate to plasma etching with an etching gas having a fluorocarbon gas, oxygen and a dilution gas to process a silicon oxide insulating film on the semiconductor substrate, wherein the etching is carried out in such a state that a residence time within an etching chamber is set in a range where selectivity to a hard mask is improved by establishing a low pressure within the chamber and passing the etching gas at a large flow rate.

Other embodiments of the invention are described below.

1. The invention provides a fabrication method of a semiconductor integrated circuit device, which comprises subjecting a semiconductor substrate to plasma etching with an etching gas containing a fluorocarbon gas, oxygen and a dilution gas to process a silicon oxide insulating film on the semiconductor substrate, wherein a residence time of the etching gas within an etching chamber ranges from 50 to 700 ms.

2. The invention provides a fabrication method of a semiconductor integrated circuit device, which comprises subjecting a semiconductor substrate to plasma etching with an etching gas having a fluorocarbon gas, oxygen and a dilution gas to process a silicon oxide insulating film on the semiconductor substrate, wherein a residence time of the etching gas within an etching chamber ranges from 50 to 350 ms.

3. The invention provides a fabrication method of a semiconductor integrated circuit device, which comprises subjecting a semiconductor substrate to plasma etching with an etching gas having a fluorocarbon gas, oxygen and a dilution gas to process a silicon oxide insulating film on the semiconductor substrate, wherein a residence time of the etching gas within an etching chamber ranges from 100 to 200 ms.

4. The invention provides a fabrication method of a semiconductor integrated circuit device, which comprises the steps of:
   (a) depositing a silicon nitride insulating film on a semiconductor substrate;
   (b) depositing a silicon oxide insulating film on the silicon nitride insulating film; and
   (c) subjecting the semiconductor substrate to a plasma etching treatment using an etching gas containing a fluorocarbon gas, oxygen and a dilution gas to process the silicon oxide insulating film, wherein a residence time of the etching gas within an etching chamber is set at 50 to 700 ms.

5. The invention provides a fabrication method of a semiconductor integrated circuit device, which comprises the steps of:
   (a) depositing a silicon nitride insulating film on a semiconductor substrate;
   (b) depositing a silicon oxide insulating film on the silicon nitride insulating film; and
   (c) subjecting the semiconductor substrate to a plasma etching treatment using an etching gas containing a fluorocarbon gas, oxygen and a dilution gas to process the silicon oxide insulating film, wherein a residence time of the etching gas within an etching chamber is set at 50 to 350 ms.

6. The invention provides a fabrication method of a semiconductor integrated circuit device, which comprises the steps of:
   (a) depositing a silicon nitride insulating film on a semiconductor substrate;
   (b) depositing a silicon oxide insulating film on the silicon nitride insulating film; and
   (c) subjecting the semiconductor substrate to a plasma etching treatment using an etching gas containing a fluorocarbon gas, oxygen and a dilution gas to process the silicon oxide insulating film, wherein a residence time of the etching gas within an etching chamber is set at 100 to 200 ms.

7. The invention provides a fabrication method of a semiconductor integrated circuit device, which comprises the steps of:
   (a) depositing an electrode wiring on a semiconductor substrate;
   (b) depositing a silicon nitride insulating film so as to cover the electrode wiring on the semiconductor substrate therewith;
   (c) depositing a silicon oxide insulating film on the silicon nitride film insulating film; and
   (d) subjecting the semiconductor substrate to a plasma etching treatment using an etching gas containing a fluorocarbon gas, oxygen and a dilution gas, to form a hole in the silicon oxide insulating film self-alignedly with the electrode wiring, wherein a residence time of the etching gas within an etching chamber is set at 50 to 700 ms.

8. The invention provides a fabrication method of a semiconductor integrated circuit device, which comprises the steps of:
   (a) depositing an electrode wiring on a semiconductor substrate;
   (b) depositing a silicon nitride insulating film so as to cover the electrode wiring on the semiconductor substrate therewith;
   (c) depositing a silicon oxide insulating film on the silicon nitride insulating film; and
   (d) subjecting the semiconductor substrate to a plasma etching treatment using an etching gas containing a fluorocarbon gas, oxygen and a dilution gas, to form a hole in the silicon oxide insulating film self-alignedly with the electrode wiring, wherein a residence time of the etching gas within an etching chamber is set at 50 to 350 ms.

9. The invention provides a fabrication method of a semiconductor integrated circuit device, which comprises the steps of:
   (a) depositing an electrode wiring on a semiconductor substrate;
   (b) depositing a silicon nitride insulating film so as to cover the electrode wiring on the semiconductor substrate therewith;
   (c) depositing a silicon oxide insulating film on the silicon nitride film insulating film; and
   (d) subjecting the semiconductor substrate to a plasma etching treatment using an etching gas containing a fluorocarbon gas, oxygen and a dilution gas, to form a hole in the silicon oxide insulating film self-alignedly with the electrode wiring, wherein a residence time of the etching gas within an etching chamber is set at 100 to 200 ms.

10. The invention provides a method as set forth in any one of 1 to 9 above, wherein a pressure within the etching chamber during the course of the plasma etching treatment ranges from 0.7 to 7 Pa.

11. The invention provides a method as set forth in any one of 1 to 9 above, wherein a pressure within the etching chamber during the course of the plasma etching treatment ranges from 1.3 to 4 Pa.

12. The invention provides a method as set forth in any one of 1 to 11 above, wherein a total flow rate of the etching gas passed into the etching chamber ranges from 200 to 1000 $cm^3$/minute.

13. The invention provides a method as set forth in any one of 1 to 11 above, wherein a total flow rate of the etching gas passed into the etching chamber ranges from 400 to 800 $cm^3$/minute.

14. The invention provides a method as set forth in any one of 1 to 11 above, wherein a total flow rate of the etching gas passed into the etching chamber is at 700 $cm^3$/minute or over.

15. The invention provides a method as set forth in any one of 7 to 9 above, further comprising, after the plasma etching treatment, the steps of removing the silicon nitride film exposed from the hole to expose the semiconductor substrate, and burying a conductive film in the hole exposed with the semiconductor substrate.

16. The invention provides a fabrication method of a semiconductor integrated circuit device, which comprises subjecting, to a semiconductor substrate, a plasma etching treatment using an etching gas containing a fluorocarbon gas, oxygen and a dilution gas to process a silicon oxide insulating film on the semiconductor substrate, wherein a pressure within an etching chamber during the course of the plasma etching treatment ranges from 0.7 to 7 Pa.

17. The invention provides a fabrication method of a semiconductor integrated circuit device, which comprises subjecting, to a semiconductor substrate, a plasma etching treatment using an etching gas containing a fluorocarbon gas, oxygen and a dilution gas to process a silicon oxide insulating film on the semiconductor substrate, wherein a pressure within an etching chamber during the course of the plasma etching treatment ranges from 1.3 to 4 Pa.

18. The invention provides a fabrication method as set out in 16 or 17 above, wherein a total flow rate of the etching gas passed in the etching chamber ranges from 200 to 1000 $cm^3$/minute.

19. The invention provides a fabrication method as set out in 16 or 17 above, wherein the total flow rate of the etching gas passed in the etching chamber ranges from 400 to 800 $cm^3$/minute.

20. The invention provides a fabrication method as set out in 16 or 17 above, wherein the total flow rate of the etching gas passed in the etching chamber is at 700 $cm^3$/minute or over.

21. The invention provides a fabrication method of a semiconductor integrated circuit device, which comprises subjecting, to a semiconductor substrate, a plasma etching treatment using an etching gas containing a fluorocarbon gas, oxygen and a dilution gas to process a silicon oxide insulating film on the semiconductor substrate, wherein a total flow of the etching gas passed in the etching chamber ranges from 200 to 1000 $cm^3$/minute.

22. The invention provides a fabrication method of a semiconductor integrated circuit device, which comprises subjecting, to a semiconductor substrate, a plasma etching treatment using an etching gas containing a fluorocarbon gas, oxygen and a dilution gas to process a silicon oxide insulating film on the semiconductor substrate, wherein the total flow of the etching gas passed in the etching chamber ranges from 400 to 800 $cm^3$/minute.

23. The invention provides a fabrication method of a semiconductor integrated circuit device, which comprises subjecting, to a semiconductor substrate, a plasma etching treatment using an etching gas containing a fluorocarbon gas, oxygen and a dilution gas to process a silicon oxide insulating film on the semiconductor substrate, wherein a total flow of the etching gas passed in the etching chamber is at 700 $cm^3$/minute or over.

24. The invention provides a fabrication method of a semiconductor integrated circuit device, which comprises the steps of:
 (a) depositing a silicon nitride insulating film on a semiconductor substrate;
 (b) depositing a silicon oxide insulating film on the silicon nitride insulating film; and
 (c) subjecting the semiconductor substrate to a plasma etching treatment using an etching gas containing a fluorocarbon gas, oxygen and a dilution gas to process the silicon oxide insulating film, wherein a pressure within an etching chamber during the plasma etching treatment ranges 0.7 to 7 Pa.

25. The invention provides a fabrication method of a semiconductor integrated circuit device, which comprises the steps of:
 (a) depositing a silicon nitride insulating film on a semiconductor substrate;
 (b) depositing a silicon oxide insulating film on the silicon nitride insulating film; and
 (c) subjecting the semiconductor substrate to a plasma etching treatment using an etching gas containing a fluorocarbon gas, oxygen and a dilution gas to process the silicon oxide insulating film, wherein a pressure within an etching chamber during the plasma etching treatment ranges 1.3 to 4 Pa.

26. The invention provides a fabrication method as set out in 24 or 25 above, wherein a total flow rate of the etching gas passed in the etching chamber ranges from 200 to 1000 $cm^3$/minute.

27. The invention provides a fabrication method as set out in 24 or 25 above, wherein the total flow rate of the etching gas passed in the etching chamber ranges from 400 to 800 $cm^3$/minute.

28. The invention provides a fabrication method as set out in 24 or 25 above, wherein the total flow rate of the etching gas passed in the etching chamber is at 700 $cm^3$/minute or over.

29. The invention provides a fabrication method of a semiconductor integrated circuit device, which comprises the steps of:
 (a) depositing an electrode wiring on a semiconductor substrate;
 (b) depositing a silicon nitride insulating film so as to cover the electrode wiring on the semiconductor substrate therewith;
 (c) depositing a silicon oxide insulating film on the silicon nitride film insulating film; and
 (d) subjecting the semiconductor substrate to a plasma etching treatment using an etching gas containing a fluorocarbon gas, oxygen and a dilution gas, to form a hole in the silicon oxide insulating film self-alignedly with the electrode wiring, wherein a pressure within an etching chamber during the course of the plasma etching treatment is set at 0.7 to 7 Pa.

30. The invention provides a fabrication method of a semiconductor integrated circuit device, which comprises the steps of:
 (a) depositing an electrode wiring on a semiconductor substrate;
 (b) depositing a silicon nitride insulating film so as to cover the electrode wiring on the semiconductor substrate therewith;
 (c) depositing a silicon oxide insulating film on the silicon nitride film insulating film; and
 (d) subjecting the semiconductor substrate to a plasma etching treatment using an etching gas containing a fluorocarbon gas, oxygen and a dilution gas, to form a hole in the silicon oxide insulating film self-alignedly with the electrode wiring, wherein a pressure within an etching chamber during the course of the plasma etching treatment is set at 1.3 to 4 Pa.

31. The invention provides a method as set forth in 29 or 30 above, wherein a total flow rate of the etching gas passed into the etching chamber ranges from 200 to 1000 $cm^3$/minute.

32. The invention provides a method as set forth in 29 or 30 above, wherein a total flow rate of the etching gas passed into the etching chamber ranges from 400 to 800 $cm^3$/minute.

33. The invention provides a method as set forth in 29 or 30 above, wherein a total flow rate of the etching gas passed into the etching chamber is at 700 $cm^3$/minute or over.

34. The invention provides a method as set forth in 29 or 30 above, further comprising, after the plasma etching treatment, removing the silicon nitride insulating film exposed from the hole to expose the semiconductor substrate, and burying a conductive film within the hole exposed with the semiconductor substrate.

35. The invention provides a method as set forth in any one of 1 to 34 above, wherein a temperature of the semiconductor substrate during the course of the plasma etching treatment ranges from 50 to 180° C.

36. The invention provides a method as set forth in any one of 1 to 34, wherein a temperature of the semiconductor substrate during the course of the plasma etching treatment ranges from 60 to 140° C.

37. The invention provides a method as set forth in any one of 1 to 34, wherein a temperature of the semiconductor substrate during the course of the plasma etching treatment ranges from 100 to 130° C.

38. The invention provides a fabrication method of a semiconductor integrated circuit device, which comprises the steps of:
  (a) depositing a silicon oxide insulating film on a semiconductor substrate;
  (b) forming a hard mask on the silicon oxide insulating film; and
  (c) subjecting the semiconductor substrate to a plasma etching treatment through the hard mask as an etching mask using an etching gas containing a fluorocarbon gas, oxygen and a dilution gas to process the silicon oxide insulating film, wherein a residence time of the etching gas within an etching chamber is set at 50 to 700 ms.

39. The invention provides a fabrication method of a semiconductor integrated circuit device, which comprises the steps of:
  (a) depositing a silicon oxide insulating film on a semiconductor substrate;
  (b) forming a hard mask on the silicon oxide insulating film; and
  (c) subjecting the semiconductor substrate to a plasma etching treatment through the hard mask as an etching mask using an etching gas containing a fluorocarbon gas, oxygen and a dilution gas to process the silicon oxide insulating film, wherein a residence time of the etching gas within an etching chamber is set at 50 to 350 ms.

40. The invention provides a fabrication method of a semiconductor integrated circuit device, which comprises the steps of:
  (a) depositing a silicon nitride insulating film on a semiconductor substrate;
  (b) forming a hard mask on the silicon oxide insulating film; and
  (c) subjecting the semiconductor substrate to a plasma etching treatment through the hard mask as an etching mask using an etching gas containing a fluorocarbon gas, oxygen and a dilution gas to process the silicon oxide insulating film, wherein a residence time of the etching gas within an etching chamber is set at 100 to 200 ms.

41. The invention provides a method as set forth in any one of 38 to 40 above, wherein a pressure within the etching chamber during the course of the plasma etching treatment ranges from 0.7 to 7 Pa.

42. The invention provides a method as set forth in any one of 38 to 40 above, wherein a pressure within the etching chamber during the course of the plasma etching treatment ranges from 1.3 to 4 Pa.

43. The invention provides a method as set forth in any one of 38 to 40 above, wherein a total flow rate of the etching gas passed into the etching chamber ranges from 200 to 1000 cm$^3$/minute.

44. The invention provides a method as set forth in any one of 38 to 42 above, wherein a total flow rate of the etching gas passed into the etching chamber ranges from 400 to 800 cm$^3$/minute.

45. The invention provides a method as set forth in any one of 38 to 42 above, wherein a total flow rate of the etching gas passed into the etching chamber is at 700 cm$^3$/minute or over.

46. The invention provides a method as set forth in any one of 39 to 45 above, wherein a hole is formed in the silicon oxide insulating film by the plasma etching treatment to form an information storage capacitor element in the hole.

47. The invention provides a fabrication method of a semiconductor integrated circuit device, which comprises the steps of:
  (a) depositing a silicon oxide insulating film on a semiconductor substrate;
  (b) forming a hard mask on the silicon oxide insulating film; and
  (c) subjecting the semiconductor substrate to a plasma etching treatment through the hard mask serving as an etching mask using an etching gas containing a fluorocarbon gas, oxygen and a dilution gas, to process the silicon oxide insulating film, wherein a pressure within an etching chamber during the course of the plasma etching treatment is set at 0.7 to 7 Pa.

48. The invention provides a fabrication method of a semiconductor integrated circuit device, which comprises the steps of:
  (a) depositing a silicon oxide insulating film on a semiconductor substrate;
  (b) forming a hard mask on the silicon oxide insulating film; and
  (c) subjecting the semiconductor substrate to a plasma etching treatment through the hard mask serving as an etching mask using an etching gas containing a fluorocarbon gas, oxygen and a dilution gas, to process the silicon oxide insulating film, wherein a pressure within an etching chamber during the course of the plasma etching treatment is set at 1.3 to 4 Pa.

49. The invention provides a method as set forth in 47 or 48 above, wherein a total flow rate of the etching gas passed into the etching chamber ranges from 200 to 1000 cm$^3$/minute.

50. The invention provides a method as set forth in 47 or 48 above, wherein a total flow rate of the etching gas passed into the etching chamber ranges from 400 to 800 cm$^3$/minute.

51. The invention provides a method as set forth in 47 or 48 above, wherein a total flow rate of the etching gas passed into the etching chamber is at 700 cm$^3$/minute or over.

52. The invention provides a method as set forth in any one of 39 to 51 above, wherein the hard mask is made of polysilicon.

53. The invention provides a method as set forth in any one of 47 to 52 above, wherein a hole is formed in the silicon oxide film by the plasma etching treatment to form an information storage capacitor element in the hole.

54. The invention provides a method as set forth in any one of 1 to 53 above, wherein a flow rate of the dilution gas is larger than those rates of the fluorocarbon gas and oxygen, respectively.

55. The invention provides a method as set forth in any one of 1 to 53 above, wherein a plasma density during the course of the plasma etching treatment ranges from $1 \times 10^{10}$ to $1 \times 10^{13}/cm^3$.

56. The invention provides a method as set forth in any one of 1 to 53 above, wherein a plasma density during the course of the plasma etching treatment ranges from $1 \times 10^{10}$ to $1 \times 10^{12}/cm^3$.

57. The invention provides a method as set forth in any one of 1 to 53 above, wherein a plasma density during the course of the plasma etching treatment ranges from $5 \times 10^{10}$ to $5 \times 10^{11}/cm^3$.

58. The invention provides a method as set forth in any one of 1 to 57 above, wherein the fluorocarbon gas is made of $C_5F_8$ and the dilution gas is made of argon.

59. The invention provides a method as set forth in 58 above, wherein a flow rate of the argon gas ranges from 200 to 1000 $cm^3/minute$.

60. The invention provides a method as set forth in 58 above, wherein the flow rate of the argon gas ranged from 400 to 800 $cm^3/minute$.

61. The invention provides a method as set forth in any of 58 to 60 above, wherein a ratio in flow rate between the oxygen and the $C_5F_8$ (oxygen/$C_5F_8$) is at 0.5:1 to 2.0:1.

62. The invention provides a method as set forth in any of 58 to 60 above, wherein a ratio in flow rate between the oxygen and the $C_5F_8$ (oxygen/$C_5F_8$) is at 0.8:1 to 1.5:1.

63. The invention provides a method as set forth in any of 58 to 60 above, wherein a ratio in flow rate between the oxygen and the $C_5F_8$ (oxygen/$C_5F_8$) is at 1:1 to 1.2:1.

64. The invention provides a method as set forth in any of 58 to 60 above, wherein a partial pressure of the $C_5F_8$ ranges from 0.02 to 0.2 Pa.

65. The invention provides a method as set forth in any of 58 to 60 above, wherein a partial pressure of the $C_5F_8$ ranges from 0.04 to 0.1 Pa.

66. The invention provides a method as set forth in any of 58 to 60 above, wherein a partial pressure of the $C_5F_8$ ranges from 0.04 to 0.08 Pa.

BRIEF DESCRIPTION OF THE DRAWINGS

FIG. 13 is a table showing an example of SAC process conditions obtained in our experiment;

FIG. 14 is a table showing an example of HARC process conditions obtained in our experiment;

DETAILED DESCRIPTION OF THE INVENTION

Figure 1:
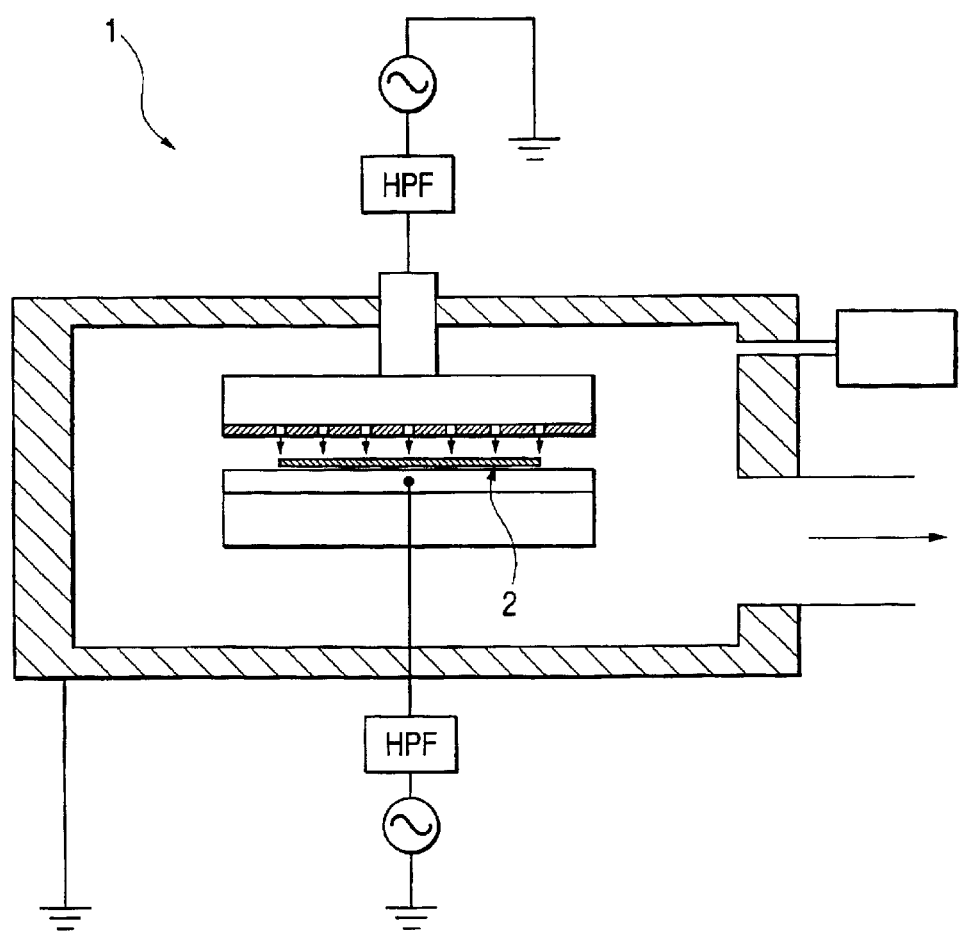
FIG. 1 is an illustrative view showing an etching device used in an experiment made by us.

The general meanings of the terms used herein are described below.

1. The term "device surface" means a main surface of a semiconductor wafer, i.e. a surface on which an integrated circuit pattern corresponding to a plurality of chip regions is formed according to lithography. The device surface is a main surface opposite to "a back surface".

2. The term "semiconductor integrated circuit wafer" or "semiconductor wafer" means a silicon single crystal substrate (usually substantially in a disk form), a sapphire substrate, a glass substrate, an insulating, semi-insulating or semiconductor substrate, and a composite substrate thereof. Moreover, when the term "semiconductor integrated circuit device" (or "electronic device" or "electronic circuit device") is used, those devices, which are formed not only on a single crystal silicon substrate, but also on such substrates as mentioned above, and other types of substrates including an SOI (silicon on insulator) substrate, a substrate for manufacturing a TDT (thin film transistor) liquid crystal, a substrate for manufacturing an STN (super twisted nematic) liquid crystal and the like, are included within the scope of the invention unless otherwise described.

3. The term "silicon nitride" means not only $Si_3N_4$, but also nitrides of silicon having a similar composition, which are insulating in nature.

4. The term "cap film" means an insulating film which is formed at portions other than electric connections of information of buried wirings and is high in insulating property and diffusion barrier property. This cap film is usually formed of a material other than a material at main portion of an interlayer insulating film, e.g. a silicon nitride film.

5. The term "residence time (ι)" means a time expressed by $ι=V/S=P·V/Q$. In the above formula, V represents a plasma capacity or chamber (etching chamber) capacity, S represents an effective exhaust velocity of a vacuum pump (which is a value determined while taking the conductance of a pipe between the chamber and the pump into consideration), P represents a processing pressure, and Q represents a flow rate of a gas. When V is taken as a plasma capacity or a chamber capacity, it can be defined as a residence time within a plasma or as a residence time within a chamber (within an etching chamber). The residence time within a plasma is a time during which the molecules of a flown gas are retained in a plasma in the course of etching treatment. The residence time is a time during which the molecules of a flown gas are retained in a chamber in the course of etching treatment.

In the above equation, the residence time is deduced by substitution of a processing pressure, a plasma capacity (or a chamber capacity) and a flow rate of a gas.

The processing pressure P used is a value, for example, of the Varathon vacuum indicator attached at a side wall within a chamber of an etching device. The flow rate of a gas P used is a value, for example, of a mass flow controller.

Figure 47:
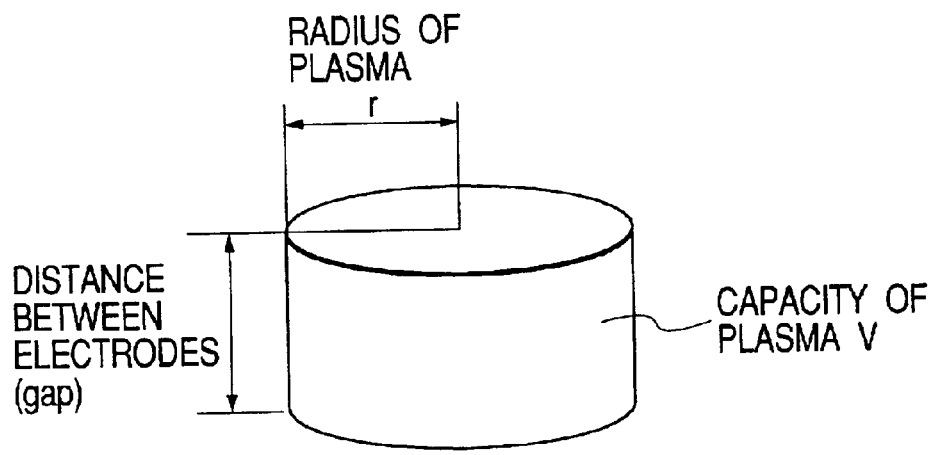
FIG. 47 is an illustrative view showing a residence time.

The plasma capacity is deduced on the assumption that a plasma is cylindrical in shape as shown in FIG. 47. In this case, the plasma capacity V can be expressed by V=π·r²·(electrode gap). The electrode gap in FIG. 47 is a gap between an upper electrode and a lower electrode of a parallel plate etching device.

The chamber capacity V is determined by measuring a ratio in increment of a pressure relative to time in case where a gas is flow into a chamber in a fully closed state of a valve. The unit of the gas flow rate of cm³/minute is a volume of a flowing gas per unit minute under standard conditions (0° C., 1 atm). Since one mole under standard conditions (0° C., 1 atm) has a volume of 22.414 liters (22,414 cm³), 1 (cm³/minute)=1/22414 (mols/minute)=4.46×10⁻⁵ (mols/minute).

Figure 48:
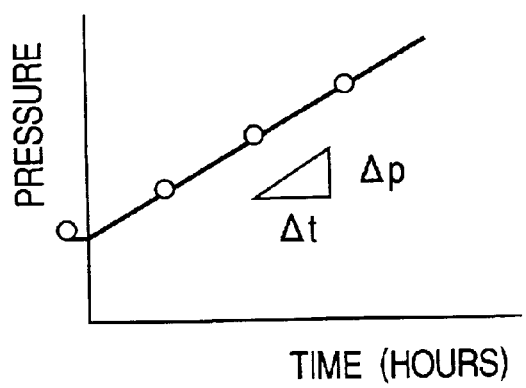
FIG. 48 is an illustrative view showing a residence time.

Using the above value, the moles of a gas flowing into the chamber of the etching device in Δt can be calculated. When the resultant pressure change Δp is used (see FIG. 48) along with the state equation of a gas of P·V=n·R·T, it is possible to obtain the chamber capacity V from Δp·V=(Q·Δt)·R·T (wherein T: chamber capacity, R: gas constant, T=temperature, and Q=flow rate of gas). With the etching device used in this embodiment, it was found that the chamber capacity V=74.98 liters.

6. The term "etching gas" means a gas including a reaction gas, a dilution gas and other type of gas. The reaction gas is one that contributes mainly to both etching and deposition reactions, and can be classified into a main reaction gas and an additive reaction gas. The main reaction gas includes a fluorocarbon gas, and the additive reaction gas includes a gas containing oxygen ($O_2$) The fluorocarbon gas can be classified into a saturation type and an unsaturation type.

7. The term "electrode wiring" generically means an electrode or a wiring, which is a constituent member forming a path of an electric signal.

The embodiments of the invention are described in more detail with reference to the accompanying drawings. It will be noted that throughout the figures illustrating the embodiments, like reference numerals indicate like members having a similar or same function and may not be repeatedly described after having once been illustrated. In the following embodiments, the same or similar portions may not be fundamentally, repeatedly described except the case of necessity.

The invention may be described by division into a plurality of sections or embodiments when required for convenience's sake. Unless otherwise indicated, these sections and embodiments are not mutually irrespective, and one may be in relation with an alteration, details, and supplemental description of part or whole of others.

In the following embodiments, where reference is made to the parameters of elements (including the number, numerical value, amount, range and the like), such parameters should not be construed as limiting to the specified ones unless otherwise indicated or except the case where it is principally apparent to limit to specified ones, and such parameters may be more than or less than specified values.

Moreover, in the following embodiments, the constituting elements including steps may not be always essential unless otherwise indicated or except that where it is principally apparent the such elements are essential.

Likewise, when reference is made to the shapes and positional relations of the constituting elements or members or parts, similar or analogous shapes or relations are substantially within the scope of the invention unless otherwise indicated or except the case where it is considered principally apparent that such is not the case. This is true of the numerical values and ranges.

In the following embodiments, MIS.FET (metal insulator semiconductor field effect transistor), which is typical of a field effect transistor, is referred to simply as MIS.

Prior to the description of the embodiments of the invention, it is described how the invention has come about.

In a super high aspect oxide film dry etching technique that is a key technology as to how to shrink a DRAM (dynamic random access memory) process, it has been found impossible to permit both an ease-in-etching property and selectivity to stand together according to a conventional process technique because of the tendency toward the high aspect ratio of a contact hole accompanied by the shrinkage or scale down of a design rule. In this way, the development of SAC and HARC processing techniques responsible for the tendency toward the high aspect ratio has become essential.

The experiment made by us is now described.

Initially, an etching device used in this experiment is described. An oxide film dry etching device used in this experiment is, for example, a two-frequency excitation RIE device 1 (UNITY-IIS-85DI, made by Tokyo Electron Co., Ltd.) of the type as shown in FIG. 1. The separation of a drive frequency and a bias frequency permits independent control of generation and dissociation of a plasma and an ion energy incident on a semiconductor wafer 2. The section of an etching reactor of this two-frequency excitation RIE device is shown in FIG. 1. With the above conventional two-frequency excitation RIE device (UNITY-II-85DI), the drive frequency was at 27 MHz and the bias frequency was at 800 kHz. In contrast, with the two-frequency RIE device 1 of FIG. 1, these frequencies were, respectively, optimized at 60 MHz and 2 MHz. Through the optimization, it becomes possible to stably generate a plasma at a lower pressure (~1 Pa) at a high density (~$10^{11}$ cm⁻³) responsible for a high aspect ratio oxide film etching process. Moreover, in the course of conducting the experiment, the device was converted so as to allow greater exhaustion (a turbo molecular pump exhaust velocity: changed from 1300 (liters/second) to 2200 (liters/second).

Next, samples used in this experiment are described. In the development of an oxide film dry etching technique at high aspect ratio, samples as shown in FIGS. 2 to 4 were used.

Figure 2:
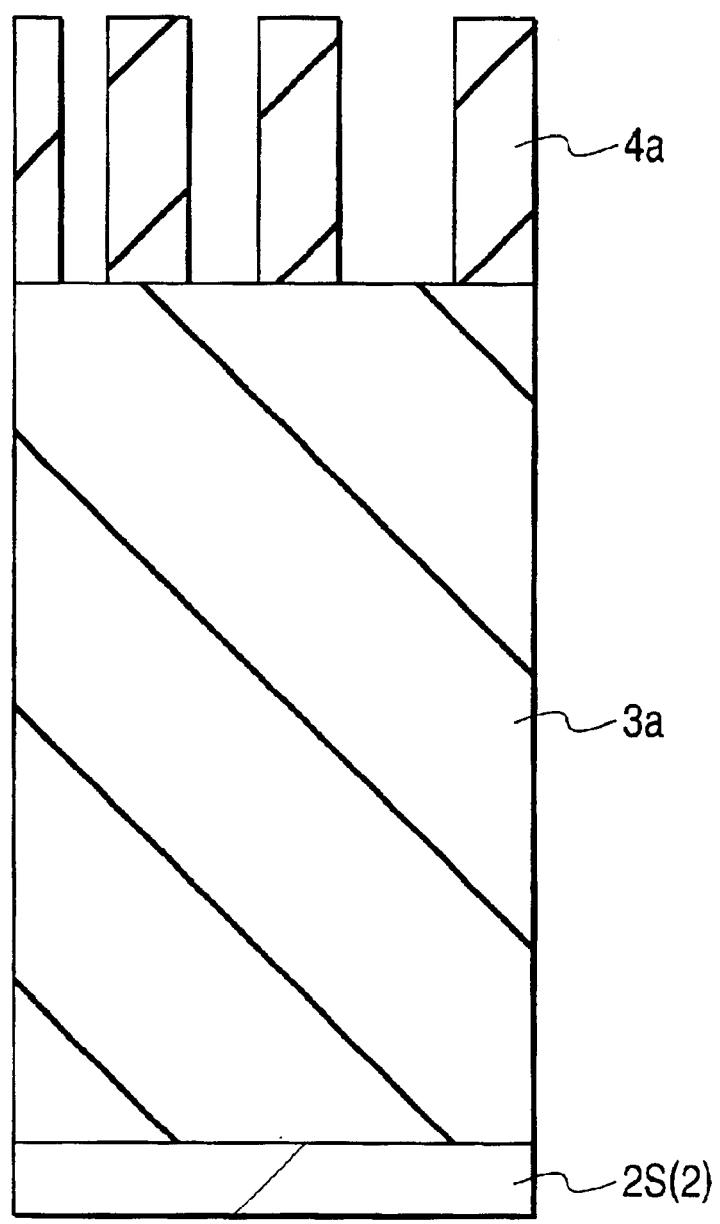
FIG. 2 is a sectional view showing a dummy (sample) for measuring micro loading used in an our experiment.

FIG. 2 is a sectional view showing a micro loading measuring dummy. More particularly, an approximately 2.0 μm thick oxide film 3a is formed on a semiconductor substrate (i.e. a semiconductor wafer made of single crystal silicon or the like), followed by further formation of a photoresist 4a having a thickness of approximately 400 to 800 nm. A hole, which is made in the oxide film 3a, has a diameter of approximately 0.16 to 0.6 μm.

Figure 3:
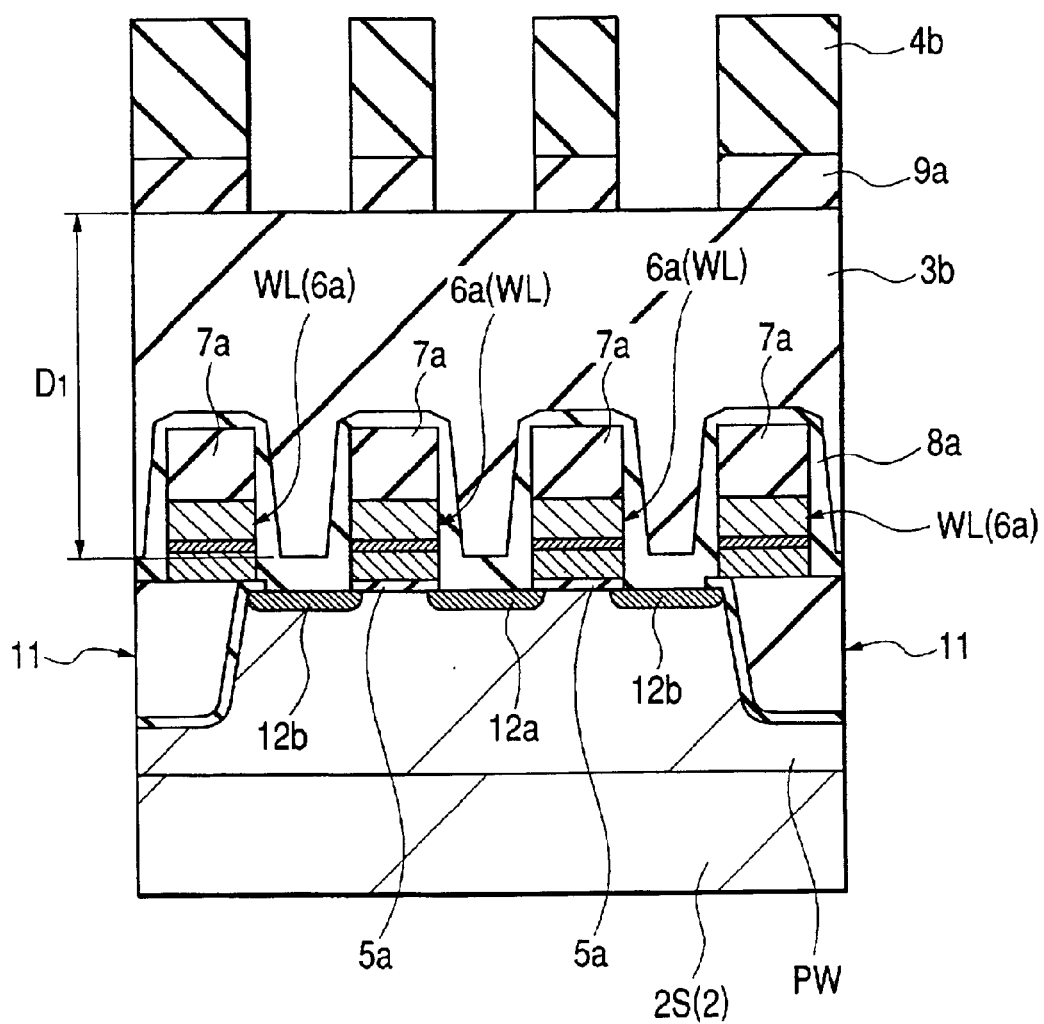
FIG. 3 is a sectional view showing a dummy (sample) for an SAC process used in our experiment.

FIG. 3 is a sectional view showing a dummy of the SAC process in an SAC with a diameter of 0.16 μm and an aspect ratio of 10 or in an HARC with a diameter of 0.16 μm and an aspect ratio of 10. A gate insulating film 5a is made of, for example, silicon oxide with its thickness being at approximately 6 nm when calculated as silicon dioxide. A word line WL (i.e. a gate electrode 6a) is constituted, for example, by forming tungsten on a low resistance polysilicon film via tungsten nitride, over which a cap film 7a is formed. The surface of a semiconductor substrate 2S, exposed from the cap film 7a and the word line WL, is covered with a silicon nitride film 8a in a thickness as small as approximately 40 to 60 nm. This silicon nitride film 8a is deposited thereon with an oxide film 3b. A dimension D1 ranging from the bottom of an oxide film 3b1 (i.e. a face of the oxide film 3b1 in contact with the silicon nitride film 8a)

between adjacent word lines WL (gate electrodes 6a) to the upper surface of the an oxide film 3b2 is, for example, at approximately 600 nm. A photoresist film 4b having a thickness of approximately 260 nm is formed on the oxide film 3b2 via a antireflective film 9a having a thickness of approximately 50 to 200 nm. The photoresist 4b serves as a mask for forming a hole according to the SAC process. The antireflective film 9a has been already etched through the mask of the photoresist film.

Figure 4A:
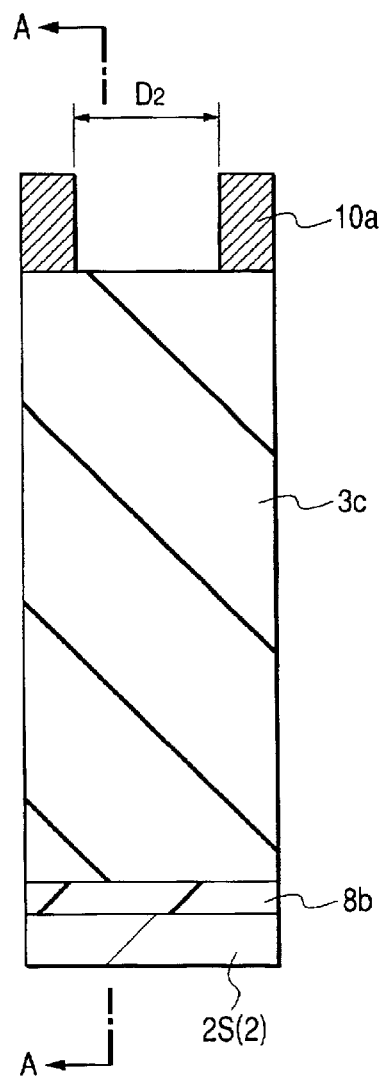
FIGS. 4(a) and 4(b) are, respectively, a section view of a dummy (sample) for an HARC process used in our test and a sectional view of a plane vertical to that of FIG. 4(a)
Figure 4B:
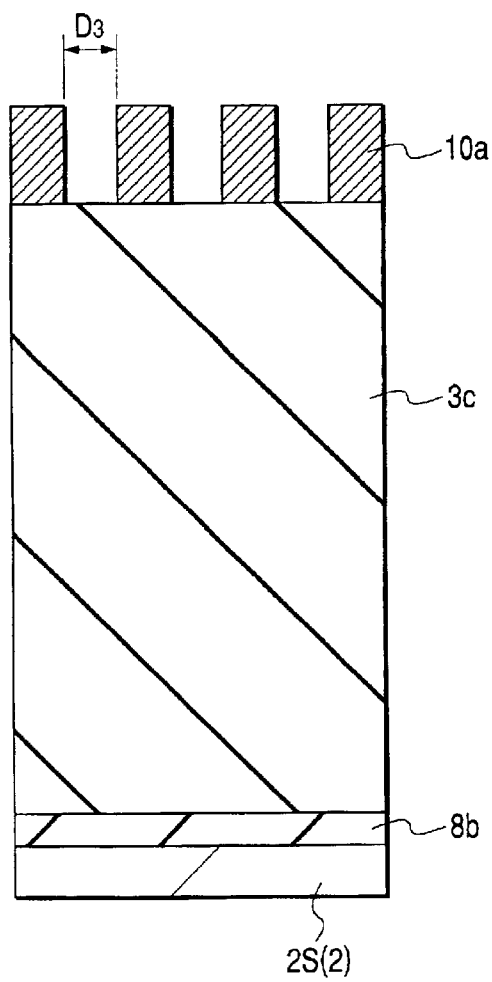

FIGS. 4(a) and 4(b) are, respectively, a sectional view of a dummy of the HARC process at an SAC with a diameter of 0.16 μm and an aspect ratio of 10 or at an HARC with a diameter of 0.16 μm and an aspect ratio of 10. An oxide film 3c having a thickness of approximately 2.0 μm is deposited on the semiconductor substrate 2S via a silicon nitride film 8b having a thickness of approximately 50 to 200 μm. A hardmask 10a, which is constituted of a doped polysilicon film having a thickness of approximately 200 to 300 nm, is formed on the oxide film 3c. In FIG. 4(a), the dimension of the opening of the hard mask 10a is at approximately 450 nm. FIG. 4(b) shows a face vertical to the section of FIG. 4(a) and is a sectional view, taken along line A—A of FIG. 4(a).

Next, the evaluation method of the SAC and HARC processes using the dummy is described. In the following experiment, the following one to four characteristics was evaluated, for example.

At first, as a measure for judging an ease-in-etching property in the etching of an oxide film, a micro loading effect was measured. In this experiment, etching was conducted to measure an etching depth within holes of 0.16 μm and 0.5 μm, and the micro loading effect was calculated according to the following equation (1). A value nearer to 100% indicates a more reduced lowering of an etching rate in a fine hole.

$$\text{Micro loading effect [\%]} = (\text{etching depth at } 0.16\ \mu m\phi)/(\text{etching depth at } 0.5\ \mu m\phi) \times 100 \quad (1)$$

Figure 5:
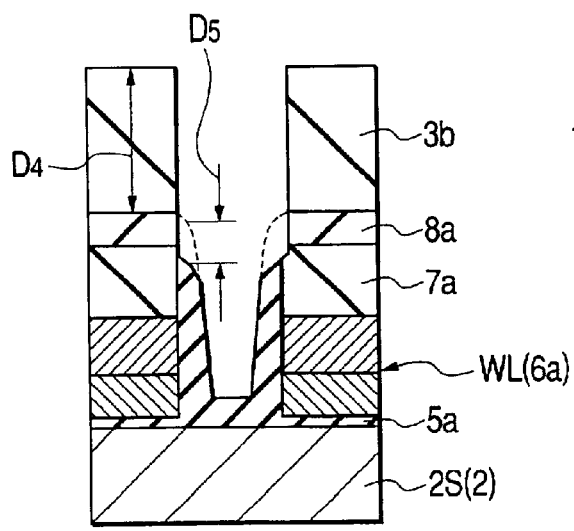
FIG. 5 is a sectional view showing an essential part of a sample used to illustrate the manner of calculating a selection ratio between a silicon oxide film and a silicon nitride film on the shoulder of a gate electrode of a sample used in our experiment.

Secondly, an etching selection ratio of a silicon nitride film was measured. More particularly, etching was conducted under oxide film etching conditions, dimensions D4, D5 at the portions indicated in FIG. 5 were measured using section SEM (scanning electron microscope), from which a selection ratio between the oxide film 3b and the silicon nitride film 8a at the shoulder of the gate electrode 6a (word line WL) was calculated. The dimension D4 corresponds to a thickness of the oxide film 3b on the gate electrode 6a, and the dimension D5 indicates a degree of etching off of the silicon nitride film 8a at the upper shoulder of the gate electrode 6a. The etching rate of the oxide film 3b used for the etching treatment was calculated by an end point detector assembled in the two-frequency excitation RIE device (UNITY-IIS-85DI) 1. More particularly, SiF, which is a reaction product of a feed gas and an oxide film, was monitored in an emission species within a plasma, and a falling-in time of an emission intensity curve at the time when the silicon nitride film 8a is exposed to at the bottom of the hole is measured.

$$\text{Selection ratio of silicon nitride film} = (\text{etching rate of oxide film}) \times (\text{etching time}) - (\text{dimension D4})/\text{dimension D5} \quad (2)$$

Figure 6:
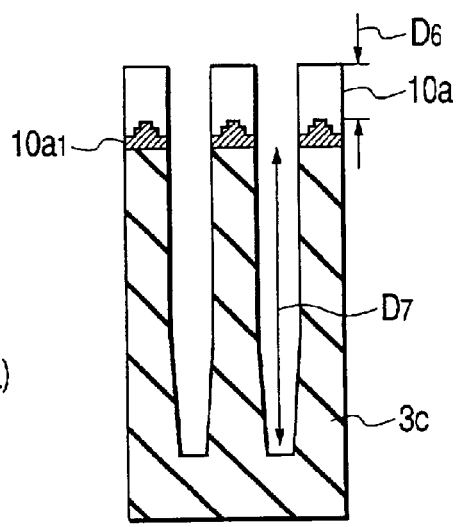
FIG. 6 is a sectional view of an essential part of a sample used to illustrate the manner of calculating a selection ratio between a silicon oxide film and a polysilicon film of the sample used in our experiment.

Thirdly, the selection ratio of a hard mask in the HARC process was measured. More particularly, as shown in FIG. 6, dimension D6, which corresponds to a degree of etching off of the doped polysilicon serving as a mask when the oxide film 3c is etched, and dimension D7, which indicates an etching depth of the oxide film 3c, were measured, from which a selection ratio relative to the doped polysilicon was calculated. It will be noted that a hard mask 10a1 shows a state of the hard mask 10a in FIGS. 4(a) and 4(b) after etching treatment of the oxide film.

Fourthly, the temperature at the upper surface (corresponding to a device surface) of a semiconductor wafer 2 upon etching was measured. Three temperature plates (made by Wahl) were attached to at a center, an outer periphery and an intermediate therebetween on the upper surface of the semiconductor wafer 2, over which a Kapton tape is covered, followed by exposing to a plasma under etching conditions of the respective oxide films for 2 minutes to determine the temperature as an average value of the temperatures measured at the respective portions.

The results of the experiments and discussion are described below.

As stated hereinabove, in the high aspect oxide film etching process of and subsequent to a 0.15 μmϕ process, the SAC and HARC processes which are applied to a 0.18 μmϕ process cannot satisfy requirements for both an ease-in-etching property and a high selection ratio. Accordingly, development of SAC and HARC processes responsible for the tendency toward a higher aspect ratio is now necessary. In the SAC process, it is required to permit an ease-in-etching property and a selection ratio to a silicon nitride film provided at the bottom of a hole to stand together. In the HARC process, it is required that both a ease-in-etching property and a selection ratio to a doped polysilicon film be ensured. The SAC process and the HARC process differ from each other in that the sites required for the selection ratio are the bottom of a hole and the surface of a semiconductor wafer, respectively, so that the same process cannot be allied thereto but the respective processes should be optimized. In this experiment, with the SAC process, a study was made on how to improve the ease-in-etching property, and additionally, a process of realizing a high silicon nitride selection ratio was developed. Based on the process of improving the ease-in-etching property, application to the HARC process was investigated to develop a process ensuring a high selection ratio to the doped polysilicon film.

The results of fundamental discussion on the SAC process are initially described.

With a fluorocarbon gas such as $C_5F_8$ as used in this experiment, $CF_x$ radicals (mainly comprised of $CF_2$ radicals) formed through dissociation in a plasma are deposited on the oxide film (silicon oxide film) at the bottom of the hole as a polymer layer. The incident ions are transmitted through the polymer layer to supply an energy at the interface between the oxide film and the polymer layer to cause a chemical reaction, thereby causing the oxide film to be etched. The polymer layer deposited on the oxide film is removed as CO or $COF_x$ through reaction of O (oxygen) existing in the oxide film. In contrast, the polymer layer on the silicon nitride film has no oxygen supplied from the underlying film (silicon nitride film), so that the polymer layer becomes thicker than that on the oxide film, and thus, etching of the silicon nitride film is unlikely to proceed. When a $CF_z$ radical flux increases in amount, the reaction is promoted on the oxide film to increase the etching rate. On the other hand, the etching rate of the silicon nitride film does not change appreciably. However, when the $CF_x$ radical flux reaching the hole bottom is in excess, the polymer layer becomes so thick that the ions cannot be transmitted toward the oxide film, causing the etching to proceed slowly. Accordingly, in order to improve the ease-in-etching property and realize a high silicon nitride selection ratio, the formation of the $CF_x$ radicals, incident ion flux and ion energy that determine the thicknesses of the polymer layer on the oxide film and the silicon nitride film should be appropriately controlled.

In this experiment, a micro loading effect, an angle of taper and a silicon nitride selection ration were, respectively, measured using a pressure and a gas flow rate as parameters, how to realize both the ease-in-etching property and the high selection ratio has been studied so as to make the mechanism clear.

Figure 7:
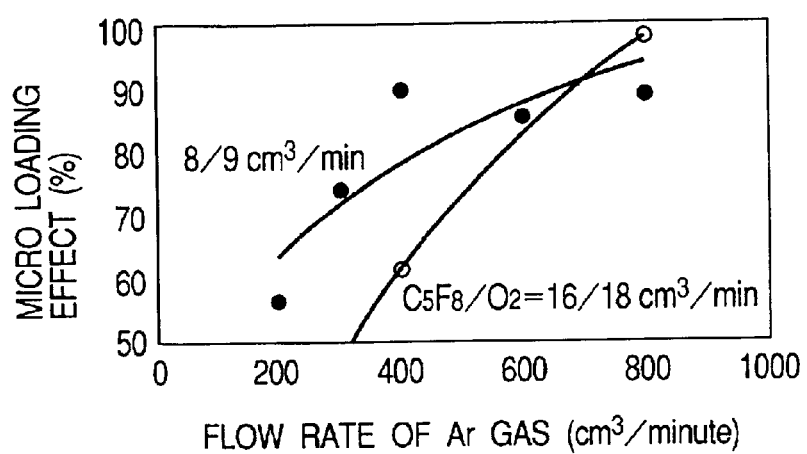
FIG. 7 is a graph showing the dependence of the micro loading effect on the flow rate of argon gas in our experiment.

The micro loading effect was measured at a pressure of 2.66 Pa wherein while keeping a ratio of $C_5F_8/O_2$ at a given level (of 8/9), the amount was increased from $C_5F_8/O_2=8/9$ to $16/18$ cm$^3$/minute and the flow rate of an argon gas was in the range of 400 to 800 cm$^3$/minute. The results are shown in FIG. 7. When the argon gas flow rate was at 400 cm$^3$/minute, the $CF_x$ radical flux reaching the hole bottom became excessive by the increase in the flow rate of $C_5F_8/O_2$ gas and an additional polymer layer is formed on the oxide film, resulting in a great micro loading effect. The flow rate of the argon gas was increased to 600 and then to 800 cm$^3$/minute, the formation of a surplus polymer layer is suppressed owing to the reduction in residence time. When the pressure was set at 2.66 Pa and the flow rates of $C_5F_8/O_2/Ar$ were, respectively, at 16/18/800 cm$^3$/minute, the micro loading effect was improved to an extent of 98%. From this, it will be seen that the micro loading effect depends greatly on the residence time and when the feed of the $CF_x$ radicals is optimized within a region where the residence time is short, the effect can be improved.

Next, the results of investigation on an improvement in angle of tape are described.

Figure 8A:
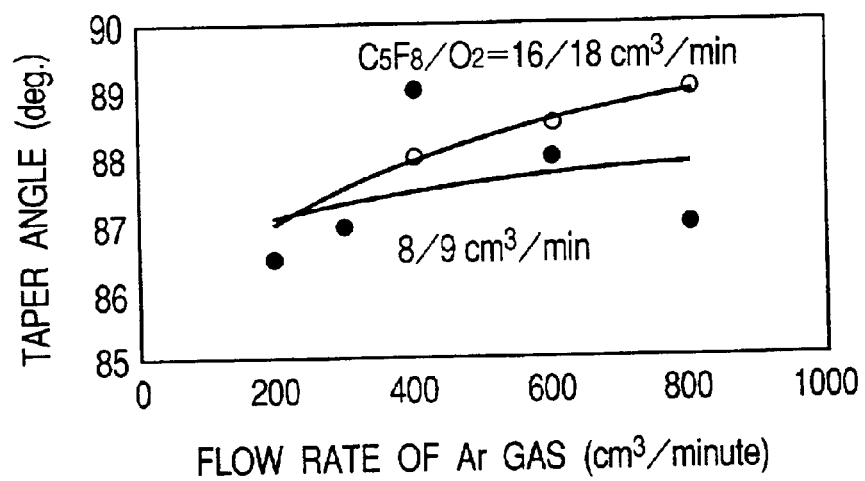
FIG. 8(a) is a graph showing the dependence of the angle of taper on the flow rate of argon gas obtained in our experiment and FIG. 8(b) is a similar graph showing the dependence of the selection ratio of a silicon nitride film on the flow rate of argon gas.
Figure 8B:
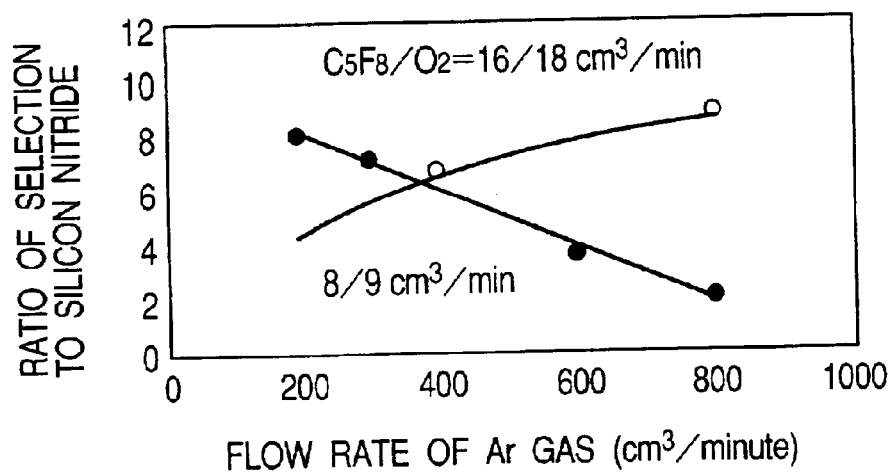

Like the measurement of the micro loading effect, an angle of taper and a silicon nitride selection ration at the shoulder on the gate electrode, which are obtained by subjecting a dummy of an SAC process to oxide film etching at SAC with a diameter of 0.16 μm and an aspect ratio of 10 or at HARC with a diameter of 0.16 μm and an aspect ratio of 10 under conditions of a pressure of 2.66 Pa and a argon gas flow rate used as a parameter, are, respectively, shown in FIGS. 8(a) and 8(b). The flow rates of $C_5F_8/O_2$ were, respectively, set at 8/9, 16/18 cm$^3$/minute, and after a lapse of an etching time, 10% overetching was performed.

When the gas flow rates of $C_5F_8/O_2$ were set at $16/18$ cm$^3$/minute and the flow rate of an argon gas is increased (see FIG. 8), there are obtained the results that both a high silicon nitride selection ratio and verticality in taper angle are ensured. This is a tendency reverse to those results that with $C_5H_6/O_2=8/9$ cm$^3$/minute, a silicon nitride selection ratio decreases with an increasing flow rate of an argon gas. From these results, it has been found that the angle of taper becomes more vertical when the residence time is shortened by lowering a pressure and increasing the flow rate of an argon gas. It has also been found that the increase in flow rate of the $C_5F_8$ gas can satisfy the requirements for an improvement of the micro loading effect (98%), an angle of taper close to verticality (89 degrees) and a high silicon nitride selection ratio (8.8).

The analyses of an etching mechanism under lower pressure and large flow rate conditions are now described.

From the foregoing, it will be seen that when the flow rates of $C_5F_8$ and $O_2$ gases are increased under low pressure and large flow rate conditions in a state where the residence time is shortened, all of the ease-in-etching property, verticality in shape and high silicon nitride selection ratio can be satisfied at the same time. The etching mechanism for this is analyzed.

Figure 9A:
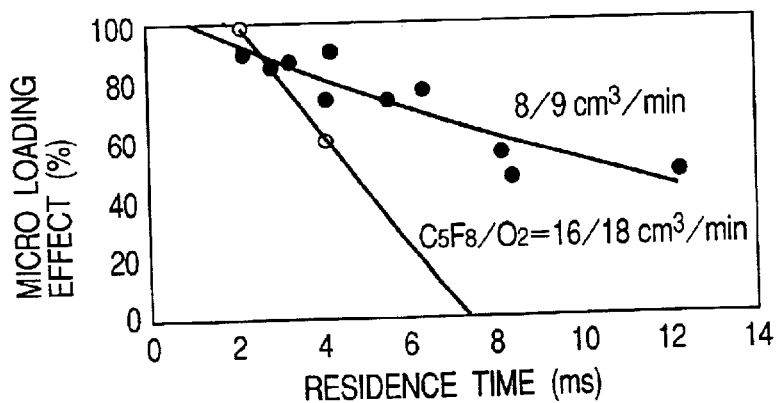
FIG. 9(a) is a graph showing the dependence of the micro loading effect on the residence time, 9(b) is a graph showing the dependence of the angle of taper on the residence time, and 9(c) is a graph showing the dependence of the selection ratio of a silicon nitride film, all obtained in our experiment.
Figure 9B:
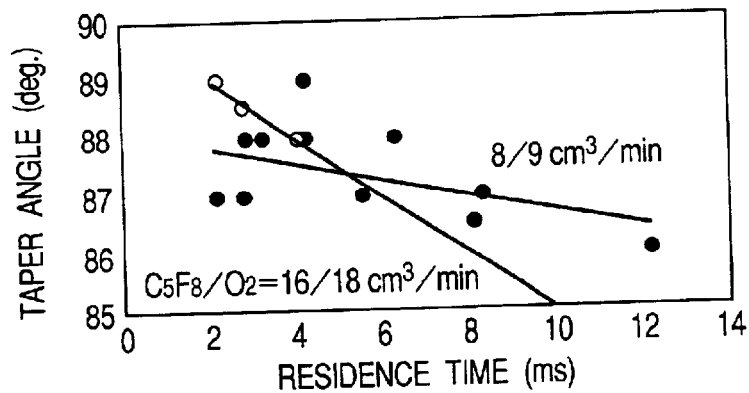
Figure 9C:
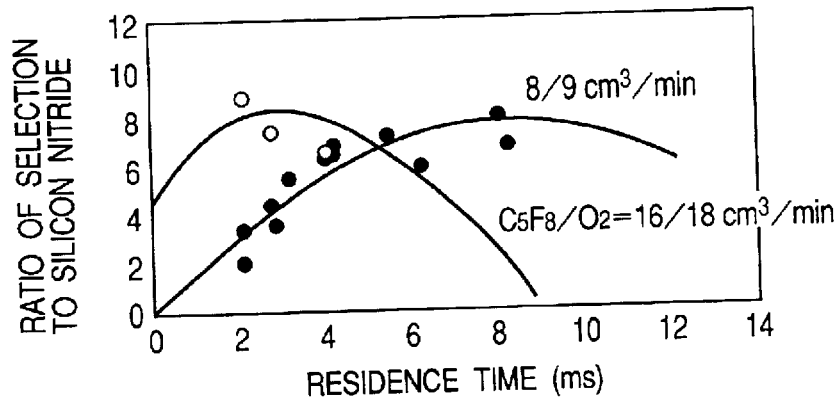

FIGS. 9(a), 9(b) and 9(c), respectively, show the dependence, on the residence time, of the micro loading effect, the angle of taper and the silicon nitride selection ratio, all measured in the experiments described hereinbefore. Irrespective of the flow rates of $C_5F_8$ and $O_2$ gases, the micro loading effect is small within a range of a short residence time (see FIG. 9(a)) and the angle of taper comes close to verticality (see FIG. 9(b)). A prolonged residence time promotes the dissociation of $C_5H_8$, thereby increasing the density of C radicals and $CF_x$ radicals. Eventually, an excess polymer layer is formed on the oxide film at the bottom of the hole, and with a hole of a high aspect ratio where the number of ions capable of reaching the bottom of the hole is small, the etching rate is reduced to increase the micro loading effect. The C radicals have the high probability of adsorption and are likely to be attached to side walls at the upper portion of the hole, for which it is considered that the angle of taper is worsened. With respect to the silicon nitride selection ratio, when $C_5F_8/O_2=8/9$ cm$^3$/minute, the ratio increases with an increasing residence time in the region of measurement. At $16/18$ cm$^3$/minute, the selection ratio lowers with an increasing residence time (see FIG. 9(c)).

Next, how the difference appears was checked. In FIGS. 10(a) to 10(f), there are, respectively, shown the dependence, on the residence time, of the oxide etching rate (FIGS. 10(a) and 10(d)), the silicon nitride etching rate at the shoulder on a gate electrode (FIGS. 10(b) and 10(e)), and the silicon nitride selection rate (10(c) and 10(f)) at $C_5H_8/O_2=8/9$ cm$^3$/minute (FIGS. (a) to 10(c)) and at $C_5H_8/O_2=16/18$ cm$^3$/minute (FIGS. (d) to 10(f)).

Figure 11A:
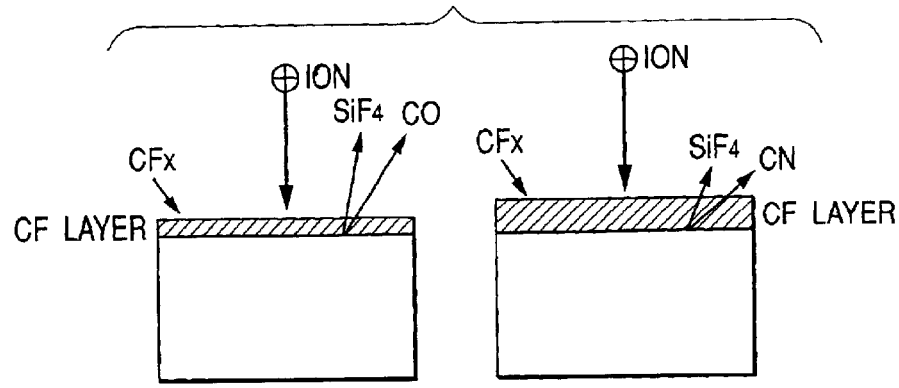
FIGS. 11(a) to 11(c) are, respectively, illustrative views showing etching models of a silicon oxide film and a silicon nitride film made by us.
Figure 11B:
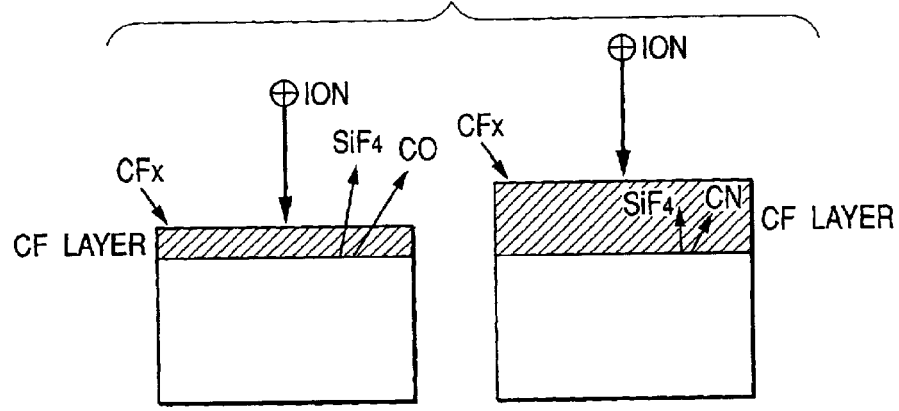
Figure 11C:
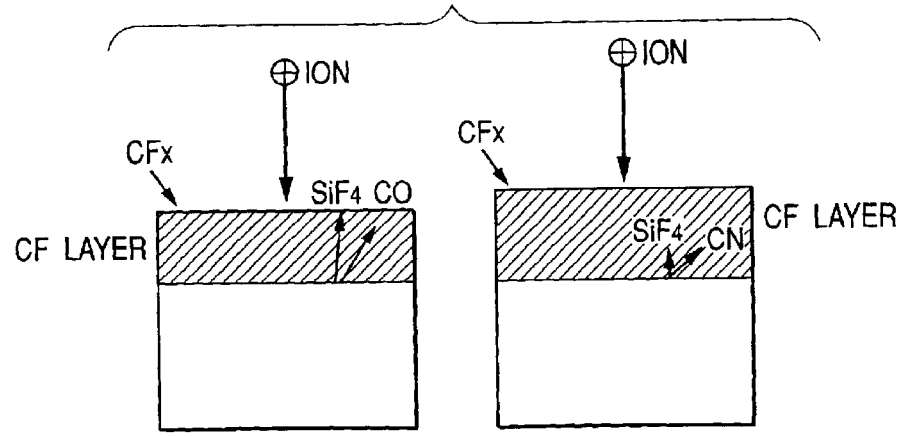

In FIGS. 11(a) to 11(c), the etching models of an oxide film and a silicon nitride film being etched are shown, respectively. FIG. 11(a) shows a state of shortage in radicals feed, FIG. 11(b) shows a state where radicals are fed properly, and FIG. 11(c) shows a state where radicals are fed in excess.

Figure 10A:
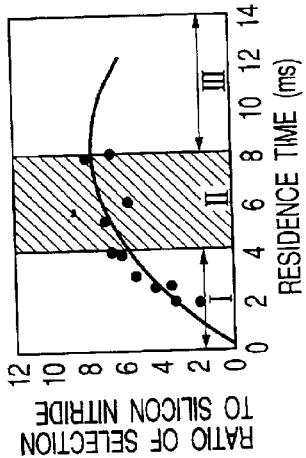
FIGS. 10(a) and 10(d) are, respectively, a graph showing the dependence of the etching rate of a silicon oxide film.
Figure 10B:
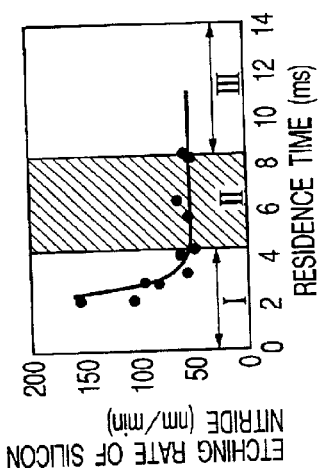
FIGS. 10(b) and 10(e) are, respectively, a graph showing the dependence of the etching rate of a silicon nitride film at a shoulder portion on the residence time.
Figure 10C:
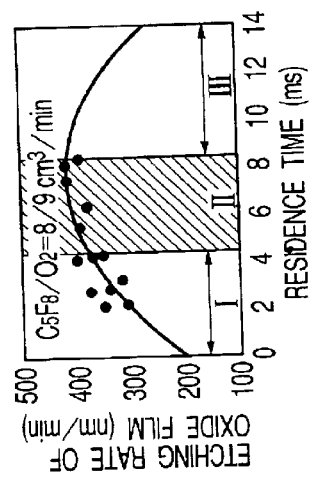
FIGS. 10(c) and 10(f) are, respectively, a graph showing the dependence of the selection ratio to a silicon nitride film on the residence time, all obtained by our experiments.
Figure 10D:
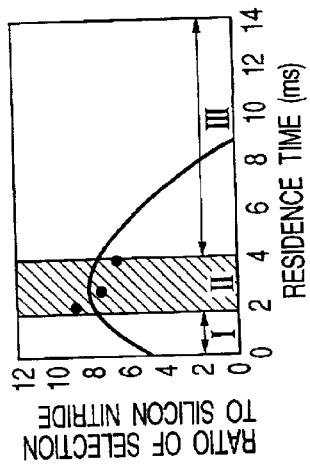
Figure 10E:
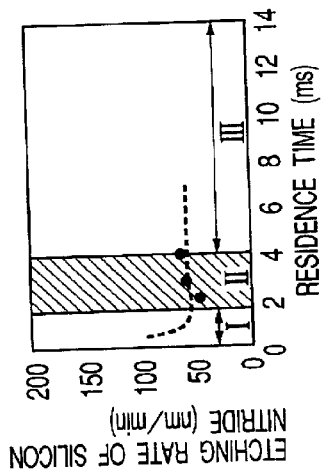
Figure 10F:
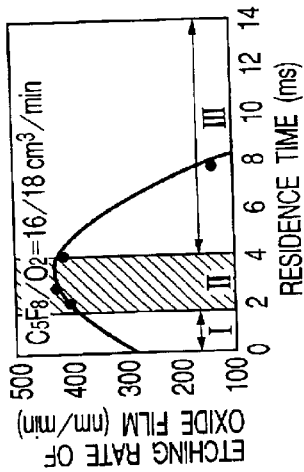

At $C_5H_8/O_2=8/9$ cm$^3$/minute, the silicon nitride selection ratio is maximized when the residence time is in the range of ~8 ms, and at $C_5H_8/O_2=16/18$ cm$^3$/minute, the selection ratio is maximized when the residence time is in the range of ~3 ms (zone II in FIGS. 10(c) and 10(f)). With $C_5H_8/O_2=8/9$ cm$^3$/minute, in the zone I of FIGS. 10(a) to 10(c), the residence time is so short that the number of $CF_x$ radicals reaching the bottom of the hole is small and the ratio of the argon gas is high, under which it is considered that the ion density generated by dissociation of the argon gas is high. In this case, the polymer layer on the oxide film is thin and the etching of the oxide film is subject to rate-determination of the feed of the $CF_x$ radicals serving as an etchant. The polymer layer on the silicon nitride film is thin sufficient to permit satisfactory transmission of the ions, and thus, it is considered that the silicon nitride film is liable to undergo etching (FIG. 11(a)).

As the residence time increases from the above state (zone II in FIGS. 10(a) to 10(f)), the $CF_x$ radical flux increases in amount, thereby promoting the formation of the polymer layer. Because carbon (C) and $CF_x$ in the polymer layer are removed by oxidation with oxygen (O) in the oxide film, the polymer is not thickened. Immediately after the transmission of the ions through the polymer layer, the thickness is considered to be such that the ions are enabled to directly reach the interface with the oxide film. In contrast, it is considered that because no oxygen (O) is supplied from the silicon nitride layer, the removal of the polymer layer on the silicon nitride film is not appreciable, so that the polymer layer is formed so thick as not permit the transmission of the ions. This is why although the residence time increased to increase the feed of the $CF_x$ radicals, little change occurs in the etching rate of the silicon nitride film (FIG. 11(b)). As a result, it is considered that the silicon nitride selection ratio is improved. Moreover, with the region (zone III in FIGS. 10(a) to 10(f)) where the residence time is long, the feed of the $CF_x$ is in excess, the polymer layer is formed on the oxide film in a thickness greater than a thickness permitting the ions to be transmitted, so that the etching rate of the oxide film lowers, with the silicon nitride selection ratio being lowered (FIG. 11(c)). With $C_5H_8/O_2=16/18$ cm³/minute shown in FIGS. 10(d) to 10(f), the peak of the silicon nitride selection ratio is shifted toward a zone where the residence time is short. Unlike the case of $C_5H_8/O_2=8/6$ cm³/minute, the etching rate of the oxide film becomes rapid and the etching rate of silicon nitride becomes low at the residence time being at 3 ms. This is considered for the reason that when the flow rate of $C_5H_8$ increases, the $CF_x$ radical density generated by dissociation of $C_5H_8$ increases, under which the $CF_x$ radical flux fed to the bottom of the hole within a range of a short residence time becomes equal to the $CF_x$ radical flux in the zone II in the case of $C_5H_8/O_2=8/6$ cm³/minute. In this way, it is that because $C_5F_8$ is suppressed from being dissociated in excess, the micro loading effect is not appreciable and a high silicon nitride selection ratio can be realized in the zone where the angle of taper is in a vertical fashion and the residence time is short.

From the foregoing results, for the etching of the oxide film having a high aspect ratio in a 0.15 µm or below process, conditions of a low pressure and a great flow amount of a gas are essential. In the light of the development of the 0.15 µm process, the exhaust velocity of the turbo molecular pump of UNITY-IIS85-DI is changed from 1300 (liters/second) to 2200 (liters/second) in order to make satisfactory exhaustion possible under conditions of a pressure of 2.66 Pa and a gas flow rate of 900 cm³/minue and ensure a stable etching process.

Next, the dependence of the temperature at the upper surface of a semiconductor wafer in the course of etching treatment is described.

Figure 12:
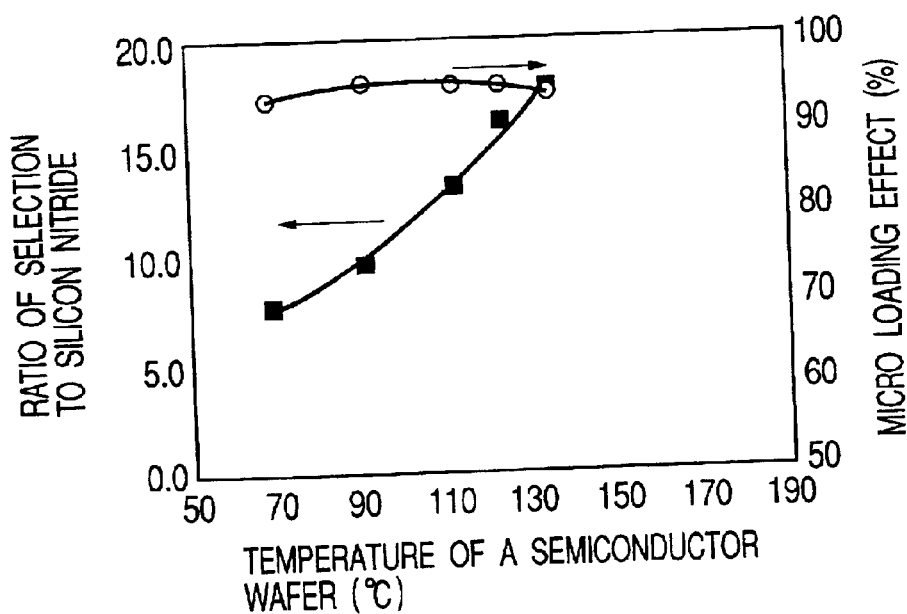
FIG. 12 is a graph showing the selection ratio to a silicon nitride film and the dependence of the micro loading effect on the semiconductor wafer temperature obtained in our experiment.

For improving a silicon nitride selection ratio, mention is made of a method wherein a polymer layer serving as a protective film is deposited thickly on a silicon nitride film. The silicon nitride selection ratio was checked when the temperature of a semiconductor wafer increases. As a result, it has been found that the increase in temperature of the semiconductor wafer leads to an increase of the silicon nitride selection ratio, and it can be realized to double the selection ratio of from 7.7 under standard conditions (i.e. a semiconductor wafer temperature of 68° C.) to 16.1 at a semiconductor wafer temperature of 123° C. (FIG. 12). It will be noted that the selection ratio was at 9.5 at a semiconductor wafer temperature of 90° C. and at 13.2 at a semiconductor wafer temperature of 112° C.

How this occurs is considered as follows: the probability of adsorption of $CF_x$ radicals decreases with an increasing semiconductor wafer, making it difficult to permit deposition on side walls at the upper portion of a hole; and the radicals are transported to the bottom of the hole, thereby increasing a deposition on the silicon nitride film. It is apprehended here that when the semiconductor wafer temperature increases, the amount of the radicals transported toward the bottom of the hole increases, thereby worsening the ease-in-etching property of the oxide film.

Hence, the dependence of the micro loading effect on the temperature of a semiconductor wafer was confirmed (FIG. 12). The micro loading effect does not increase with an increasing temperature of a semiconductor wafer, thus presenting little problem in practice. It is considered that the temperature of a semiconductor wafer of 123° C. has not problem from the standpoint of melting of a photoresist. Gathering the foregoing, the increase in temperature of the semiconductor wafer in the course of etching treatment is very effective in improving the silicon nitride selection ratio. In the SAC process, the temperature of a semiconductor wafer of 123° C. was applied to.

The now developed conditions permit the SAC process to be realized, for example, at a diameter of 0.16 µm and an aspect ratio of 10. In order to prevent non-opening, which is a vital failure in contact hole etching, the ease-in-etching property was confirmed. The sample used was one wherein an oxide film deposited on the gate electrode of the dummy in the SAC process was changed in thickness so that an aspect ratio was at 13. As a result, processing was possible without no problem on the ease-in-etching property and the angle of taper.

In view of the studies made hereinbefore, an example of the conditions of the SAC process, for example, for a diameter of 0.16 µm and an aspect ratio of 10 is shown in FIG. 13. In this process, after etching of the oxide film, the after-treatment for removing the polymer layer from the silicon nitride film and etching of the silicon nitride are effected.

The problem involved in the SAC process includes short-circuiting between the contact hole formed by the SAC process and the gate electrode (word line). Comparison was made between an SAC process for a diameter of 0.16 µm and an aspect ratio of 10 and an SAC process for a diameter of 0.18 µm and an aspect ratio of 7 with respect to the short-circuiting margin of the contact hole and the gate electrode. Under the SAC conditions of a diameter of 0.18 µm and an aspect ratio of 7, the short-circuiting margin is as small as 27 nm. In contrast, with the SAC conditions of a diameter of 0.16 µm and an aspect ratio of 10 being applied, the degree of etching off of a silicon nitride film in the etching of the oxide film is reduced, so that an increase of the short-circuiting margin of ~10 nm was realized relative to the SAC process conditions of a diameter of 0.18 µm and an aspect ratio of 7. From these results, the SAC process under such conditions as mentioned above ensures a satisfactory short-circuiting margin and is thus at a level of mass production.

In the high aspect SAC process, a difficulty is involved in ensuring a high silicon nitride selection ratio under conditions of a low pressure and a great flow rate. This difficulty has been overcome from the aspect of chemical reaction wherein $CH_2F_2$ is added to a fluorocarbon gas whose C/F ratio is low and which is made mainly of $C_4H_8$. In this experiment, $C_5H_8$, which was applied to the 0.18 µm process, was used as it is and thus, the reaction system was not changed, under which there was established a process capable of achieving a high silicon nitride selection ratio under conditions of a low pressure and a great flow rate. This technique is considered to be effective in an oxide film etching process that tends toward a higher aspect ratio as a design rule will be more scaled down in future, and provide a highly reliable semiconductor integrated circuit device of a high performance.

Subsequent to the results of the studies on such SAC process as set out hereinabove, the results of studies on the HARC Process are described.

The HARC process (for a hole in which a lower electrode of a capacitor element for information storage is formed) requires processing at an aspect ratio of ~13 (e.g. 2.0 µm in depth/0.16 µm in diameter), simultaneously with an appropriate selection ratio to a hard mask (i.e. doped polysilicon)

serving as an etching mask in a pitch of as small as 0.16 μm. To this end, in the method of raising the temperature of a semiconductor wafer like the SAC process, the amount of $CF_x$ radicals being deposited on the upper surface of the semiconductor wafer is reduced, so that the selection to the doped polysilicon rather lowers. To avoid this, in the HARC process, process conditions were optimized in a manner different from those of the SAC process.

In order to process a contact hole having a depth of 2.0 μm, it is necessary to supply an ion flux having a satisfactory energy at the bottom of the hole, and a high plasma density is required. In order to improve the doped polysilicon selection ratio, there are two methods including a method of increasing the etching rate of an oxide film and a method of lowering the degree of etching off of the doped polysilicon per se. In this experiment, there was used a method wherein the flow rates of $C_5F_8$ and $O_2$ are increase to increase the amount of $CF_x$ radicals, thereby improving the etching rate of the oxide film.

Next, the processing profile according the HARC process is described.

In order to evaluate the margin of an ease-in-etching property under conditions determined by the experiments described hereinbefore, the evaluation was made using a 3.0 μm thick oxide film. As a result, a contact hole having an aspect ratio of ~17 (3.0 in depth/0.18 μm in diameter) can be formed. In comparison with the HARC process for an aspect ratio of ~13 (2.0 in depth/0.16 μm in diameter), the conditions used herein were judged as having a margin with respect to the ease-in-etching property. In view of many experiments, an example of the conditions of the HARC process for a diameter of 0.16 μm and an aspect ratio of 13 is shown in FIG. 14.

At the stage of stopping at just etching under conditions of the HARC process in the SAC with a diameter of 0.18 μm and an aspect ratio of 7 or in HARC with a diameter of 0.18 μm and an aspect ratio of 9, the doped polysilicon is etched off in excess, and especially at the periphery of the semiconductor wafer, the doped polysilicon is substantially lost, under which the oxide film is extended at the upper portion of the hole, resulting in the enlargement of the hole. In order to rectify such a profile that the hole is narrower toward the bottom of the hole, overetching is necessary. Nevertheless, the remaining film of the doped silicon is in shortage. In contrast, when compared with those conditions applied to SAC having a diameter of 0.18 μm and an aspect ratio of 7 or HARC having a diameter of 0.18 μm and an aspect ratio of 9, the case using conditions applied to SAC having a diameter of 0.16 μm and an aspect ratio of 10 or HARC having a diameter of 0.16 μm and an aspect ratio of 10 ensures good vertical processability (i.e. an angle of taper changed from 87.5° to 89°). In addition, the doped polysilicon selection ratio at the shoulder portion is improved (from 8 to 11), with a dimensional shift being reduced (from 69 mm to 27 mm).

Next, an instance of application of the invention to SAC and HARC processes having a minimum processing size of approximately 0.16 μm is described.

Figure 15:
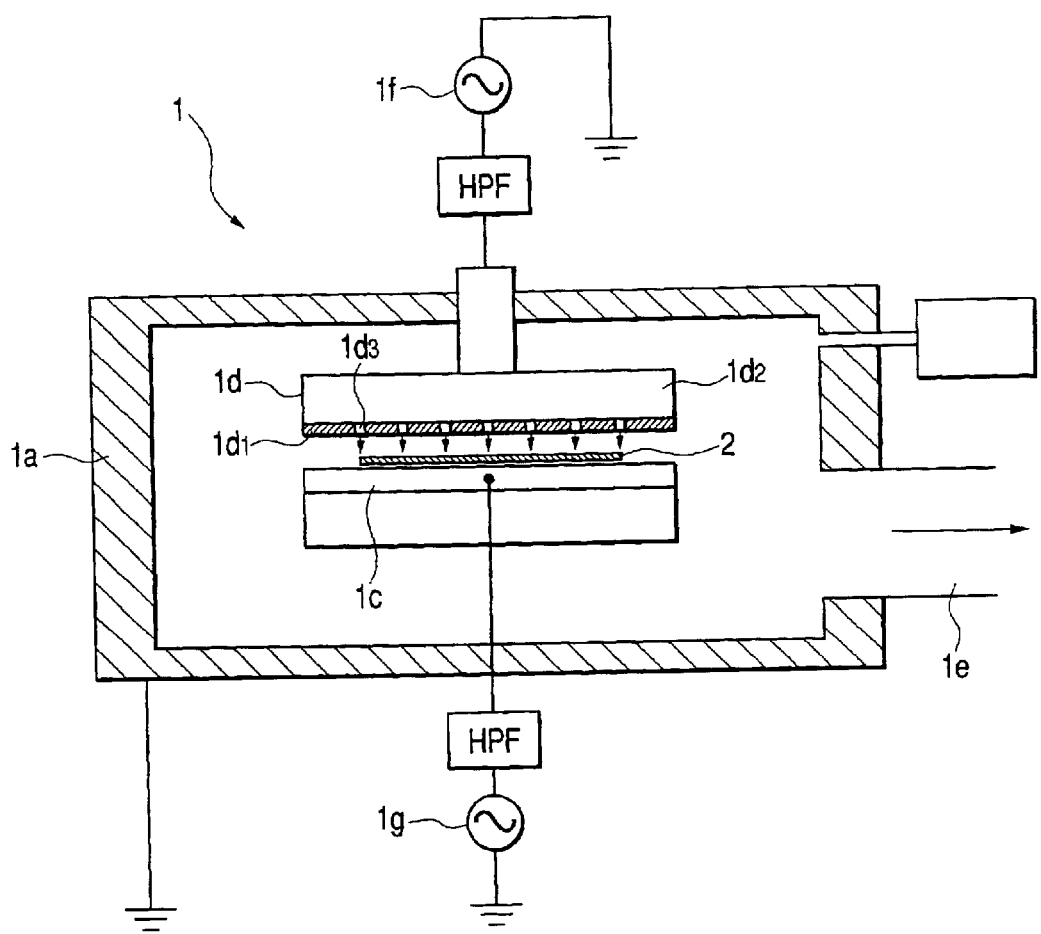
FIG. 15 is an illustrative view showing an instance of van etching device used in a fabrication method of a semiconductor integrated circuit device according to one embodiment of the invention.

An etching device used in this embodiment is described with reference to FIG. 15. This etching device is similar to the two-frequency excitation RIE device shown in FIG. 1. A chamber 1a of an etching chamber of the two-frequency excitation RIE device 1 is made, for example, of aluminium shaped in the form of a cylinder, which is anodized on the surface thereof. This chamber 1a is grounded. At the bottom of the chamber 1a, a substantially cylindrical susceptor support is provided through an insulating plate such as of a ceramic material, over which a susceptor 1b constituting a lower electrode is provided.

A cooling chamber is provided inside the susceptor support, in which a refrigerant medium such as liquid nitrogen or the like is fed and circulated, and a cooling or heating energy is transmitted to the semiconductor wafer 2 via the susceptor 1b to control the main surface (corresponding to the device surface) of the semiconductor wafer 2 at a desired temperature.

The susceptor 1b is shaped in the form of a disk whose upper surface is convex at the center thereof, on which an electrostatic chuck 1c having substantially the same plane form as the semiconductor wafer 2 is provided. The semiconductor wafer 2 is electrostatically attached to, for example, by the Coulomb attraction by application of a given DC voltage to an electrode interposed between insulating members of the electrostatic chuck 1c. The insulating plate, susceptor support, susceptor 1b, and electrostatic chamber 1c are, respectively, formed with a gas passage for supplying a heat transfer medium such as, for example, a helium (He) gas to the back side of the semiconductor wafer 2. The cooling or heating energy of the susceptor 1b is transmitted to the semiconductor wafer 2 through the heat transfer medium to maintain the semiconductor wafer 2 at a given temperature. A circular focus ring is arranged at an upper peripheral portion of the susceptor 1b so as to surround the semiconductor wafer 2 over the electrostatic chuck 1c therewith. This focus ring is made of the same silicon material as the semiconductor wafer 2 and functions to improve uniformity of etching within the main surface of the semiconductor wafer 2.

Above the susceptor 1b, there is provided an upper electrode 1d in parallel to and in face-to-face relation with the susceptor 1b. This upper electrode 1d is supported at the upper portion of the chamber 1a through an insulating member, and has an electrode plate 1d1 supported with an electrode support 1d2. The electrode plate 1d1 is made, for example, of silicon, silicon carbide (SiC) or amorphous carbon, and is placed in face-to-face relation with the susceptor 1b and has a multitude of holes 1d3. The electrode support 1d2 is made, for example, of aluminium, and is anodized on the surface thereof. In this etching device, the gap between the susceptor 1b (lower electrode) and the upper electrode 1d (hereinafter referred to as electrode gap) is changeable within a range, for example, of 17 mm to 60 mm. It will be noted that the electrode plate 1d1 is preferably made of silicon having the scavenging ability among the materials mentioned before.

At the center of the electrode support 1d2 of the upper electrode 1d, a gas feed port is provided and is connected with a gas feed pipe, and a treating gas supply source is mechanically connected to the gas feed pipe through a valve and the aforementioned mass flow controller. An etching gas is supplied from the treating gas supply source. A gas exhaust pipe 1e is provided at part of the chamber 1a. The gas exhaust pipe 1e is provided with a vacuum pup such as, for example, a turbo molecular pump, and thus, the chamber 1a is so arranged as to be evacuated to a given level of reduced pressure (e.g. 1 to 13.3 Pa) so as to create a vacuum. The exhaustion velocity of the vacuum pump is, for example, at 2200 (liters/second), ensuring a great degree of exhaustion. A gate valve is provided at a side wall of the chamber 1a. When the gate valve is opened, the semiconductor wafer 2 can be transferred between the chamber 1a and an adjacent load-lock chamber.

The upper electrode 1d is electrically connected with a first high-frequency power source 1f via a rectifier and a high-pass filer HFP. The first high-frequency power source 1*f* enables a frequency to be set within a range, for example, of 50 to 150 MHz. The application of such a high frequency potential permits a plasma to be generated within the chamber 1*a* in a favorable dissociation condition at a high density, thus making it possible to conduct plasma etching under pressure conditions lower than in prior art. The first high frequency power source 1*f* should preferably have a frequency ranging from 50 to 90 MHz, for example. Typically, the conditions of 60 MHz or thereabouts is adopted.

The susceptor 1*b* serving as the lower electrode is electrically connected with a second high frequency power source 1*g* via a low pass filter LPF and a rectifier. This second high frequency power source 1*g* is so arranged that the frequency can be set within a range, for example, of 1 to 4 MHz, and the application of a voltage with a frequency within such a range permits the proper ionic action to be given without damaging the semiconductor wafer 2. The frequency of the second high frequency power source 1*g* should preferably range 1 to 3 MHz, for example. Typically, the conditions of 2 MHz or thereabouts are adopted.

In the two-frequency excitation RIE device 1, the treating pressure set out herein is measured, for example, by the Varathon vacuum indicator as set forth hereinbefore. The Varathon vacuum indicator is disposed at a side wall in the chamber 1*a* and is slightly distant from the upper and lower electrodes. Hence, the treating pressure differs, in a strict sense, from a pressure between the upper electrode 1*d* and the susceptor 1*b* (lower electrode) which are facing each other. As a matter of course, the etching device is not limited to the use of the RIE apparatus and may be altered in various ways. The invention is applicable to a case where other types of parallel plate etching devices are used.

Figure 16:
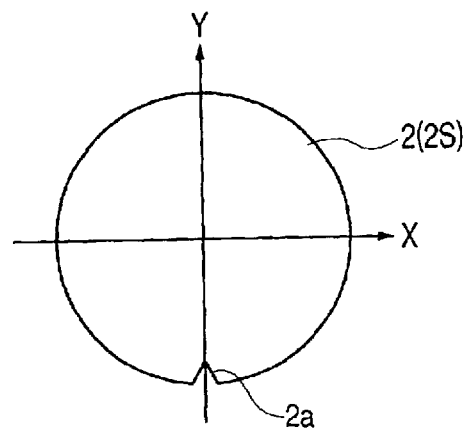
FIG. 16 is a plan view showing a semiconductor wafer.

Next, an instance of a method of fabricating the afore-described DRAM. FIG. 16 is a plan view showing a semiconductor wafer 2 in the fabrication step of DRAM. The semiconductor wafer 2 is formed, for example, substantially as a disk in plane and has a notch 2*a* for registration at a portion of the outer periphery. The semiconductor wafer 2 has a diameter, for example, of about 200 mm. The diameter of the wafer 2 is not limited to this value and may be altered arbitrarily. For instance, a semiconductor wafer having a diameter, for example, 30 mm may be used. When a plasma capacity or chamber capacity is changed by changing the diameter of the semiconductor wafer 2, the residence time correspondingly changes, with the possibility that the etching conditions of the oxide film change. It will be noted that in FIG. 16, an imaginary X axis and a Y axis vertical thereto (arranged as passing over the notch 2*a*) are drawn on the semiconductor wafer 2. In the sectional views of an essential part of the semiconductor wafer 2 shown in FIG. 17 and onwards, those marked as X, X are a sectional view, taken along the axis of K axis in FIG. 16, and those marked as Y, Y are a section view along the axis of Y in FIG. 16.

Figure 17:
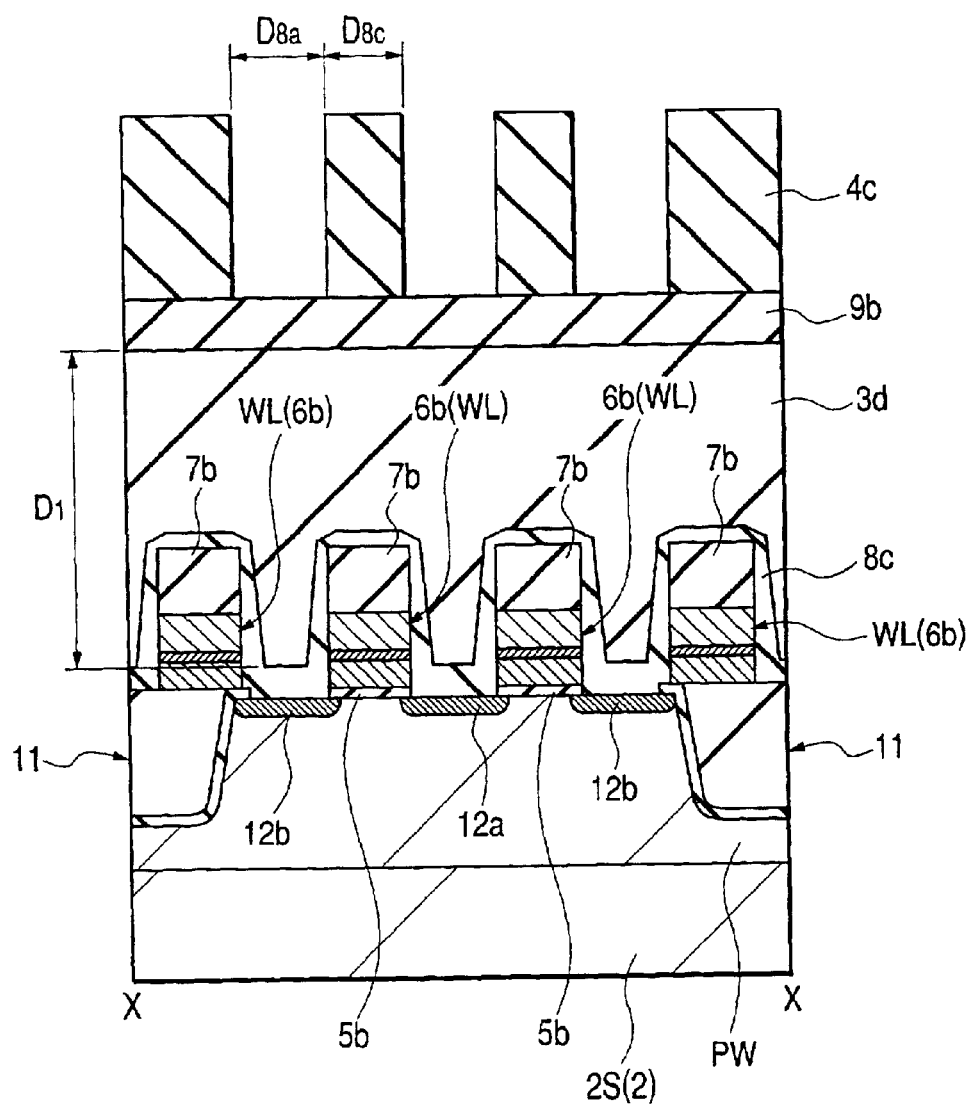
FIG. 17 is a sectional view showing an essential part in a fabrication step of a semiconductor integrated circuit device according to one embodiment of the invention.
Figure 18:
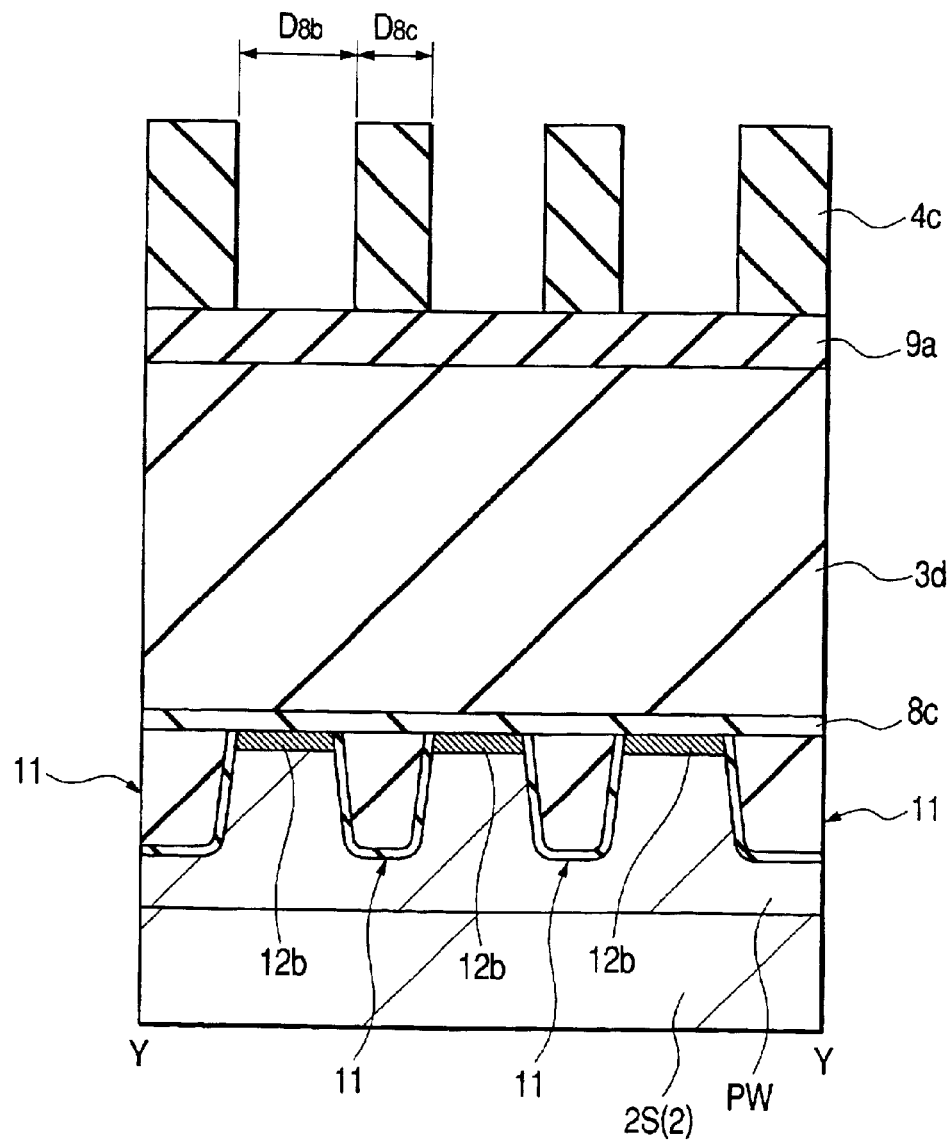
FIG. 18 is a sectional view showing an essential part along a plane vertical to that of FIG. 17 in the fabrication step of the semiconductor integrated circuit device at the same stage as in FIG. 17.

FIGS. 17 and 18 are, respectively, sectional views of an essential part at X, X and Y, Y in a memory cell region of the semiconductor wafer 2 in the course of the fabrication of DRAM according to this embodiment. In this process, an isolation portion 11 is formed on a main surface of a semiconductor substrate 2S (i.e. the semiconductor wafer 2 substantially in the form of a disk in plane at this stage) made of p-type single crystal silicon with a specific resistance of approximately 10 Ωcm, after which a p well PW is formed on the semiconductor substrate 2S. The isolation portion 11 is formed by subjecting the semiconductor substrate 2S at an element isolation region thereof to form a groove and depositing an insulating film made of a silicon oxide film by a CVD (chemical vapor deposition) method over the semiconductor substrate 2S including the inside of the groove, followed by polishing the insulating film by a chemical mechanical polishing (CMP) method to leave the film inside the groove (trench isolation). The p well PW is formed by ion implantation of an impurity such as, for example, boron (B) or the like in the semiconductor substrate 2S, followed by annealing (or thermally treating) the semiconductor substrate 2S to permit the impurity to be diffused.

Thereafter, the p well PW is cleaned on the surface thereof with a cleaning solution such as hydrofluoric acid (HF), and the semiconductor substrate 2S is subjected to wet oxidation to form a clean gate insulating film 5*b* on the surface of the p well PW. This gate insulating film 5*b* is made, for example, of silicon oxide with its thickness being, for example, about 6 nm when calculated as a thickness of silicon oxide.

This gate insulating film 5*b* may be constituted of a silicon oxide nitride film in place of the silicon oxide film. More particularly, because the silicon oxide nitride film is more effective in suppressing the occurrence of an interfacial level in the film and reducing an electron trap than a silicon oxide film, the use of the silicon oxide nitride film as the gate insulating film 5*b* contributes to improving a hot-carrier resistance and an insulation resistance. For the formation of a silicon oxide nitride film, it is, for example, sufficient to thermally treat the semiconductor substrate 2S in an atmosphere of a nitrogen-containing gas such as $NO.NO_2$ or $NH_3$. Similar results may be obtained in such a way that after formation of the gate insulating film 5*b* made of silicon oxide, the semiconductor substrate 2S is thermally treated in an atmosphere of such a nitrogen-containing gas so that nitrogen is allowed to segregate at the interface between the gate insulating 5*b* and the semiconductor substrate 2S.

The gate insulating film 5*b* may be formed, for example, of a silicon nitride film or a composite film of a silicon oxide and a silicon nitride film. When the gate insulating film 5*b* made of silicon oxide has a thickness smaller than 5 nm, especially smaller than 3 nm, when calculated as a silicon dioxide film, the direct occurrence of a tunnel current and the lowering of a breakdown voltage such as by hot carriers caused by stress become visualized. The silicon nitride film has a dielectric constant higher than a silicon oxide film, so that the actual thickness of the silicon nitride film can be made larger than that determined by calculation as a silicon dioxide film. More particularly, with a silicon nitride film, even though the film is physically thick, there can be obtained a capacitance equal to that of a relatively thin silicon dioxide film. Accordingly, when the gate insulating film 5*b* is constituted of a single silicon nitride film or a composite film thereof with a silicon oxide film, an effective thickness can be made greater than that of a gate insulating film constituted of a silicon oxide film alone. Thus, the occurrence of a tunnel leakage current and the lowering in breakdown voltage caused by hot carriers can be overcome to an extent.

Thereafter, a gate electrode 6*b* (word line WL) is formed on the gate insulating film 5*b*, followed by forming n-type semiconductor regions 12*a*, 12*b* of a low impurity concentration in the p wells PW at opposite sides of the gate electrode 6*b*. This gate electrode 6*b* (word line WL) is formed by depositing a polysilicon film doped with an impurity such as, for example, phosphorus on the semiconductor substrate by a CVD method, further depositing a WN (tungsten nitride) film and a W (tungsten) film thereover by a sputtering method, and a cap film 7*b* made of a silicon nitride film or the like by a CVD method, followed by dry etching of these films through a photoresist film as a mask.

The polysilicon film constituting the gate electrode 6b has a thickness, for example, of approximately 50 to 100 nm. The thickness of the tungsten nitride film is, for example, at approximately several nanometers, and the thickness of the tungsten film is, for example, at approximately 50 to 100 nm. The cap film 7b is formed by depositing a silicon nitride film having a thickness of approximately 200 nm. The n-type semiconductor regions 12, 12b are, respectively, formed by ion implanting an impurity such as, for example, arsenic (As) in the p wells PW.

Next, an insulating film 8c made of a silicon nitride film or the like is deposited on the semiconductor substrate 2S by a low pressure CVD method or the like. At this stage, the insulating film 8c covers the main surface of the semiconductor substrate 2S, the side surfaces of the gate electrode 5b and the surfaces (including the upper and side surfaces) of the cap film 7b therewith in such a way that spaces between adjacent word lines WL are not buried. Subsequently, an oxide film 3d is deposited thereover, followed by planarization of the upper surface by a chemical mechanical polishing method. In this manner, the oxide film 3d is formed. The dimension D1 indicating the thickness of the oxide film 3d is, for example, at approximately 600 nm, like the above case.

Subsequently, an antireflective film 9b having a thickness, for example, of approximately 50 to 200 nm is deposited by a spin coating method or the like, after which a photoresist film 4c having a thickness, for example, of approximately 400 to 800 nm is deposited by a spin coating method or the like. The photoresist film 4c acts as a mask film for forming a contact hole, and is so patterned by an ordinary exposing treatment after the deposition that a contact hole-forming region is exposed to through an opening portion with other portions being covered with the film. Dimensions D8a, D8b of the opening portion of the photoresist film 4c and a dimension D8c of an adjoining space of the opening portion are, respectively, at approximately 160 nm, for example.

Figure 19:
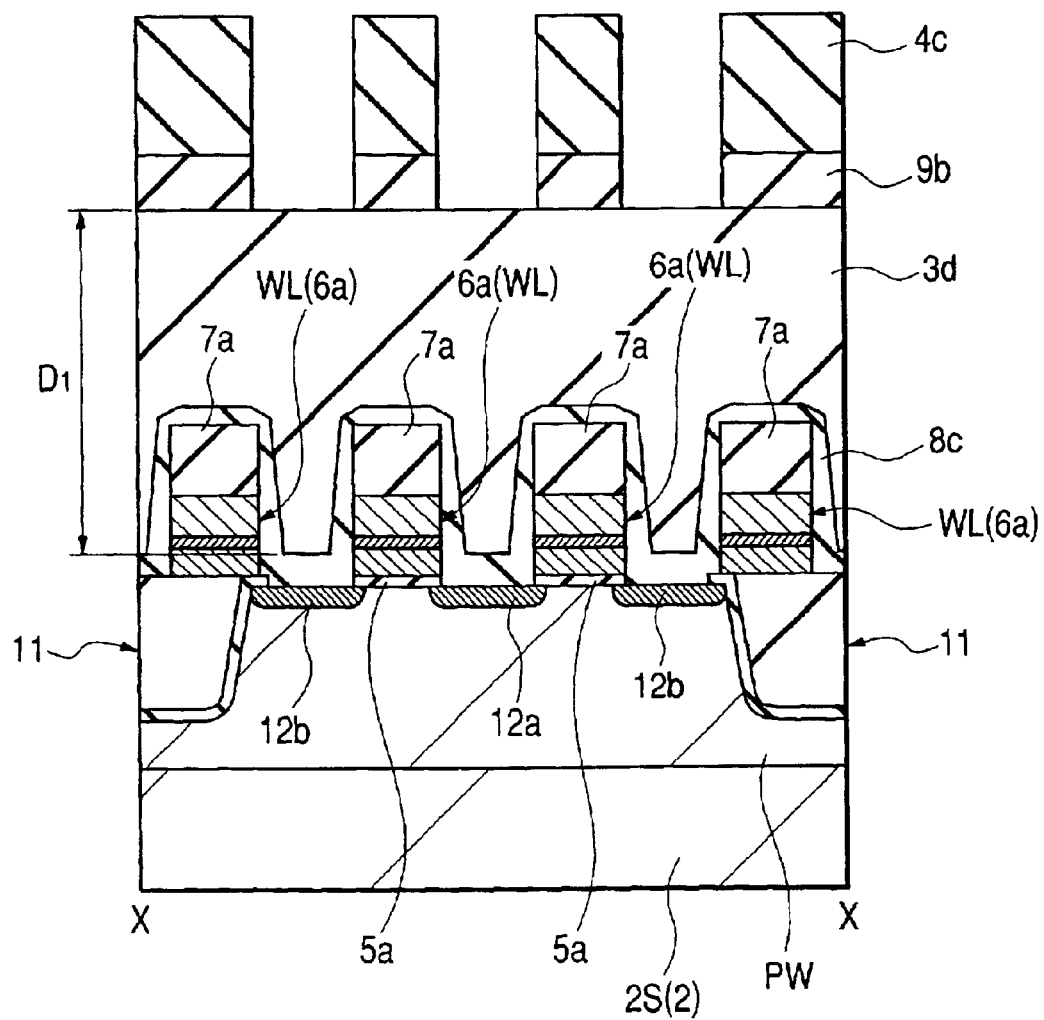
FIG. 19 is a sectional view showing the essential part in the fabrication step of the semiconductor integrated circuit device subsequent to FIG. 17.
Figure 20:
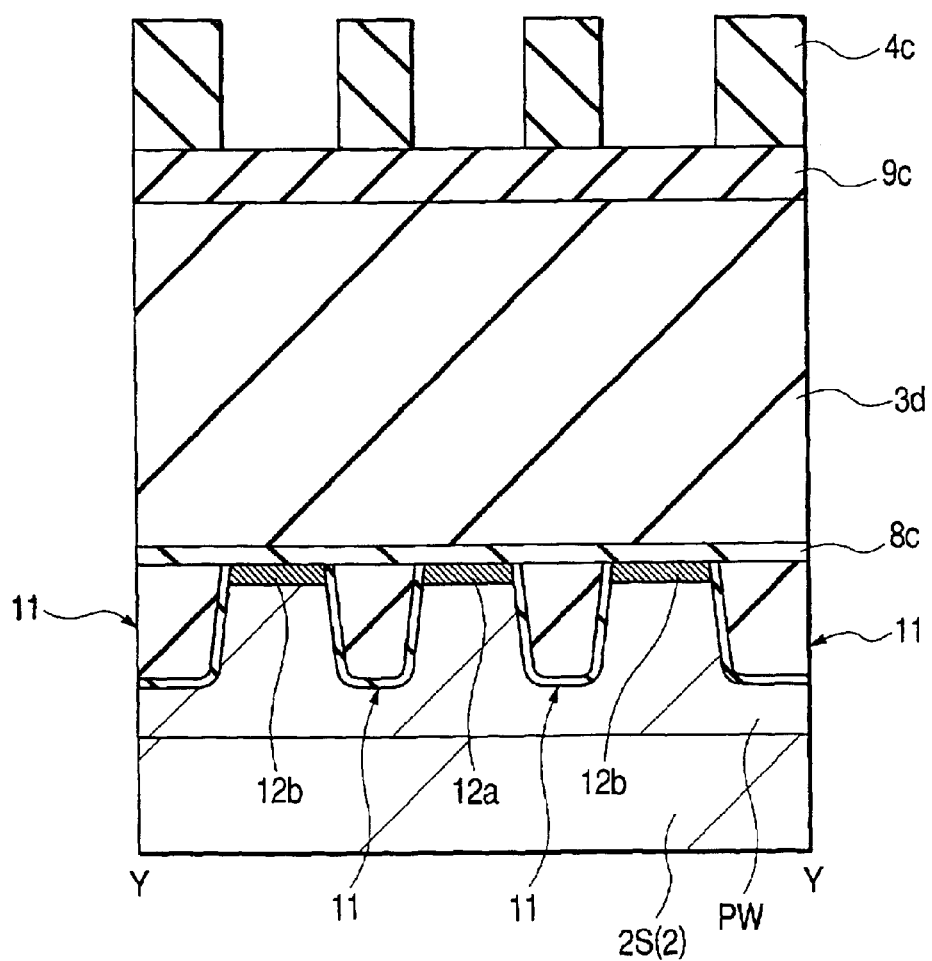
FIG. 20 is a sectional view showing the essential part along a plane vertical to that of FIG. 19 in the fabrication method of the semiconductor integrated circuit device at the same stage as in FIG. 19.

As shown in FIGS. 19 and 20, the antireflective film 9b is removed by etching through the mask of the photoresist film 4c. The etching device used is, for example, a two-frequency excitation parallel plate RIE device.

Figure 21:
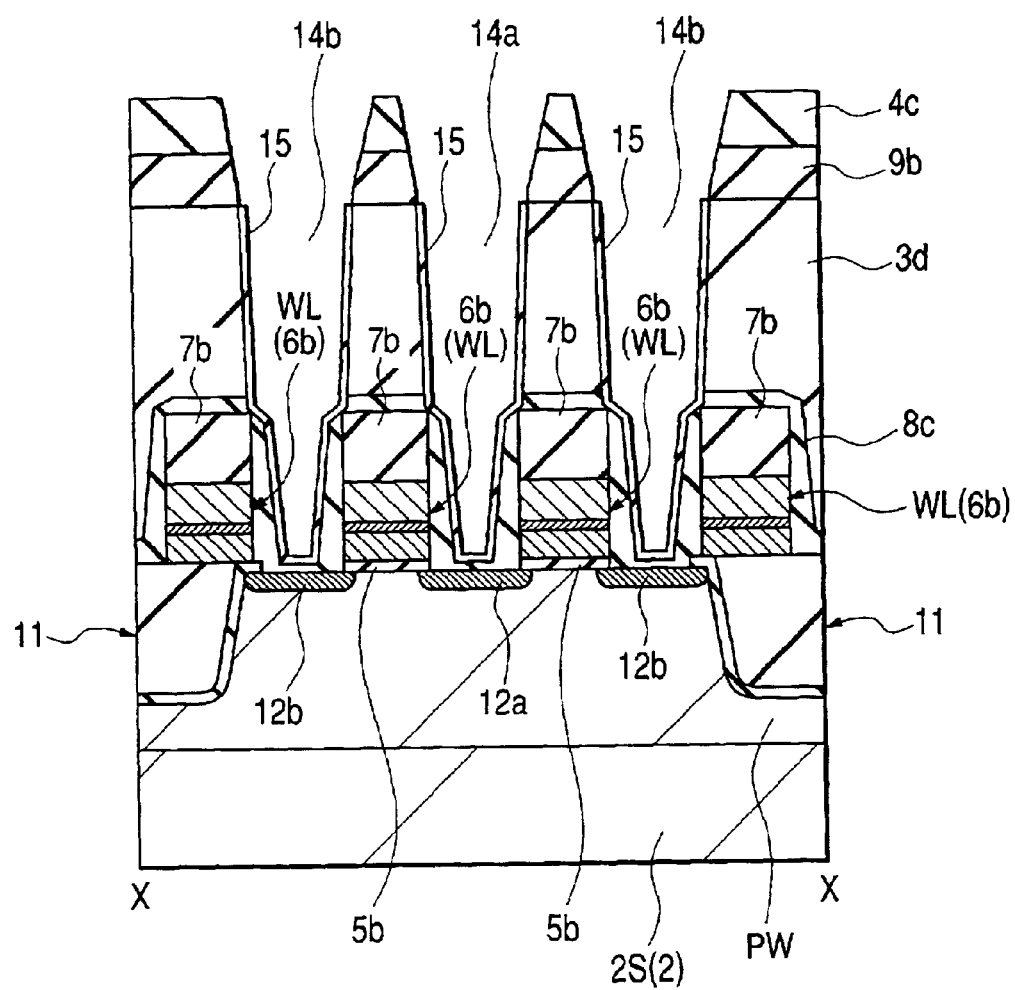
FIG. 21 is a sectional view showing the essential part in the fabrication method of the semiconductor integrated circuit device subsequent to FIG. 19.
Figure 22:
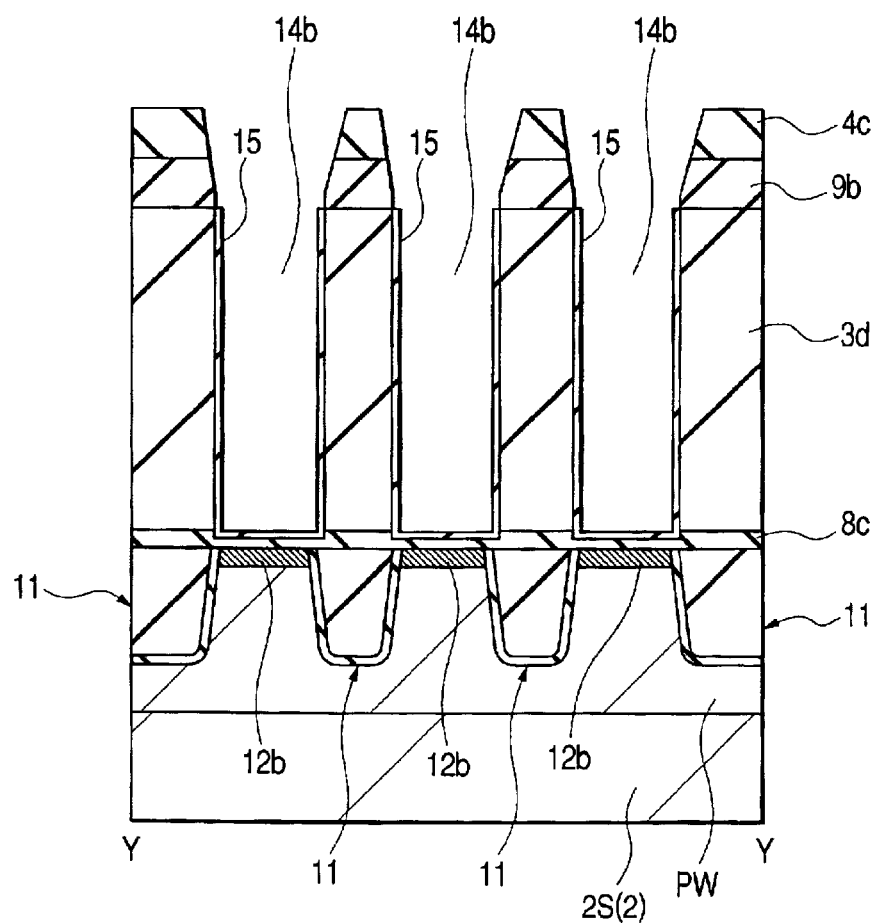
FIG. 22 is a sectional view showing the essential part along a plane vertical to that of FIG. 21 in the fabrication method of the semiconductor integrated circuit device at the same stage as in FIG. 21.

Thereafter, using the SAC process of the invention, the portion of the oxide film 3d exposed from the photoresist film 4c serving as an etching mask is removed by etching as is particularly shown in FIGS. 21 and 22. In this way, contact holes 14a, 14b are formed, respectively. It will be noted that at a stage after the etching treatment, the insulating film 8c is left as an etching stopper at the bottoms of the contact holes 14a, 14b, thus not resulting in the complete formation of the contact holes 14a, 14b. The contact holes 14a, 14b, respectively, have a diameter, for example, of approximately 60 nm at the lower portion thereof. Accordingly, the aspect ratio of the contact holes 14a, 14b is such that since the dimension D1 in thickness of the oxide film 3d (see FIG. 17) is at 600 nm, 600 in depth/60 in width=10. A thin polymer layer 15 is formed on the surfaces of the oxide film 3d (including the bottom surface and side surface (inner surface) of the contact holes 14a, 14b) within the contact holes 14a, 14b and covers the oxide film 3d on the surface thereof.

The etching conditions in the course of the SAC process are described below, for example. The etching device used was such a two-frequency excitation RIE device 1 as shown in FIG. 15. The treating pressure within the chamber during the course of the etching treatment is, for example, at approximately 2.66 Pa, the high frequency power is, for example, at upper electrode/lower electrode=approximately 800/700 W, the etching gas is made, for example, of $C_5F_8$/$O_2$/Ar=approximately 16/18/800 cm$^3$/minute, the electrode temperature is, for example, at upper electrode/lower electrode=approximately 60/20° C., and the electrode gap is, for example, at about 21 mm. The etching time is such that light with a wavelength of $\lambda$=440 nm (for silicon fluoride (SiF)) among emitted light rays from a plasma is observed and the descent of a waveform is judged as completion of etching of the silicon oxide film, under which overetching treatment was carried out by 10%.

In this case, the residence time within a plasma is, for example, at approximately 2.11 ms, and when expressed as a residence time within a chamber, it is, for example, at approximately 142.13 ms. The partial pressure of $C_5F_8$ is, for example, at 0.05 Pa. The ratio of the gas flow rates ($O_2$/$C_5F_8$) is, for example, at 1.125. The value of ($C_5F_8$+$O_2$)/Ar is, for example, at approximately 0.0425. The plasma density is, for example, at approximately the first half of $10^{11}$/cm$^3$.

The temperature of the semiconductor substrate during the etching treatment is set, for example, at approximately 120° C. by controlling the pressure and flow rate of helium supplied from a gas passage provided at the susceptor 1b (see FIG. 15) of the etching device or an electrostatic voltage. The temperature of the semiconductor substrate 2S is a temperature of the main surface of the semiconductor substrate being etched, and heat is supplied mainly from the plasma. This temperature is determined, as set out hereinbefore, by attaching temperature plates for temperature measurement to a center, an outer periphery and an intermediate therebetween on the upper surface of the semiconductor wafer 2 and averaging three temperature measurements.

Figure 23:
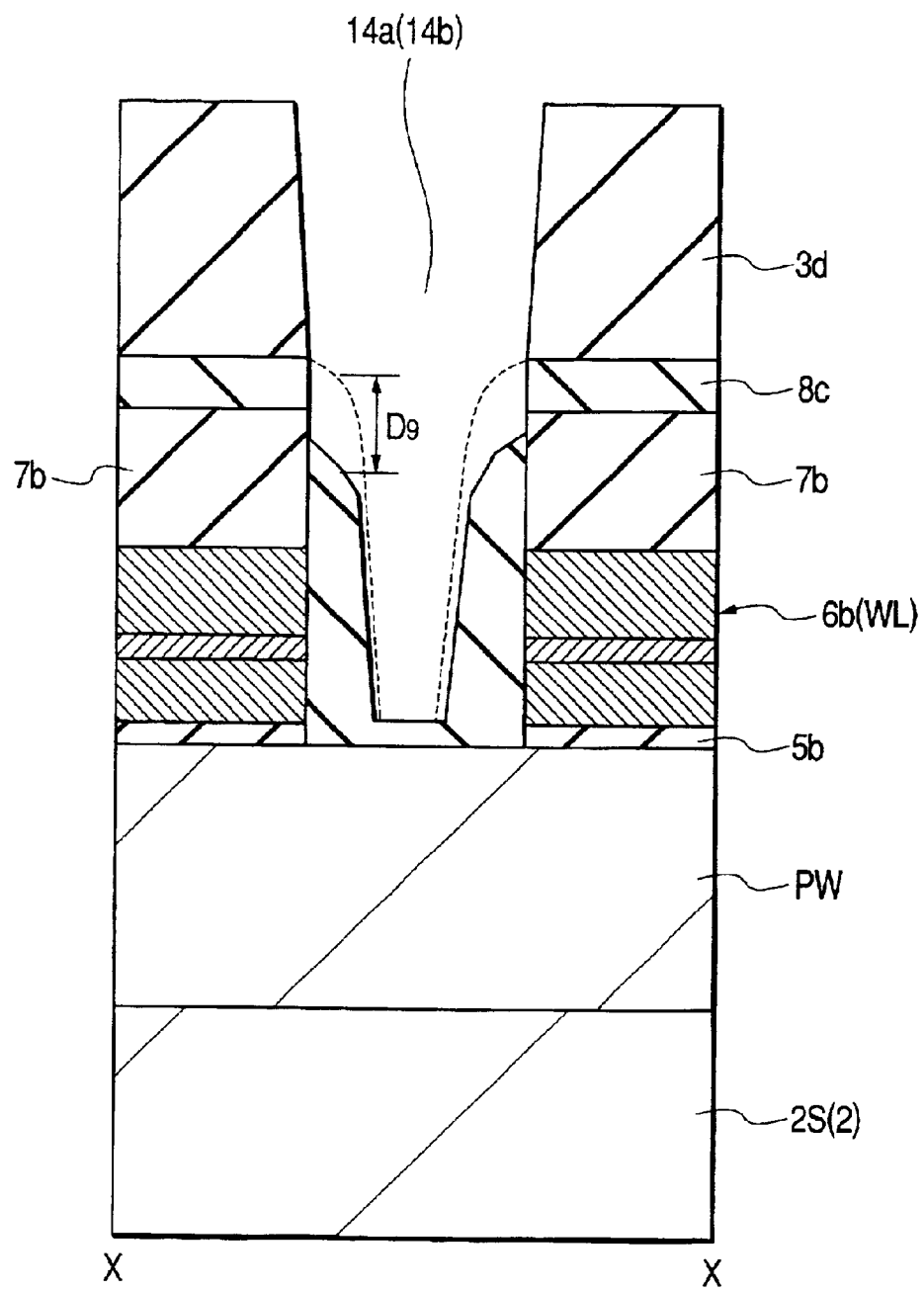
FIG. 23 is an enlarged, sectional view of the essential part in the fabrication method of the semiconductor integrated circuit device of FIG. 21.

After completion of the etching, a selection ratio of the silicon oxide film to the silicon nitride film was calculated. When etched in a manner as exemplified in FIG. 23, this selection ratio is expressed by (etching rate of silicon oxide film (oxide film 3d))/(etching rate of silicon nitride film (insulating film 8c) at the shoulder on the gate electrode 6b). The etching rate of the silicon nitride film at the shoulder over the gate electrode 6b was calculated based on the etched-off dimension D9 at a portion where the degree of etching in a vertical direction is in maximum. As a result, while the selection ratio for comparison is at 7, the selection ratio in this embodiment was found to be at 16.1. The results reveal that the selection ratio is doubled by using conditions of a low pressure, large flow rates of etching gases and a high temperature of the semiconductor substrate 2S. More particularly, according to this embodiment, the contact holes 14a, 14b each having a high aspect ratio can be well made while keeping a satisfactory selection ratio. Thus, the yield and reliability of DRAM can be improved. Because scale-down can be promoted, it becomes possible to improve the performance and degree of integration of DRAM. It will be noted that FIG. 23 is an enlarged, sectional view of FIG. 21. In FIG. 23, in order to facilitate better understanding of the concept, the n-type semiconductor regions 12a, 12b, polymer layer 15, antireflective film 9b, photoresist film 4c and the like are not shown.

Figure 24:
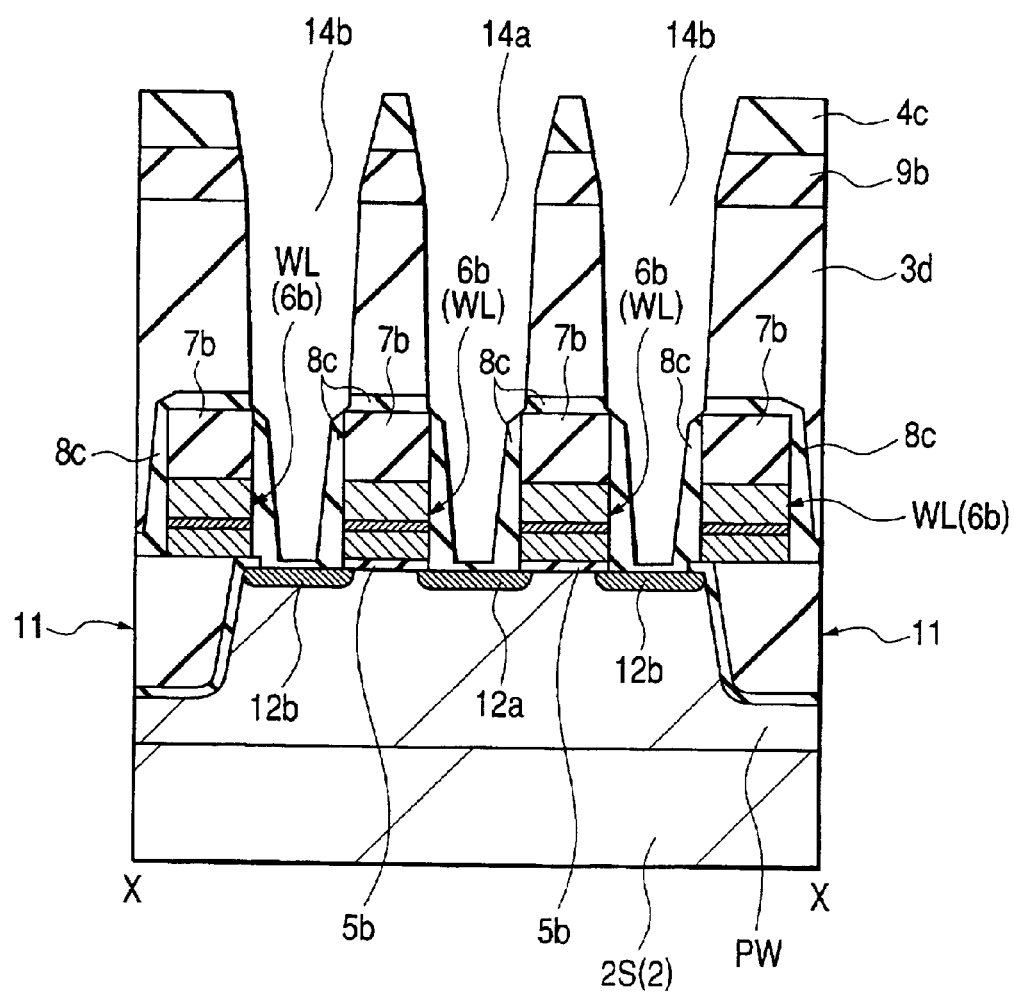
FIG. 24 is a sectional view of the essential part in the fabrication step of the semiconductor integrated circuit device subsequent to FIG. 21.
Figure 25:
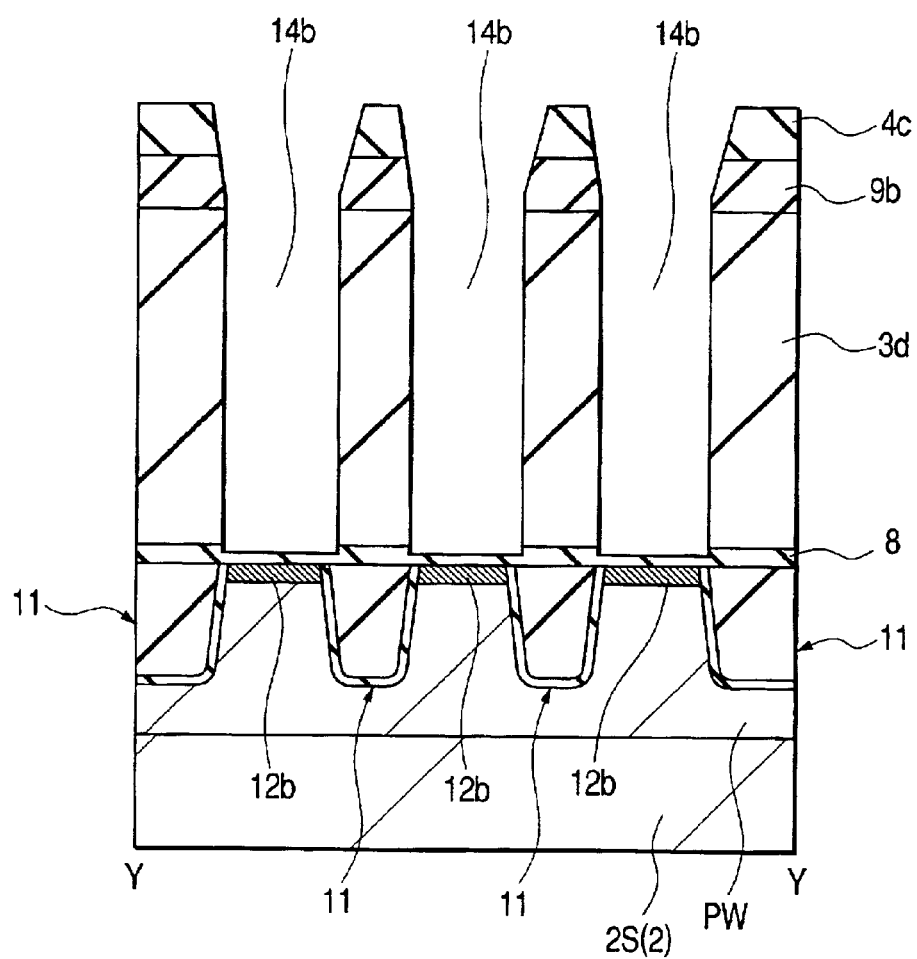
FIG. 25 is a sectional view showing the essential part along a plane vertical to that of FIG. 38 in the fabrication step of the semiconductor integrated circuit device at the same stage as in FIG. 24.

Subsequently, after the etching treatment of the oxide film, the polymer film 15 is removed continuously without breakage of a vacuum condition. This removal permits the oxide film 3d to be exposed from the surfaces (including side surfaces and bottom surface) inside the contact holes 14a, 14b as is particularly shown in FIGS. 24 and 25. The treating conditions for this are those where only the polymer layer is removed and the photoresist film is not removed.

Figure 26:
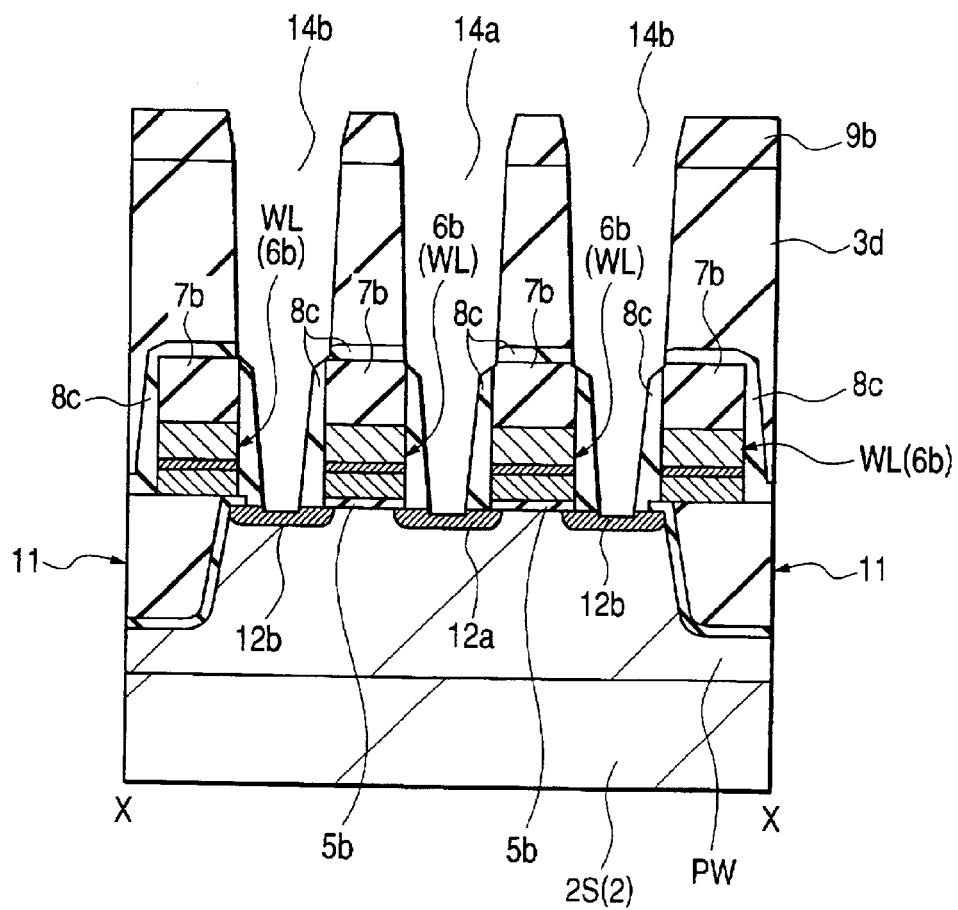
FIG. 26 is a sectional view of the essential part in the fabrication step of the semiconductor integrated circuit device subsequent to FIG. 24.
Figure 27:
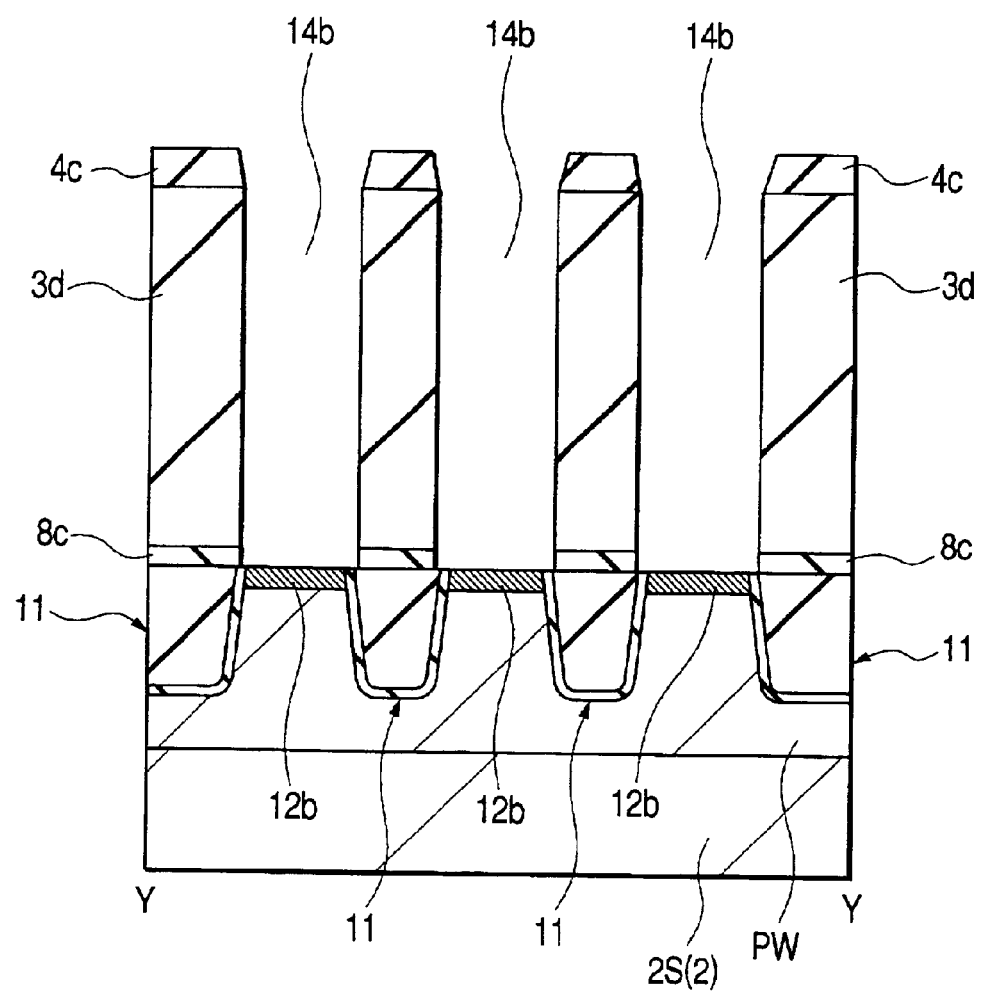
FIG. 27 is a sectional view showing the essential part along a plane vertical to that of FIG. 26 in the fabrication step of the semiconductor integrated circuit device at the same stage as in FIG. 26.

Thereafter, the insulating film 8c at the bottom of the contact holes 14a, 14b is removed continuously without breakage of a vacuum condition by etching through the photoresist film 4c as an etching mask. In this way, as shown in FIGS. 26 and 27, part of the main surface of the semiconductor substrate 2S (e.g. n-type semiconductor regions 12a, 12b) is exposed to from the bottoms of the contact holes 14a, 14b to complete the contact hole 14a, 14b. The etching device used is the two-frequency excitation RIE device of FIG. 15 used for the etching of the oxide film and subsequent treatments.

Figure 28:
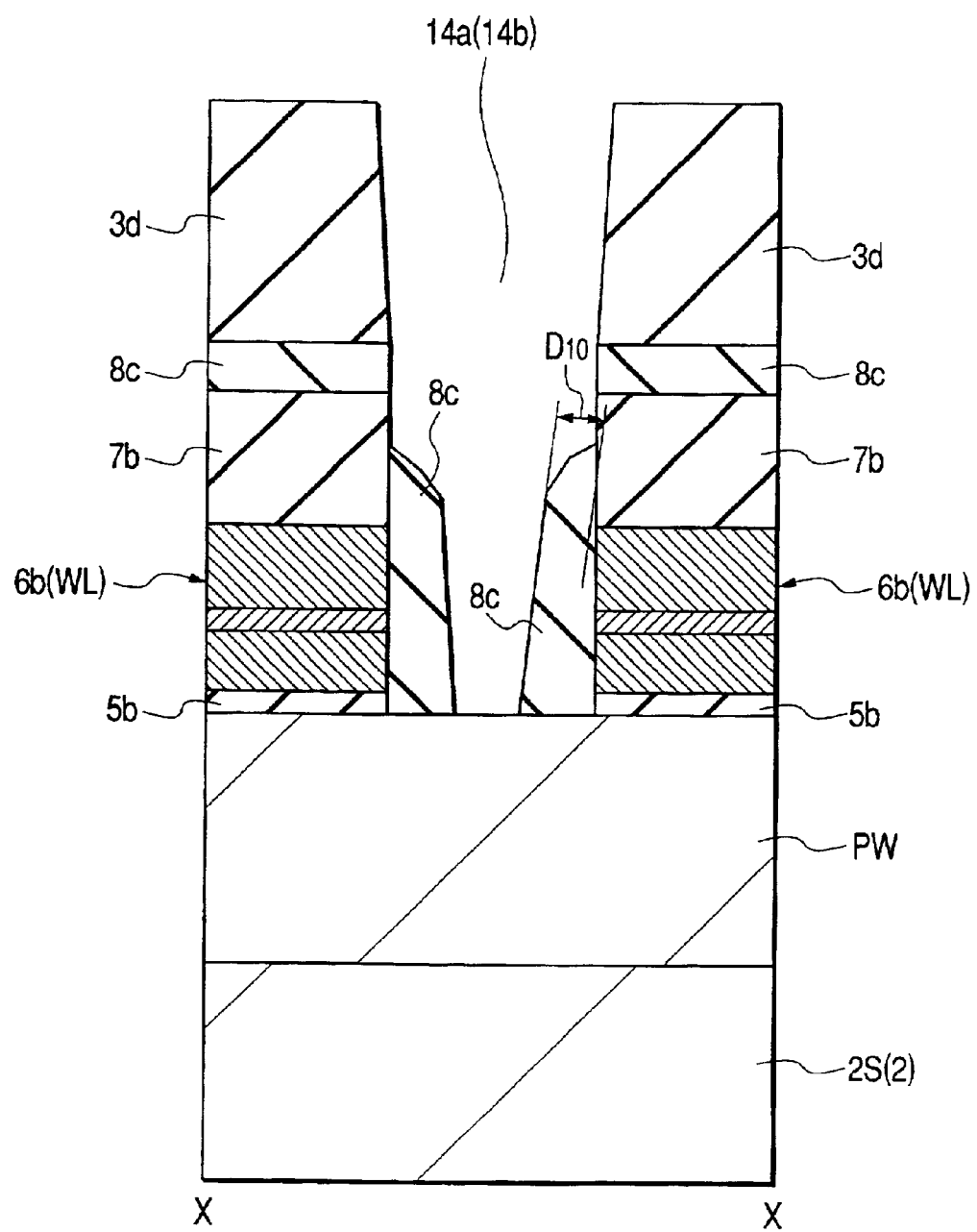
FIG. 28 is an enlarged, sectional view of the essential part in the fabrication step of the semiconductor integrated circuit device of FIG. 26.
Figure 29:
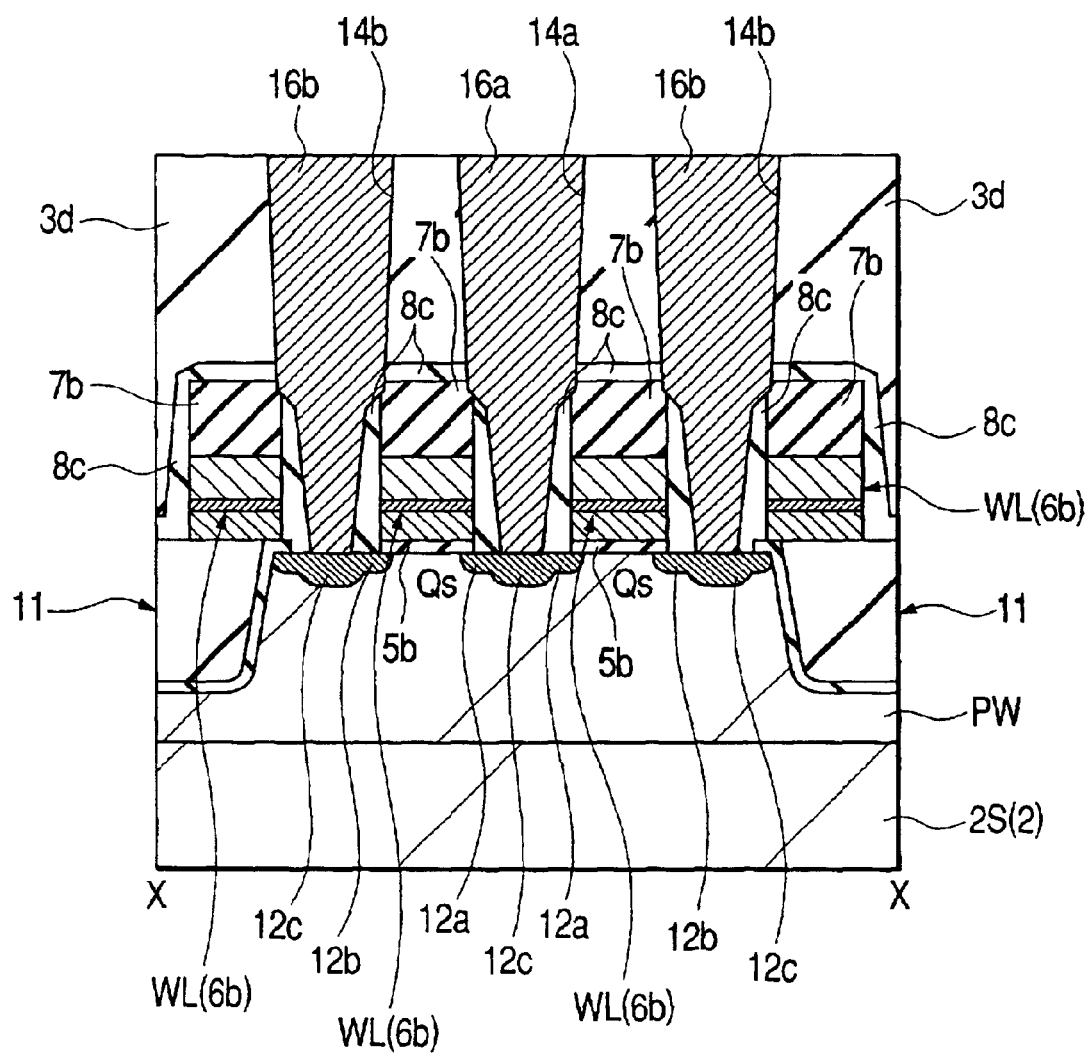
FIG. 29 is a sectional view of the essential part in the fabrication step of the semiconductor integrated circuit device subsequent to FIG. 26.
Figure 30:
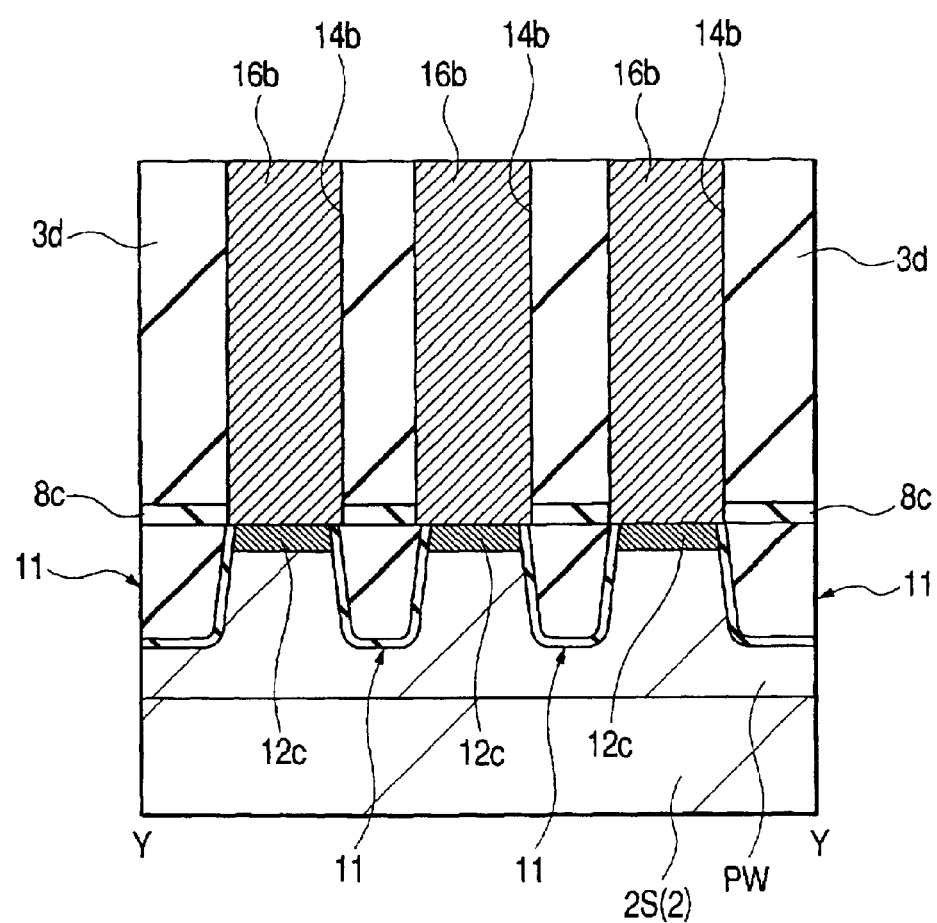
FIG. 30 is a sectional view showing the essential part along a plane vertical to that of FIG. 29 in the fabrication step of the semiconductor integrated circuit device at the same stage as in FIG. 29.

As a result, where the etching conditions of the oxide film 3d (SAC process) were adopted, the margin of short-circuiting between the gate electrode 6b and the contact holes 141, 14b is changed from approximately 30 nm for a comparative example to approximately 40 nm, for example. This short-circuiting margin should preferably be established at such a level that electric and physical separation between the gate electrode 6b and the conductive film buried in the respective contact holes 14a, 14b is guaranteed. In general, the margin should be in the range of approximately 30 nm to 40 nm. In this embodiment, the short-circuiting margin is increased to an extent of 40 nm, which satisfies the above general requirement. Of course, inconvenience is not caused in that the contact holes 14a, 14b are not fully made. Accordingly, the yield and reliability of DRAM having a high degree of integration and a high performance can be improved. As the short-circuiting margin, there was measured dimension D10 at a portion where the distance between the gate electrode 6b and the contact holes 14a, 14b is in minimum as shown in FIG. 28. FIG. 28 is an enlarged, sectional view of an essential part of FIG. 26. In FIG. 28, the members such as the antireflective film and the photoresist film are not shown for convenience's sake.

Next, after removal of the photoresist film 4c and the antireflective film 9a by ashing treatment, for example, an n-type doped polysilicon film is deposited over the main surface of the semiconductor substrate 2S by a CVD method or the like, followed by polishing the doped polysilicon film by a CMP method of the like to form plug 16a, 16b formed of the doped polysilicon within the contact holes 14a, 14b, respectively. Thereafter, the semiconductor substrate 2S is thermally treated to permit an impurity (e.g. phosphorus or arsenic) in the plug 16a, 16b to be diffused in the semiconductor substrate 2S. Eventually, an $n^{+-}$ type semiconductor region is formed in the semiconductor substrate 2S as superposed self-alignedly with the n-type semiconductor regions 12a, 12b for source-drain. Memory cell selection MISQs are completed on the semiconductor substrate according to the preceding steps.

Figure 31:
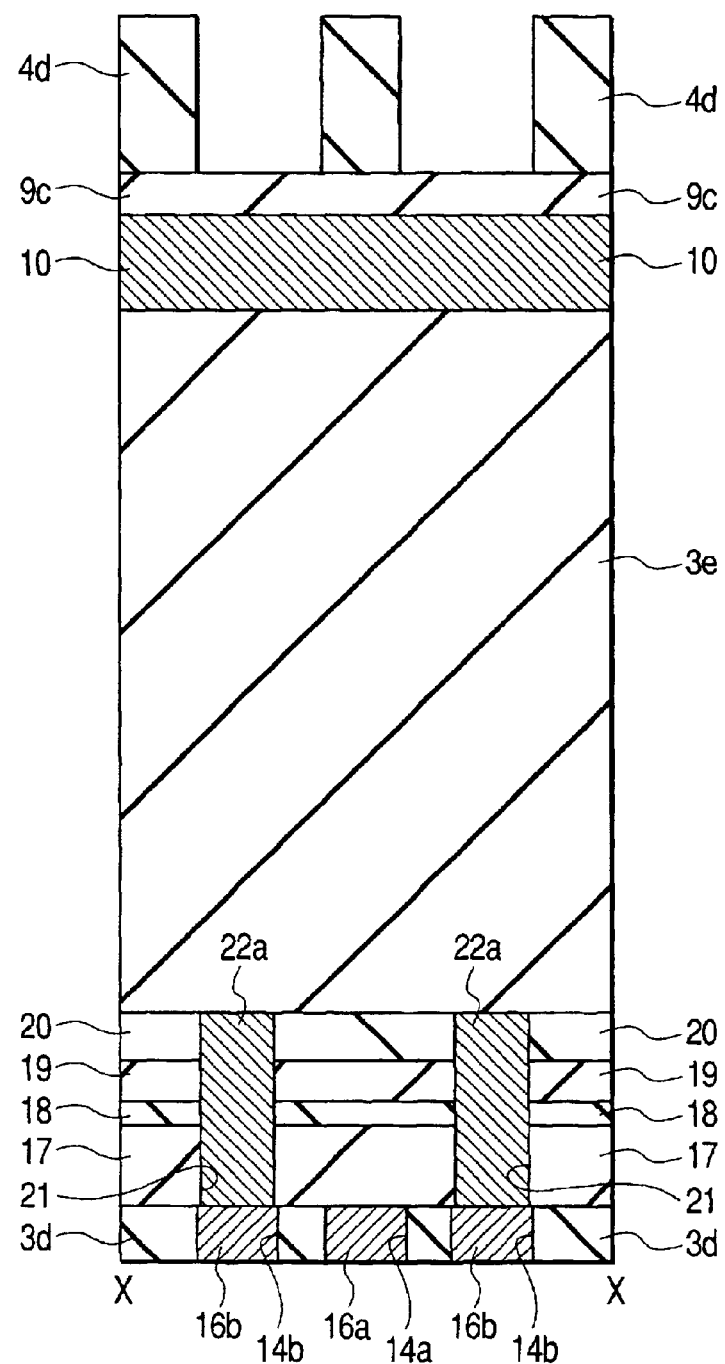
FIG. 31 is a sectional view of the essential part in the fabrication step of the semiconductor integrated circuit device subsequent to FIG. 29.
Figure 32:
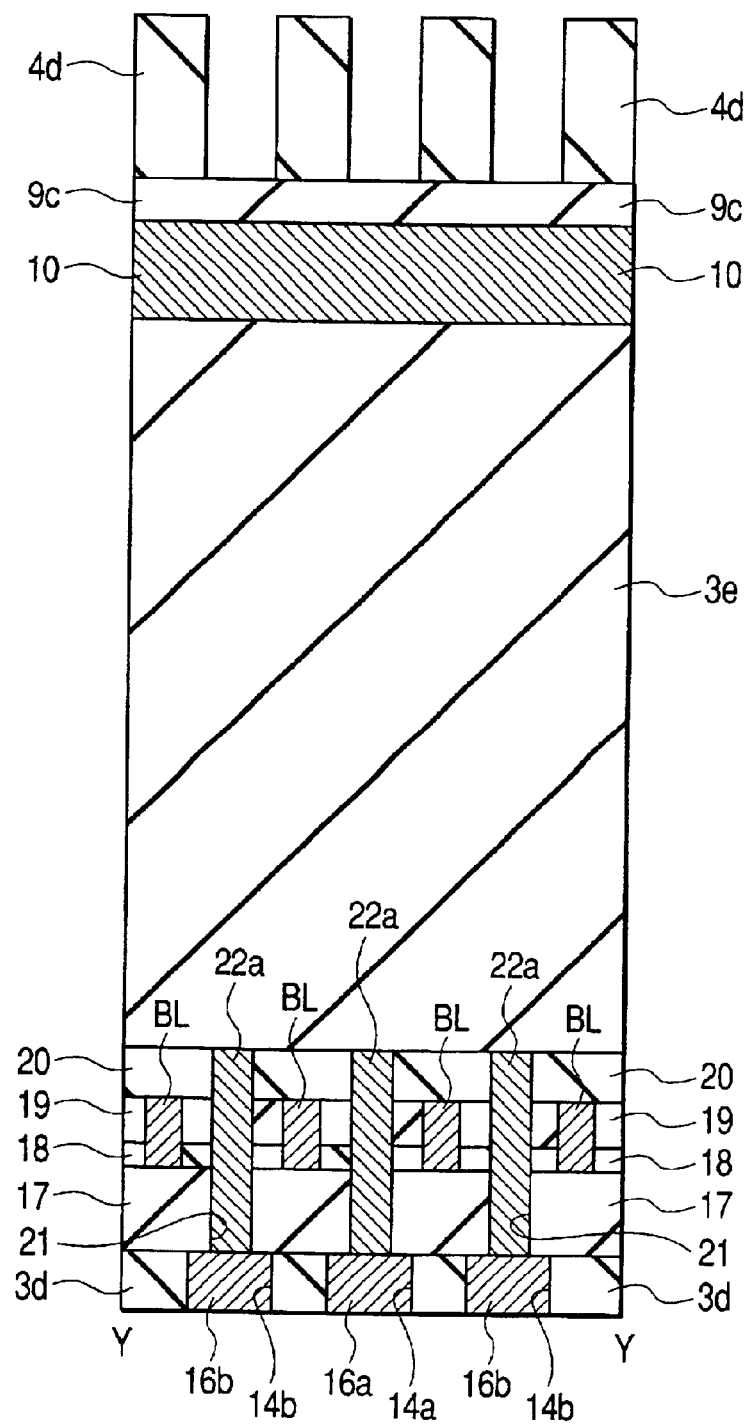
FIG. 32 is a sectional view showing the essential part along a plane vertical to that of FIG. 31 in the fabrication step of the semiconductor integrated circuit device at the same stage as in FIG. 31.

Subsequently, as shown in FIGS. 31 and 32, an insulating film 17 made of a silicon oxide film is deposited on the oxide film 3d and the plugs 16a, 17b according to a plasma CVD method using, for example, a TEROS gas. Thereafter, a through-hole is made in the insulating film 17 so that part of the plug 16 is exposed to, and a metal film such as, for example, tungsten is deposited inside the through-hole and on the insulating film 17 by a sputtering method or a CVD method or both, followed by polishing the metal film to leave it only in the through-hole by a CMP method or the like. As a result, a plug is formed in the through-hole. This plug is electrically connected with the plug 16a.

Next, an insulating film 18 made, for example, of silicon nitride and having a thickness of approximately 50 nm is deposited on the insulating film 17, after which an insulating film 19 made of silicon oxide is deposited such as by a plasma CVD method using, for example, a TEOS gas.

Subsequently, after formation of a groove for formation of a bit line in the insulating films 18, 19, a metal film such as, for example, tungsten or the like is deposited in the grooves and on the insulating film 19 by a sputtering method or the like, followed by polishing by a CMP method so as to leave the metal film in only the grooves. In this way, the a buried bit line BL made of tungsten is formed in the grooves for formation of a bit line. This bit line BL is electrically connected to the plug 16a through a plug in the through-hole made in the insulating film 17, and is also electrically connected to one of the n-type semiconductor regions 12 and the $n^+$type semiconductor region 12c of the memory cell selection MISQs. Thereafter, the insulating film 20 made, for example, of silicon nitride is deposited over the insulating film 19 and the buried bit line BL by a CVD method in a thickness of approximately 100 nm.

Next, a through-hole 21 is made in the insulating films 17 to 20 according to a lithographic technique and a dry etching technique so as to expose the upper surface of the plug 16b. The through-hole 21 is formed, for example, substantially in an ellipsoidal form in plane. Subsequently, a doped polysilicon film is, for example, deposited inside the through-hole 21 and over the insulating film 20 by a CVD method, followed by polishing by a CMP method or the like, thereby leaving the doped polysilicon film in only the through-hole 21. Thus, a plug 22a made of the doped-polysilicon film is formed inside the through-hole 21. The plug 22a is electrically connected to the plug 16b.

Thereafter, an insulating film 3e (corresponding to the oxide film referred to hereinabove) is deposited by a plasma CVD method using, for example, a TEOS gas in a thickness, for example, of approximately 2 $\mu$m. A mask-forming film 10 made, for example, of a doped polysilicon film or the like is subsequently deposited over the insulating film 3e by a plasma CVD method in a thickness of approximately 200 to 300 nm. Since the mask-forming film 10 is constituted of doped polysilicon, contamination can be reduced with easy processing. The mask-forming film 10 may be made, for example, of a film of a metal such as tungsten. In this case, because such a material is hard and is unlikely to be etched off and ensures a high selection ration relative to other types of materials, thereby leading to an improved processing accuracy of the oxide film.

Figure 33:
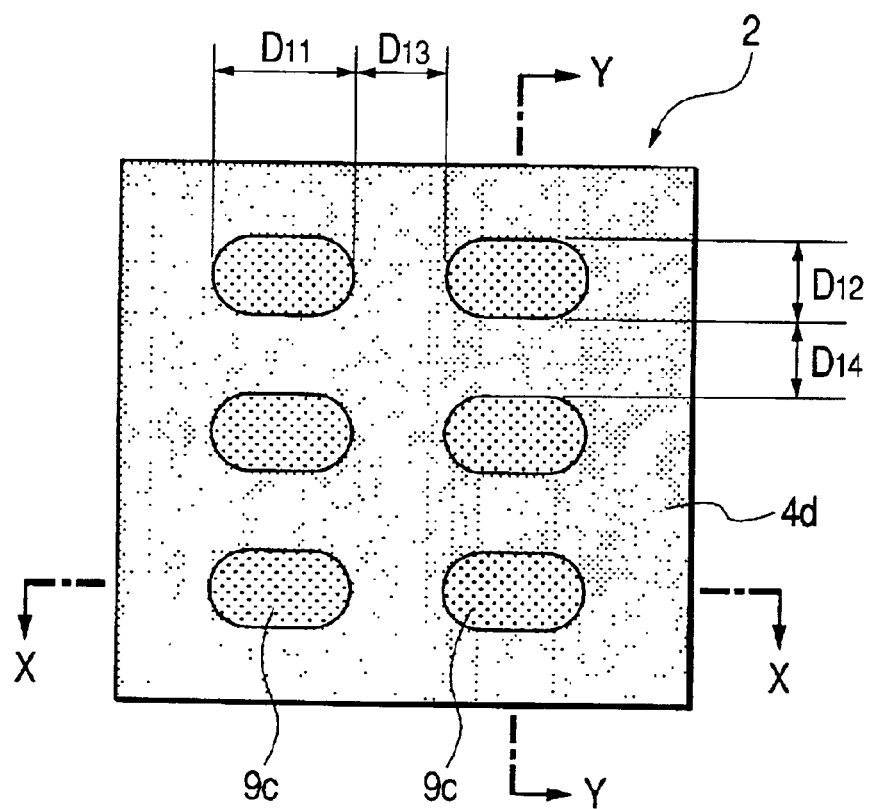
FIG. 33 is a plan view showing the essential part of the semiconductor wafer used in the fabrication step of the semiconductor integrated circuit device of FIGS. 31 and 32.

Next, an antireflective film having a thickness, for example, of 50 to 200 nm and a photoresist film 4d having a thickness, for example, of approximately 400 to 800 nm are successively deposited by a spin coating method in this order. The photoresist film 4d serves as a mask film for forming a capacitor hole in order to form a lower electrode of a capacitor element for information storage. The photoresist film 4d is patterned by an ordinary exposing procedure after the deposition so that the capacitor hole-forming region is exposed and the others are covered therewith. FIG. 33 is a plan view of an essential part of the semiconductor wafer at this stage. Only for ease in view in FIG. 33, the photoresist film 4d is hatched in a relatively dense dot pattern, and the anti-reflective film 9c is hatched in a relatively thin dot pattern. In FIG. 33, dimension D11 along the length of the opening for forming a capacitor hole is, for example, at approximately 450 nm, dimension D12 along the width is, for example, at 160 nm, and dimensions D13, D14 between adjacent openings for forming a capacitor hole are, respectively, at approximately 160 nm, for example.

Figure 34:
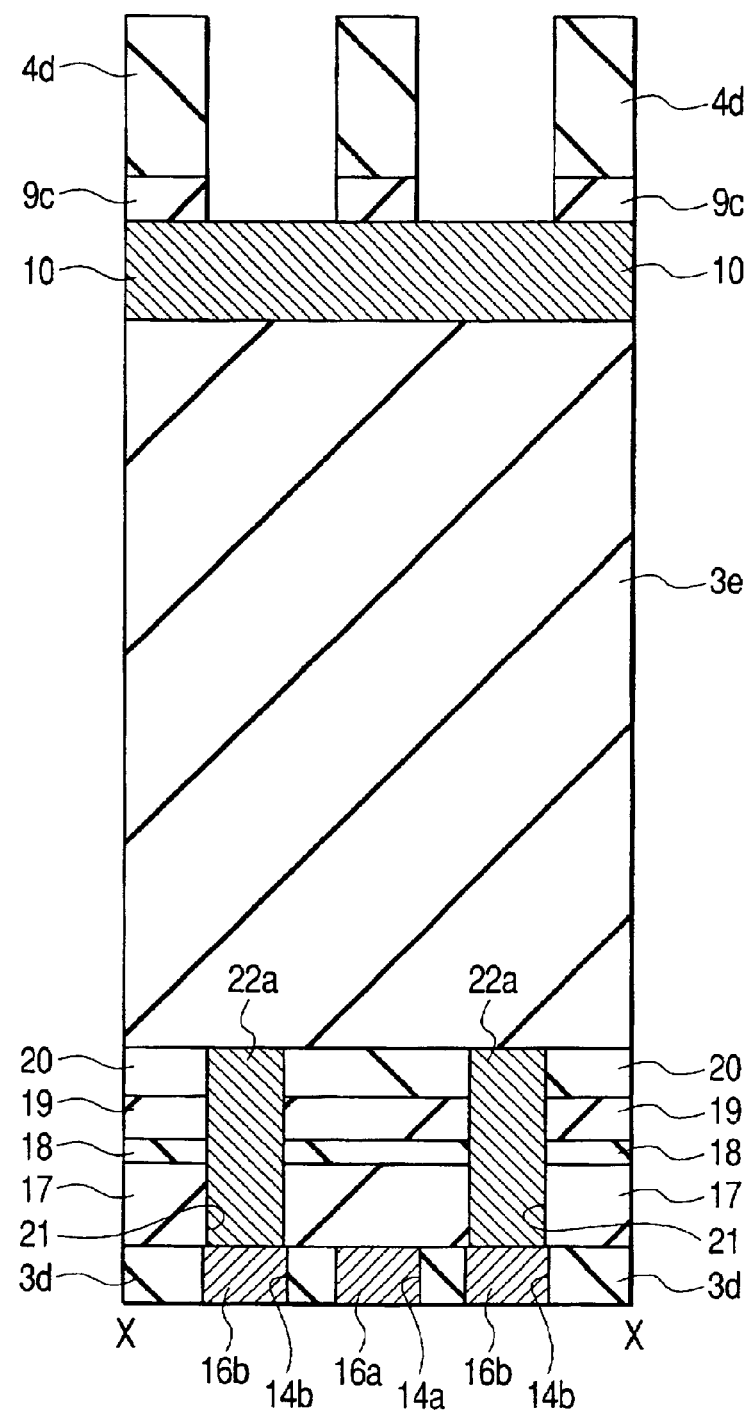
FIG. 34 is a sectional view of the essential part in the fabrication step of the semiconductor integrated circuit device subsequent to FIG. 31.
Figure 35:
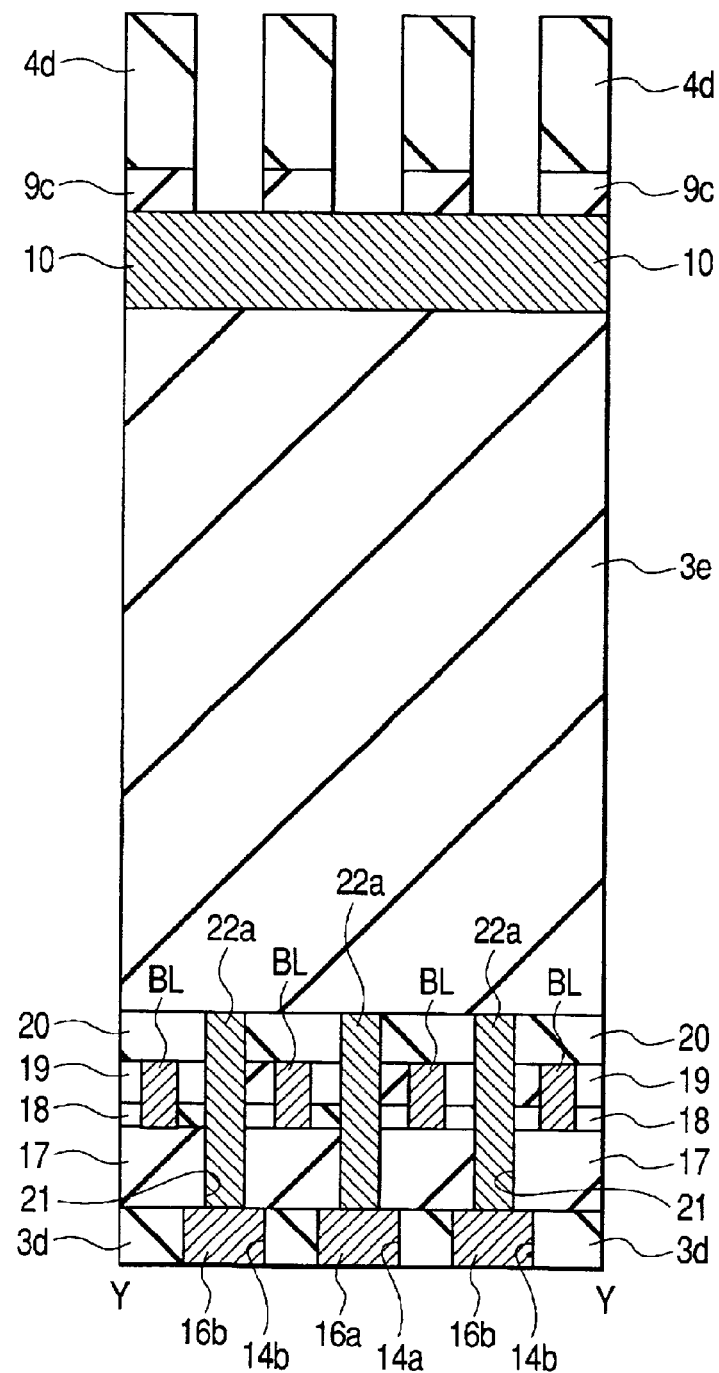
FIG. 35 is a sectional view showing the essential part along a plane vertical to that of FIG. 34 in the fabrication step of the semiconductor integrated circuit device at the same stage as in FIG. 34.

Subsequently, As shown in FIGS. 34, 35, the anti-reflective film 9c is removed by etching through the photoresist film 4d as a mask. The etching conditions are, for example, as follows. The etching device is the same as used for the etching, for example, of the anti-reflective film 9b. The treating pressure, electrode temperature, electrode gap and etching times are, respectively, the same as those used to etch, for example, the antireflective film 9b.

Figure 36:
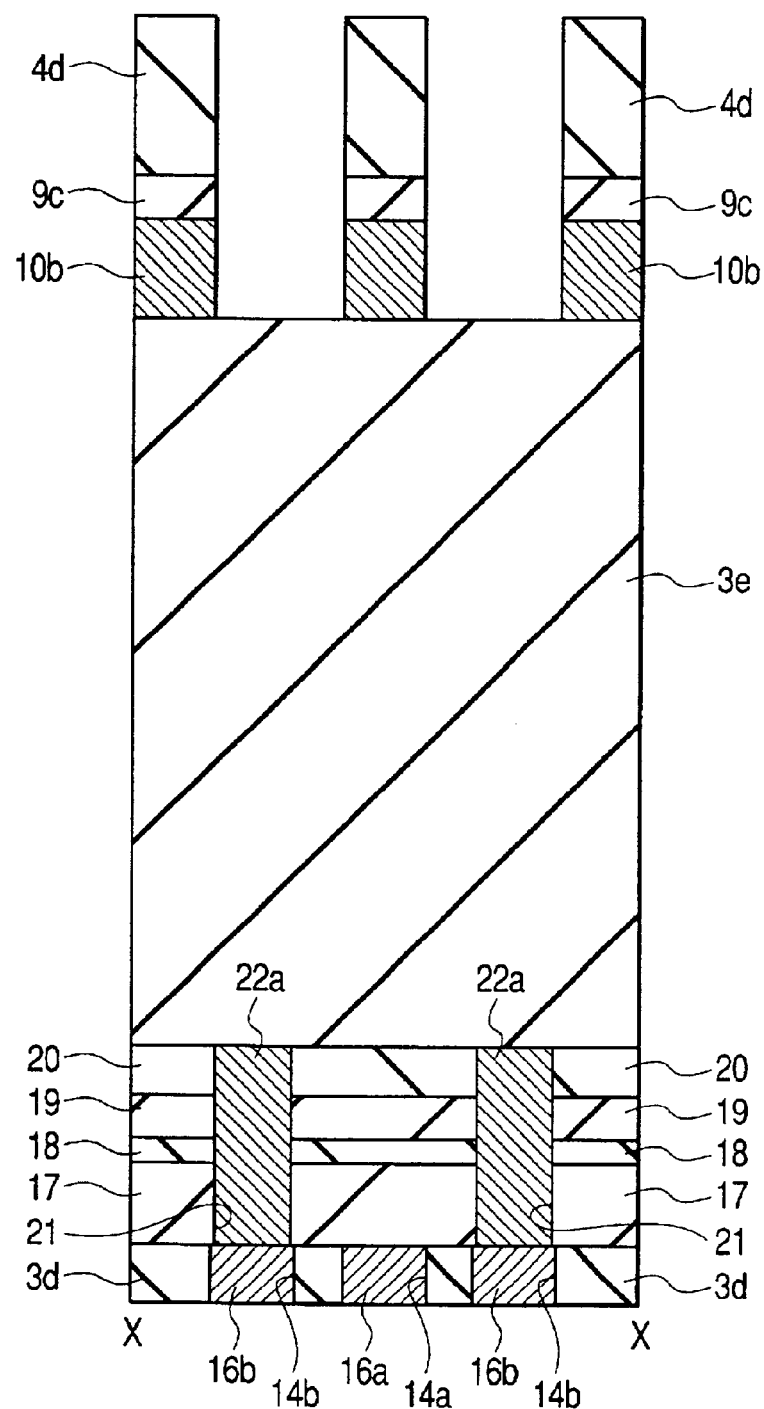
FIG. 36 is a sectional view showing the essential part in the fabrication step of the semiconductor integrated circuit device subsequent to FIG. 34.
Figure 37:
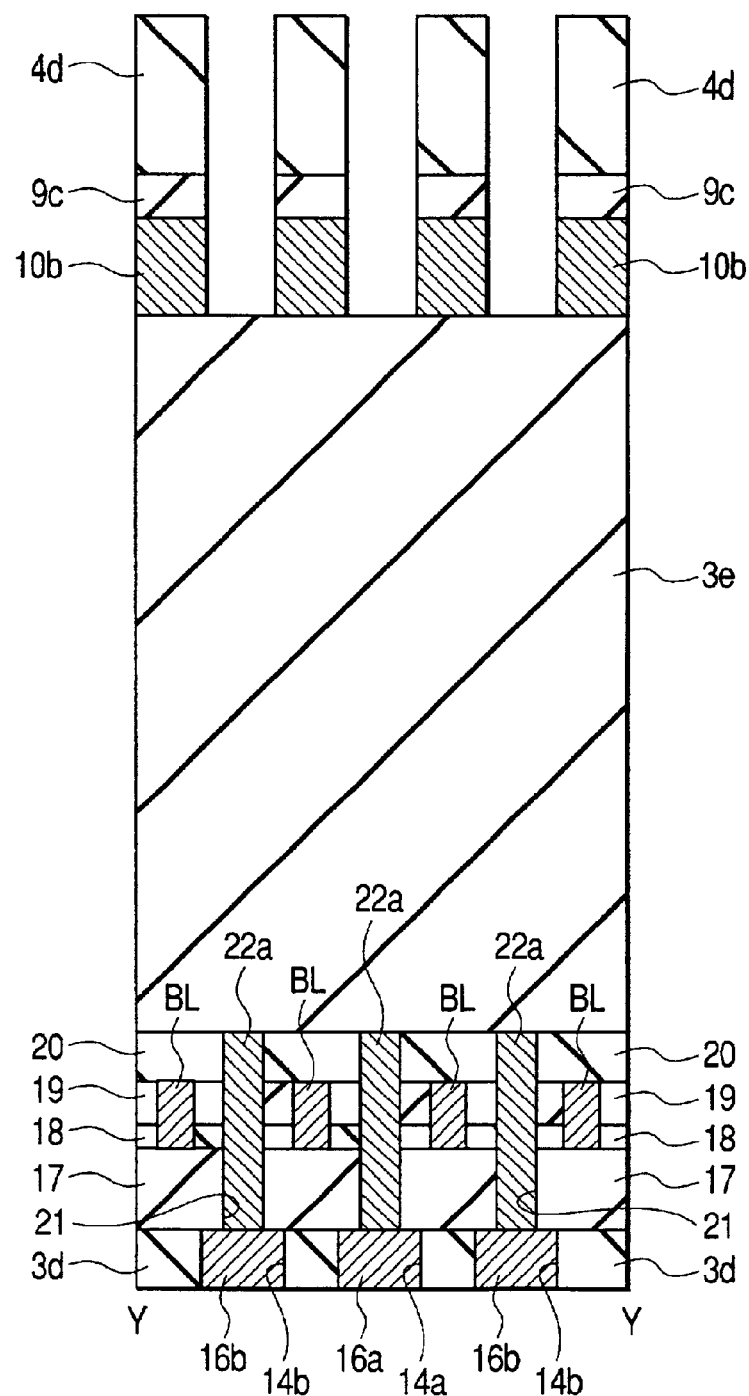
FIG. 37 is a sectional view showing the essential part along a plane vertical to that of FIG. 36 in the fabrication step of the semiconductor integrated circuit device at the same stage as in FIG. 36.

Thereafter, using the photoresist film 4d as an etching mask, the doped polysilicon exposed therefrom is removed by etching to pattern the hard mask 10b in a manner as shown in FIGS. 36, 37.

Figure 38:
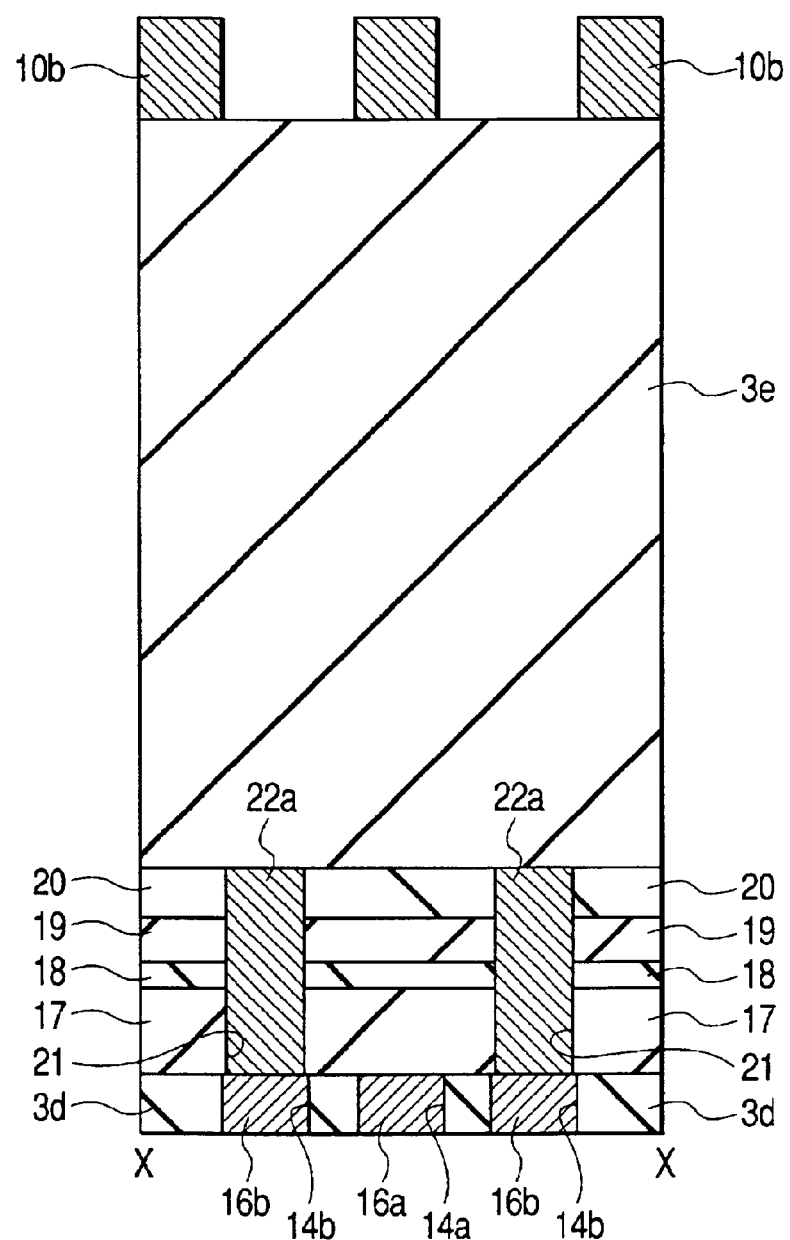
FIG. 38 is a sectional view showing the essential part in the fabrication step of the semiconductor integrated circuit device subsequent to FIG. 36.
Figure 39:
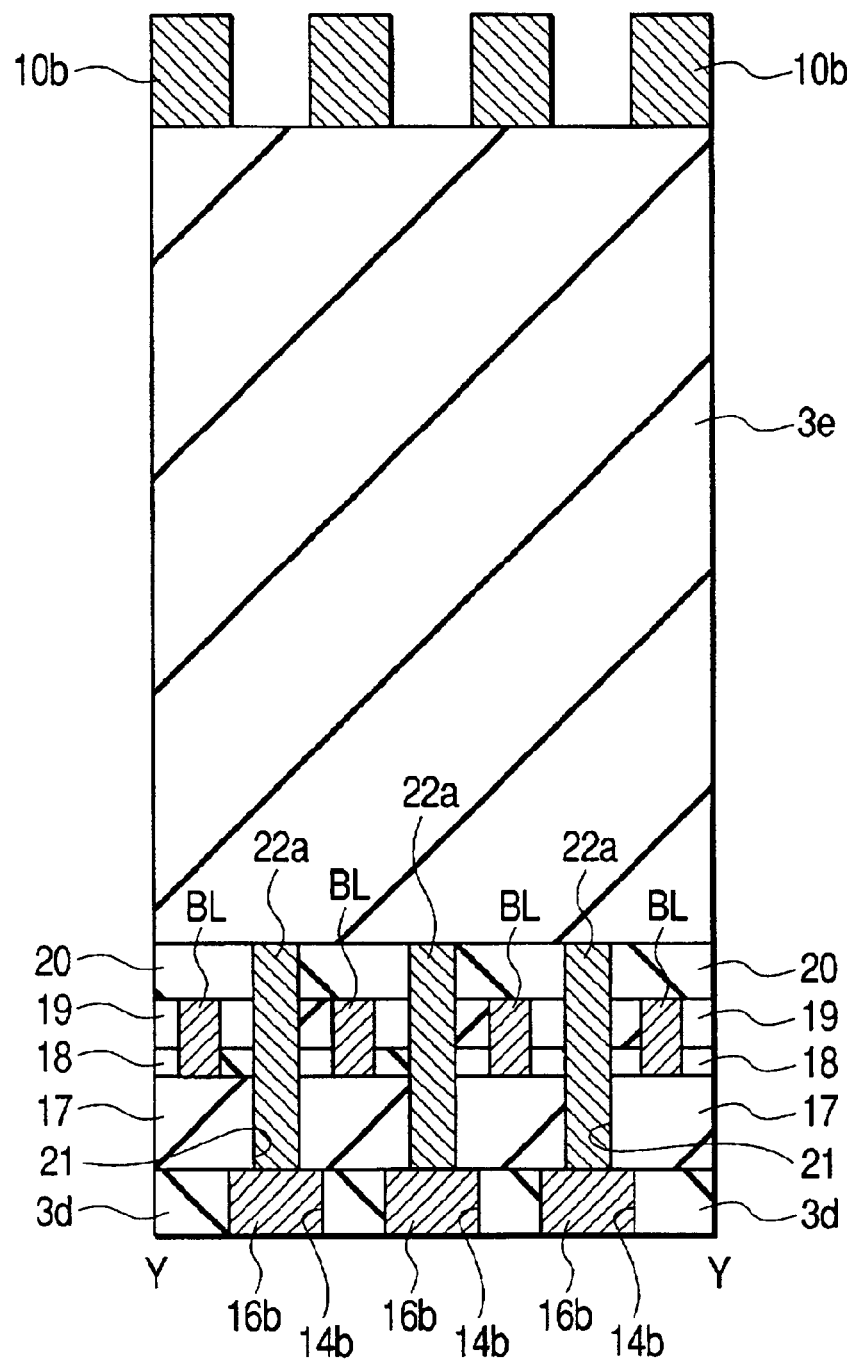
FIG. 39 is a sectional view showing the essential part along a plane vertical to that of FIG. 38 in the fabrication step of the semiconductor integrated circuit device at the same stage as in FIG. 38.
Figure 40:
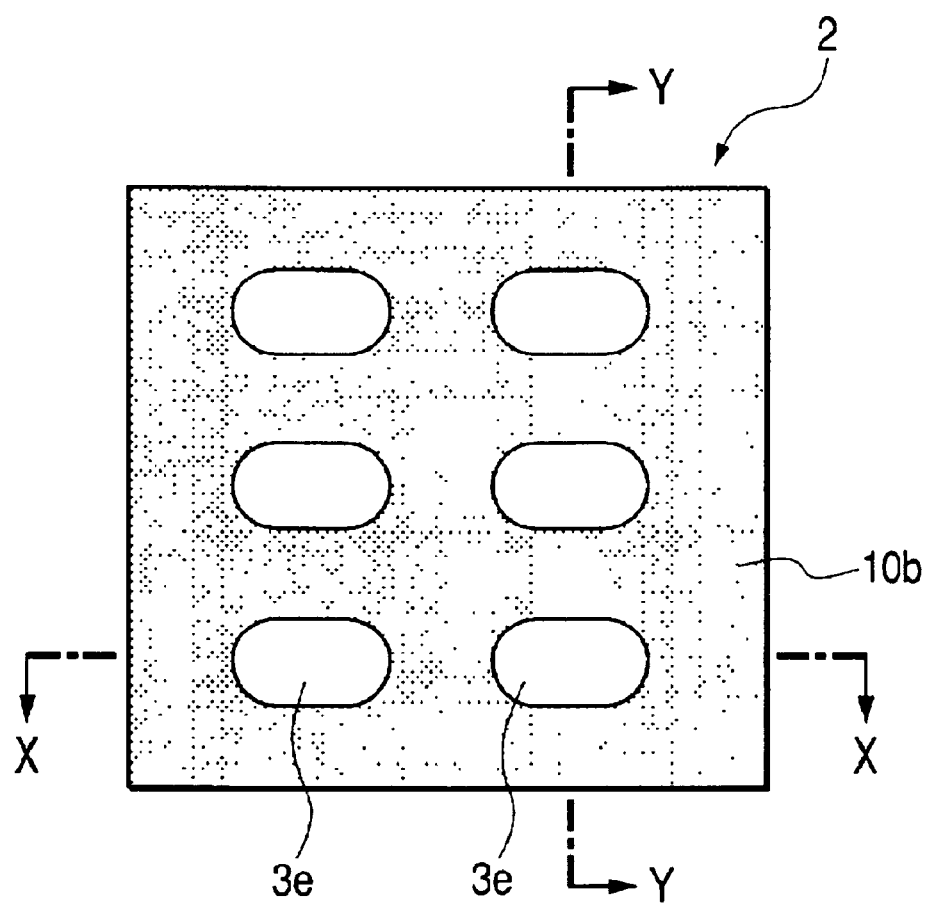
FIG. 40 is a plan view showing the essential part of the semiconductor wafer used in the fabrication step of the semiconductor integrated circuit device of FIGS. 38 and 39.

Next, the photoresist film 4d is removed by ashing treatment as shown in FIGS. 38, 39. FIG. 40 is a plan view showing an essential part of the semiconductor wafer 2 at this stage. In FIG. 40, the hard mask 10b is drawn as hatched in a dot pattern for ease in view. The hard mask 10b is formed regularly with a plurality of openings in the form of a rectangle with rounded corners in plane. The insulating film 3e is exposed from individual openings. A capacitor hole is formed at the portion exposed from the opening.

Figure 41:
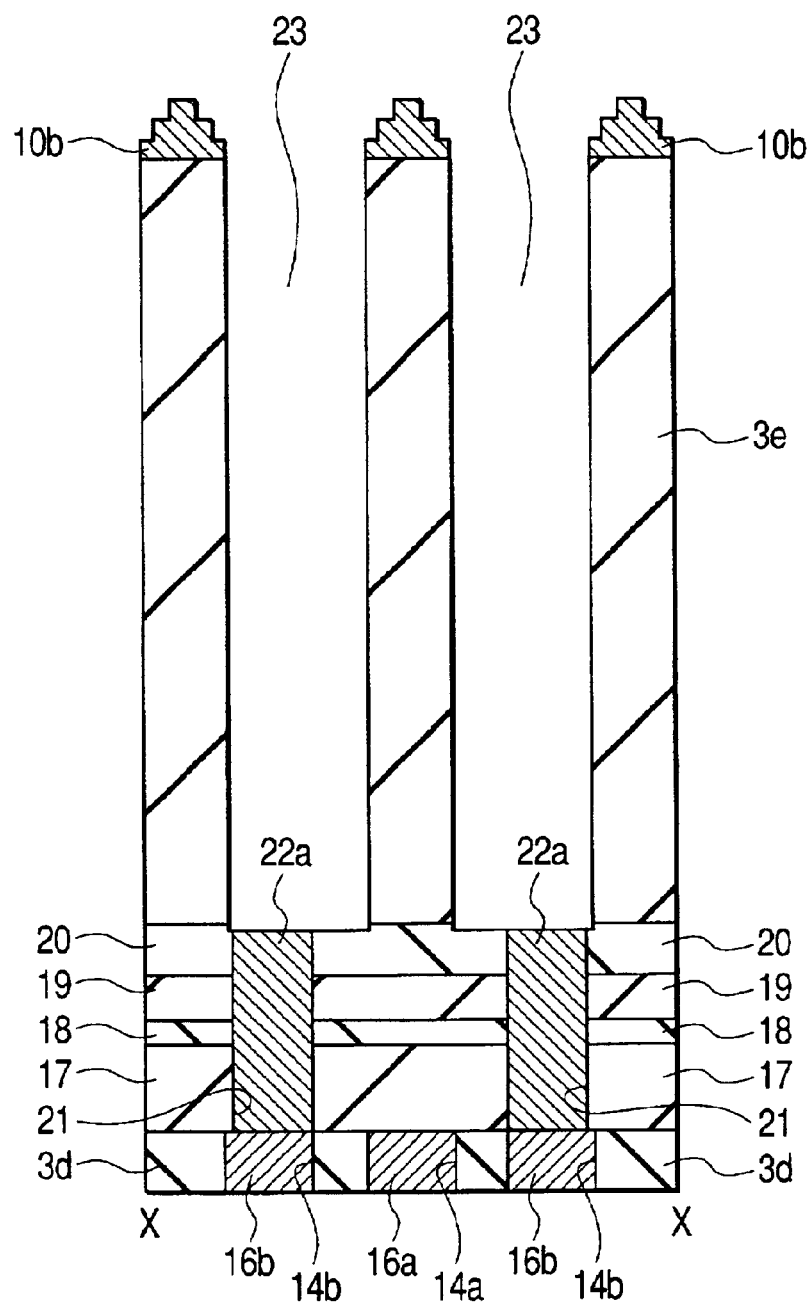
FIG. 41 is a sectional view showing the essential part in the fabrication step of the semiconductor integrated circuit device subsequent to FIG. 38.
Figure 42:
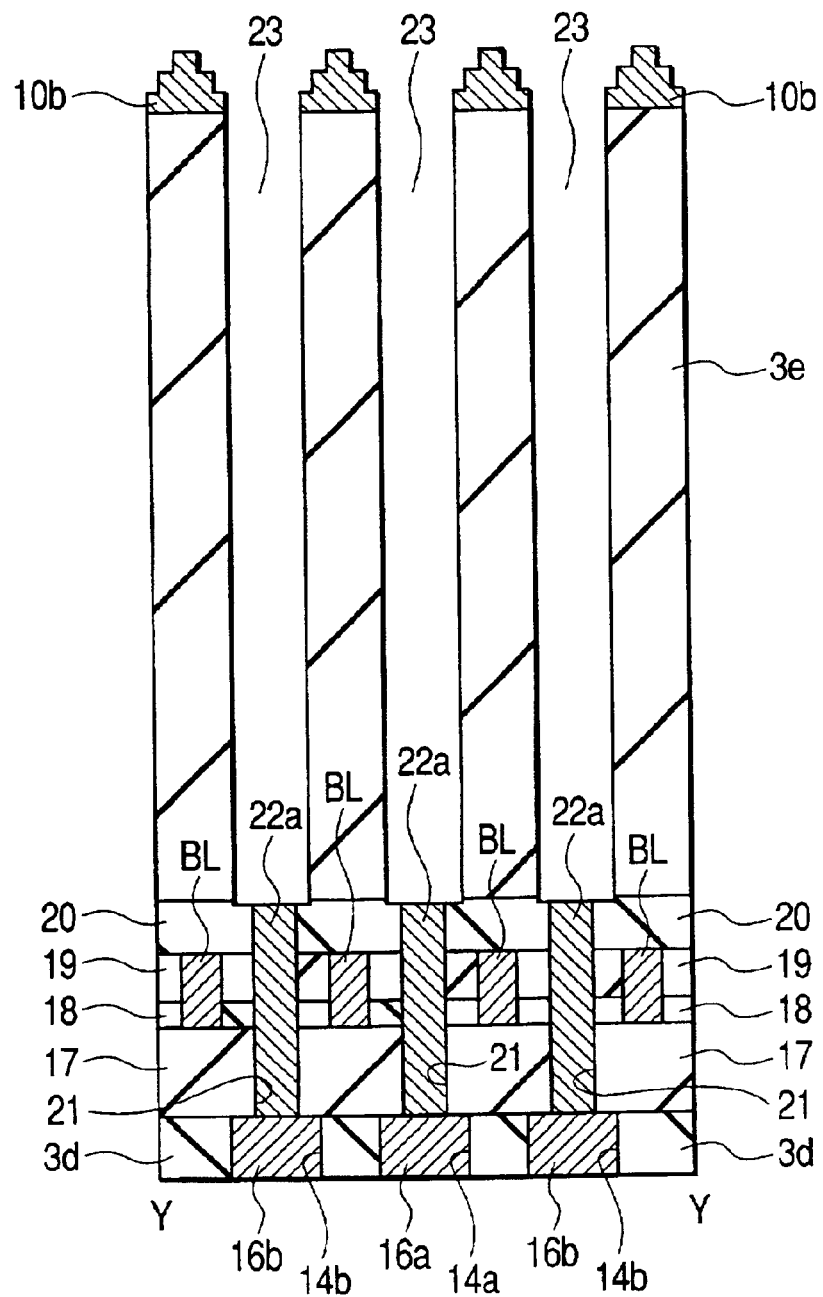
FIG. 42 is a sectional view showing the essential part along a plane vertical to that of FIG. 41 in the fabrication step of the semiconductor integrated circuit device at the same stage as in FIG. 41.
Figure 43:
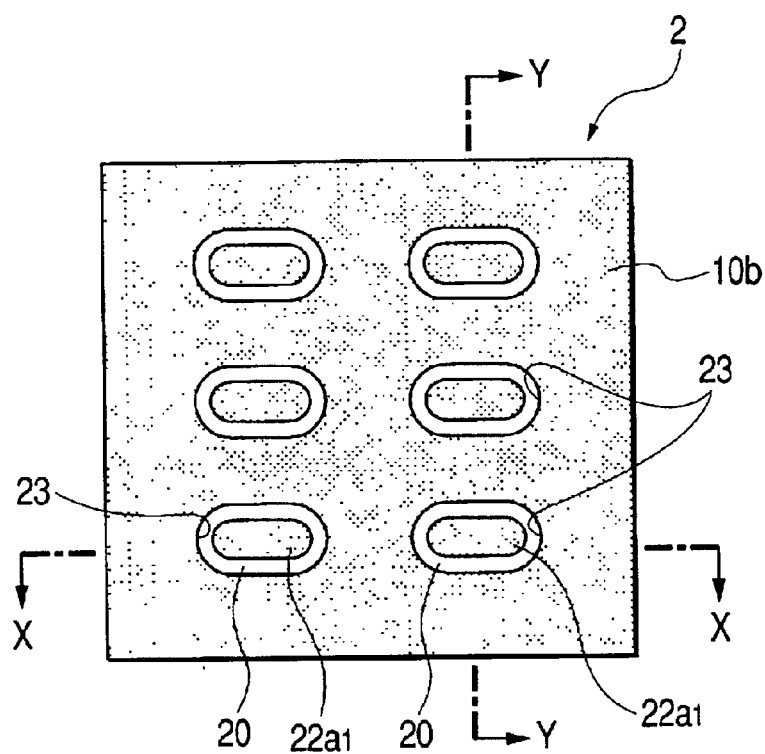
FIG. 43 is a plan view showing the essential part of the semiconductor wafer used in the fabrication step of the semiconductor integrated circuit device of FIGS. 41 and 42.

Using the HARC process of the invention, as shown in FIGS. 41 and 42, the insulating film 3e exposed therefrom is removed by etching using the hard mask 10b as an etching mask. In this way, a capacitor hole 23 is formed. The capacitor hole 23 has an aspect ratio, for example, of 13 (2000 nm in thickness of the insulating film 3e/160 nm in width). The hard mask 10b after the etching treatment is etched or scraped off at the upper portion thereof upon comparison with the case prior to the etching treatment. The hard mask 10b is so scraped off as to be thinner as coming closer to the capacitor hole 23. FIG. 43 is a plan view of an essential part of the semiconductor wafer after this treatment. In FIG. 43, the hard mask 10b is drawn as hatched in a thick dot pattern for convenience's sake. The upper portion of the plug 22 and the insulating film 20 are, respectively, exposed from the bottom of the capacitor hole 23.

The etching conditions in the HARC process are, for example, those shown below. The etching device used was the two-frequency excitation RIE device 1 shown in FIG. 15. The treating pressure within the chamber in the course of the etching treatment is, for example, at approximately 2.66 Pa, the high frequency power is, for example, at upper electrode/lower electrode=approximately 1800/1500 W, the flow rates of the etching gases are, for example, at $C_5H_8$/$O_2$/Ar=24/28/700 cm$^3$/minute, the electrode temperature is, for example, at upper electrode/lower electrode=60/20° C., and the electrode gap is, for example, at approximately 19 mm. The etching time is such that carbon nitride (CN) is observed from light emitted from a plasma and a first transition of a waveform in the course of exposure of the insulating film 20 made, for example, of underlying silicon nitride or the like is taken as a time just upon completion of etching of the silicon oxide film (insulating film 3e), under which an overetching treatment was carried out to an extent of 30%.

In this case, the residence time within a plasma is, for example, at approximately 2.34 ms, and a residence time within a chamber is, for example, at approximately 157.63 ms. The partial pressure of $C_5F_8$ is, for example, at 0.09 Pa. The ratio of the gas flow rates ($O_2$/$C_5F_8$) is, for example, at 1.167. The value of ($C_5F_8$+$O_2$)/Ar is, for example, at 0.0743. The plasma density is, for example, at a first part of $5 \times 10^{11}$/cm$^3$.

The reason why the high frequency power under the above HARC process conditions is higher than that of the SAC process is that the aspect ratio is higher than in the SAC process, so that a higher plasma density is needed in order to appropriately carry out etching treatment even in the bottom of a deep hole. In addition, the reason why the flow rates of $C_5F_8$/$O_2$ are higher than in the case of the SAC process is that because the aspect rate is higher than that of the SAC process, an etching gas is well fed to the bottom of a deep hole. Moreover, the shorter electrode gap is to improve the uniformity of etching within the main surface of the semiconductor wafer 2.

Figure 44:
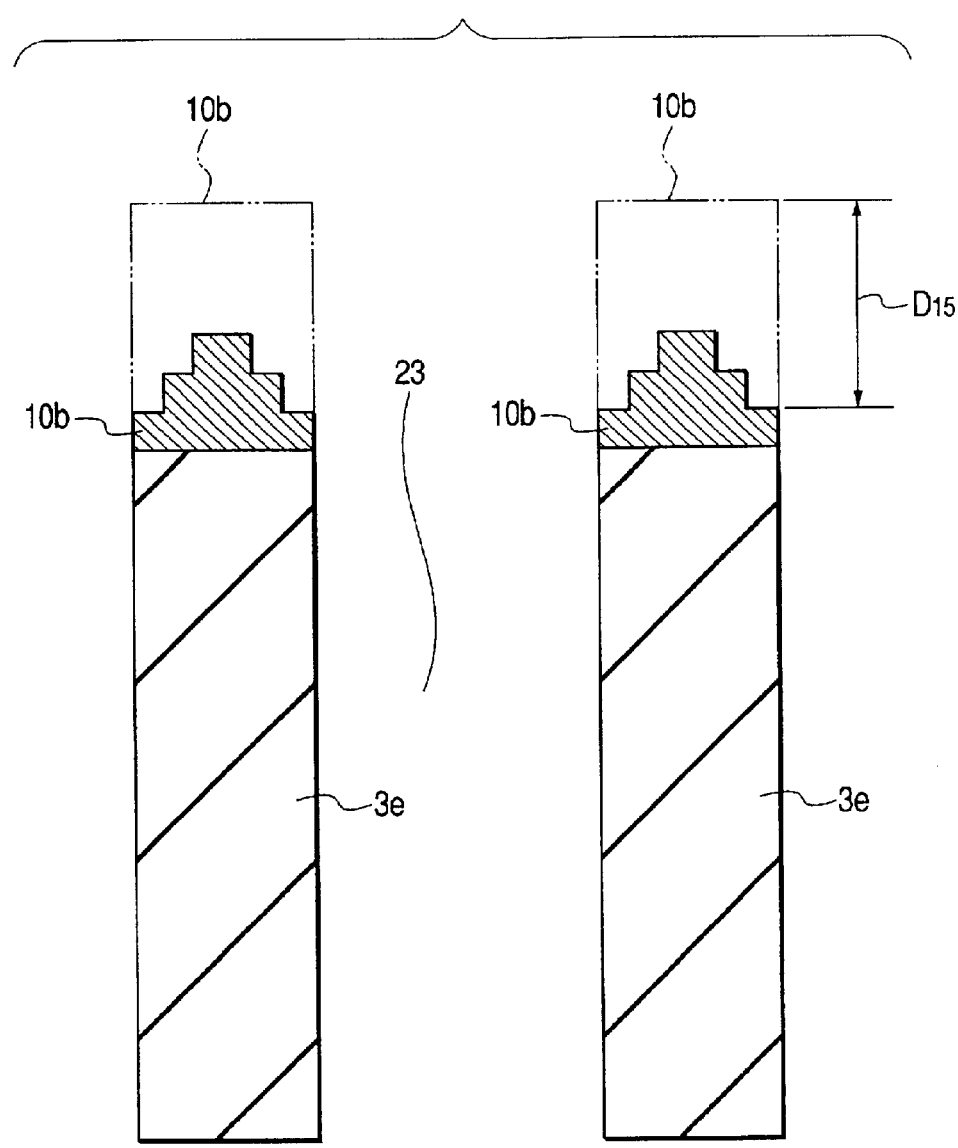
FIG. 44 is an enlarged, sectional view of the essential part in the fabrication step of the semiconductor integrated circuit device of FIG. 41.

After completion of such etching as set out above, a selection ratio of the silicon oxide film to the polysilicon film was calculated. Where etching is effected as shown in FIG. 44, the etching ratio is equal to (etching rate of silicon oxide film (oxide film 3e)/(etching rate at shoulder of polysilicon film (hard mask 10b)). The etching rate at the shoulder of the polysilicon film (hard mask 10b) is calculated based on the dimension D15 at a portion where the degree of etching off is in maximum as shown in FIG. 44. As a result, a capacitor hole 23 having an aspect ratio of 13 is made at a taper angle of 89°, in which while the selection ratio in a comparative example is at 8, the selection ratio of this embodiment is at 11. From these results, it has been found that when the etching gases are fed at a large flow rate, the selection ratio can be improved while keeping a good ease-in-etching property. Thus, the yield and reliability of DRAM can be improved. In addition, the scale down of the capacitor hole 23 and the high degree of integration accompanied can be promoted, thus leading to an improvement in performance of DRAM.

Figure 45:
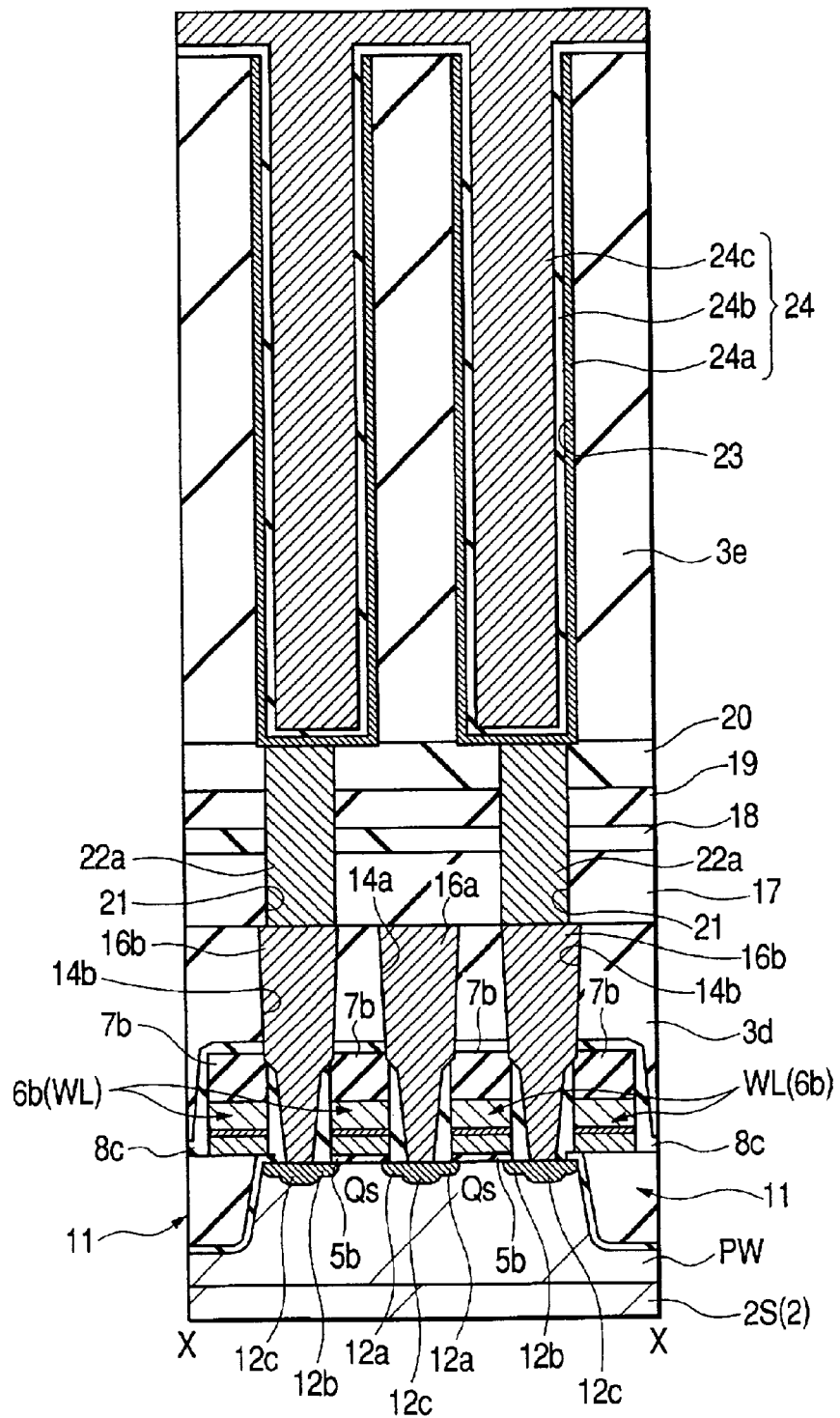
FIG. 45 is a sectional view showing the essential part in the fabrication step of the semiconductor integrated circuit device subsequent to FIG. 41.
Figure 46:
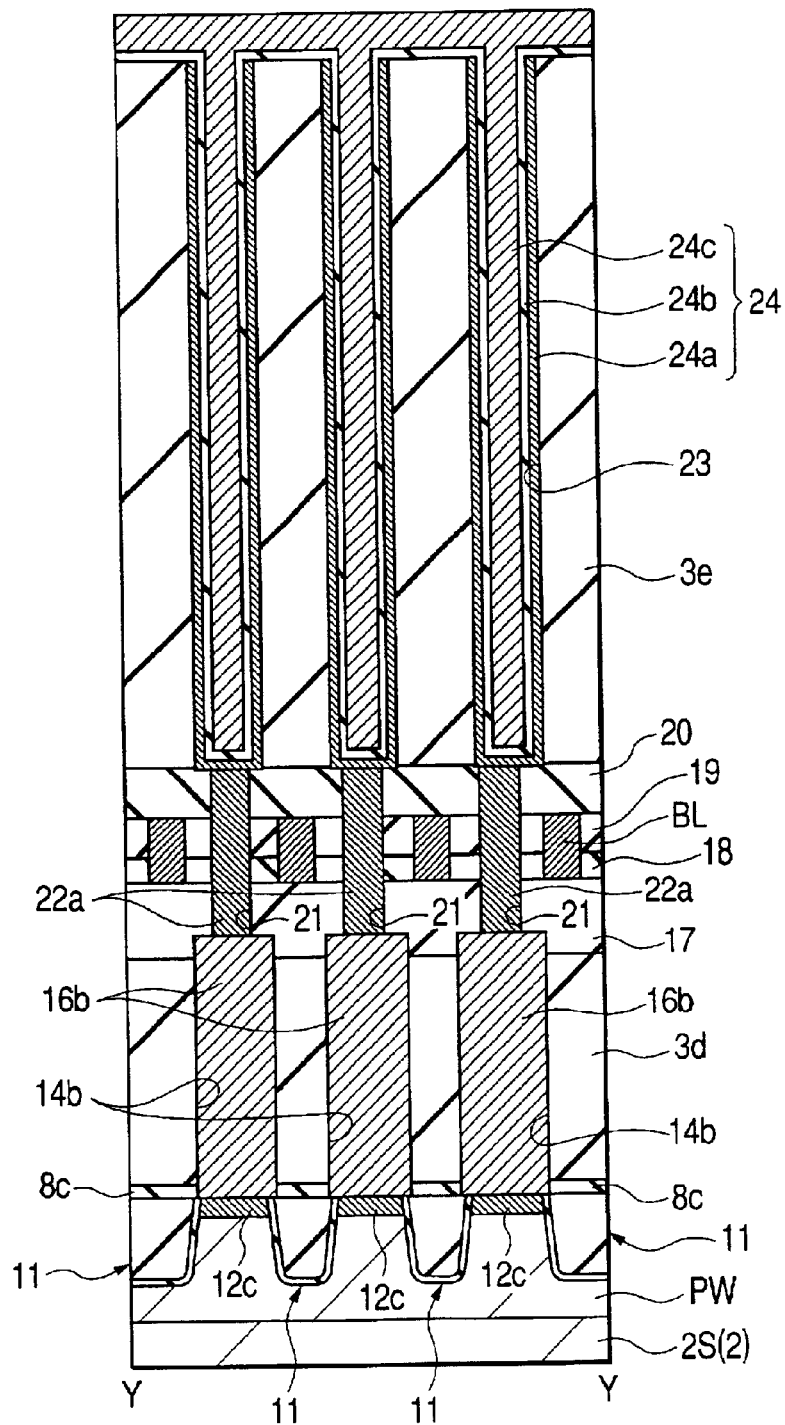
FIG. 46 is a sectional view showing the essential part along a plane vertical to that of FIG. 45 in the fabrication step of the semiconductor integrated circuit device at the same stage as in FIG. 45.

FIGS. 45 and 46 are, respectively, a sectional view showing a capacitor element 24 for information storage formed in the capacitor hole 23. The capacitor element 24 for information storage has a lower electrode 24a, a capacitor insulating film 24b formed on the surface thereof, and a plate electrode 24c. The lower electrode 24a is made, for example, of a doped polysilicon film and is electrically connected to one of the n-type semiconductor regions 12b and the n$^+$-type semiconductor region 12c of memory cell selection MISQs via the plugs 22a, 16b. The capacitor insulating film 24b is made, for example, a silicon nitride film, a composite film of a silicon nitride film and a silicon oxide film or a tantalum oxide (TaO$_5$) film or the like. The plate electrode 24c is made of a metal film such as of titanium nitride or the like.

It will be noted that the various etching conditions of the SAC and HARC processes set forth in the embodiment of the invention are an instance of a combination of the best conditions conducted by us. The various conditions are mutually in close relation with one another such that when one condition is changed, another may change, and should not be construed as limiting etching conditions to those specific ones. Various alterations or changes may be possible.

The results of the investigation made by us on the etching conditions in the SAC and HARC processes are now described. Initially, the residence time is described. The residence time within a plasma is, for example, at approximately 1 to 10 ms (and a residence time within a chamber is, for example, at approximately 50 to 700 ms). The residence time within a plasma is preferably within a range of approximately 1 to 5 ms (corresponding to a residence time within a chamber of approximately 50 to 350 ms), more preferably from 2 to 4 ms (corresponding to a residence time within a chamber of approximately 100 to 200 ms).

Next, the pressure during the etching is described. In the course of the etching treatment, the mean free paths of an ion, an electron and a gas atom (i.e. a movable distance from one collision with other atom to next collision) changes depending on the treating pressure. A greater number of collisions results in a more random orbit. When a contact hole having a high aspect ratio is processed, it is required that ions be incident vertically against the main surface of a semiconductor wafer. To this end, it is necessary that a mean free path of an ion be long without scattering caused by collision, and thus it is desirable to treat at low pressure. However, if the pressure is too low, electrons are liable to diffuse owing to the reduced number of collisions and are escaped from a plasma, resulting in a low electron density (plasma density). This makes it difficult to maintain the plasma, with the attendant problem that the dissociation of gas molecules is reduced and the number of ions, which supply an energy required for the progress of etching, is reduced, thus lowering the etching rate of the oxide film. Further, the mean free path of ions prolongs, so that an energy of the ion becomes too high, thus leading to the lowering in selection ratio with an etching mask (mainly, a photoresist film) or a silicon nitride film. On the other hand, when a pressure is too high, the incident direction of ions becomes non-uniform as stated hereinbefore, so that the ion cannot reaches the bottom of a contact hole having a high aspect ratio and an energy cannot be supplied, thereby permitting the etching to be stopped or a processing profile to be worsened. From the above, in order to realize such a residence times as defined above, the treating pressure during the course of the etching is, for example, at approximately 0.7 to 7 Pa, preferably 1.3 to 4 Pa.

Next, the gas flow rate is described. Depending on the amount of a dilution gas, the dissociation of gas molecules and the residence time of an etchant and a reaction product produced through the dissociation in a plasma are controlled. If the flow rate of an argon gas is too small, the residence time is too prolonged, so that excessive dissociation and formation of an etchant ($C_xF_y$) in excess take place, and thus, an excess deposit is formed on the oxide film, so that etching is unlikely to proceed. The etching may be stopped in some case. On the other hand, where the argon gas is fed in excess, the residence time becomes short, thus leading to insufficient dissociation and the shortage in feed of an etchant. The etching rate is lowered on the oxide film due to the shortage in the feed and the etching rate increases on the silicon nitride film due to the shortage in amount of a deposit (i.e. selectivity is impeded). From the foregoing, in order to realize such a residence time as defined above, the flow rate of an argon gas (dilution gas) is in the range, for example, of 200 to 1000 cm³/minute, preferably from 400 to 800 cm³/minute. When it is said that an etching gas is used at a great flow rate, most of the etching gas used in a great flow rate is made of a dilution gas (e.g. an argon gas), under which the great flow rate may be expressed in terms of a flow rate of a dilution gas in the etching gas.

Next, the partial pressure of $C_5F_8$ is described. If the partial pressure of $C_5F_8$ is too low, the amount of formation of $C_xF_y$ (mainly, $CF_2$) by dissociation of $C_5F_8$ is insufficient. As in region I shown in the reaction model (see FIG. 11(a)), the feed of an etchant on the oxide film ($SiO_2$) 3 is in shortage with a low etching rate, and the etching rate becomes high on the silicon nitride film owing to the thin volumetric film. Eventually, the silicon nitride selection ratio lowers. On the other hand, when the partial pressure of $C_5F_8$ is too high, $C_xF_y$, formed by dissociation of $C_5F_8$ is in excess, so that a thick deposit film is formed on the oxide film 3 as in region III of the reaction model (see FIG. 11(c)), disabling ions to be transmitted with the lowering of an etching rate. As a consequence, the silicon nitride selection ratio lowers. Taking the above into consideration, the partial pressure of $C_5F_8$ is, for example, at approximately 0.02 to 0.2 Pa (which is within a preferred range for the SAC process), more preferably 0.04 to 0.1 Pa, and most preferably from 0.04 to 0.08 Pa.

Reference is now made to the ratio of gas flow rates ($O_2/C_5F_8$). Oxygen ($O_2$) in an etching gas has the function of suppressing the formation of a deposited film on the surface of a film to be formed. Thus, oxygen contributes to improving the ease-in-etching property of the oxide film and the realization of verticality in the hole. Nevertheless, oxygen is able to remove a deposit film suppressing etching on the silicon nitride film, resulting in the lowering of the silicon nitride film selection ratio. If the gas flow rate ratio is too small (i.e. a flow rate of $O_2$ being relatively small), the effect of suppressing the formation of a deposit film is reduced, so that a thick deposit film is formed even on the oxide film, not permitting etching to proceed. Moreover, because the removal of a deposit film from side walls of the hole becomes difficult, the resultant hole profile degrades. On the other hand, where the ratio of the gas flow rates is too great, the deposit film on the silicon nitride film becomes thin, and the etching of the silicon nitride film proceeds. As a result, the selection ratio to the silicon nitride lowers. From the above, the flow rate ratio ($O_2/C_5F_8$) is, for example, at 0.5 to 2, preferably 0.8 to 1.5 (i.e. the range in both the SAC process and the HARC process), more preferably 1 to 1.2, although depending on other conditions.

The plasma density is described. If the plasma density is too low, the amount of a formed etchant ($C_xF_y$) by dissociation of the etching gas is in shortage, and the feed of an energy required for the reaction between the etchant and a film to be etched (oxide film ($SiO_2$)) is in shortage. As a result, the etching rate of the film to be etched (oxide film ($SiO_2$)) lowers, thereby permitting the etching to be stopped. On the other hand, if the plasma density is too high, the etching gas is dissociated in excess, so that a deposit film on the film to be etched (oxide film ($SiO_2$)) is formed as thickened, not permitting the etching to proceed.

For the formation of an etchant by dissociation of an etching gas, it is necessary to form molecules combining carbon (C) and fluorine (F) such as $C_xX_x$. If the dissociation proceeds excessively, separation into carbon and fluorine simple elements takes place. With the simple elements, etching of the oxide film ($SiO_2$) does not proceed. More particularly,

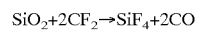

$$SiO_2 + 2CF_2 \rightarrow SiF_4 + 2CO$$

In view of the above, the plasma density is generally in the range of approximately $10^{10}$ to $10^{13}/cm^3$, preferably approximately $10^{10}$ to $10^{12}/cm^3$, more preferably approximately $5 \times 10^{10}$ to $5 \times 10^{11}/cm^3$.

Next, the electrode gap of the etching device is described. The electrode gap has the function of controlling the plasma density. For instance, when the electrode gap is 40 mm or over, the plasma density and the uniformity of a plasma lower, respectively. Taking the plasma density into consideration, the electrode gasp, for example, of 17 to 30 mm is preferred from the standpoint of the plasma density and the uniformity.

The temperature of the semiconductor wafer 2 in the course of etching treatment is described. A high temperature of the semiconductor wafer 2 results in a lower probability of adsorption of $C_xF_y$ formed by dissociation of $C_5F_8$, and the $C_xF_y$ is not adsorbed at an upper portion of a hole but transferred to the bottom of the hole. In the SAC process, a deposit film on the silicon nitride film (insualting film 8c) at the bottom of the hole (contact holes 14a, 14b) becomes thickened, so that etching of the silicon nitride film is very unlikely to proceed, resulting in the improved selection ratio. On the other hand, as the temperature of the semiconductor wafer 2 increases, the feed of $C_xF_y$ serving as a deposit film increases on the oxide film ($SiO_2$) at the bottom of the hole. Thus, when the temperature of semiconductor wafer 2 is too high, the deposit film on the oxide film ($SiO_2$) is too thickened, bringing about the lowering of the etching rate and the lowering of the silicon nitride selection ratio, with the worst case where etching is stopped. Too high a temperature of the semiconductor wafer 2 has the possibility of melting the photoresist, under which the pattern of the photoresist film deforms, with the attendant disadvantage that the photoresist is burnt in. In contrast, when the temperature of the semiconductor wafer is too low, the silicon nitride selection ratio lowers.

Taking the foregoing into consideration, the temperature of the semiconductor wafer during the etching treatment is, for example, at 30 to 180° C., preferably 60 to 140° C., more preferably 100 to 130° C.

Next, the etching gas is described. A fluorocarbon gas may be classified into a saturation type and an unsaturation type. The saturation type is one wherein all of the carbon (C) atoms have a single bond, respectively, and examples of such an etching gas include $CF_4$, $CHF_3$, $CH_2F_2$, $CH_3F$, $C_2F_6$, $C_3F_8$, and $C_4F_8$. The unsaturation type is one which contain carbon (C) atoms having a double or triple bond. Examples of the etching gas of this type include $C_5F_8$ or $C_4F_6$.

Why $C_5F_8$ is adopted as a main reaction gas in this embodiment is for the following reason. A larger number of carbon atoms results in better deposition of a deposit ($C_xF_y$), so that the silicon nitride selection ratio can be improved. In addition, the silicon nitride selection ratio and the vertical profile of a hole (protecting property of the side walls of the hole can be improved by the deposited film ($C_xF_y$)), with well balanced etching reaction and deposition reaction. Since the protecting property of the photoresist film by deposition of the deposit film ($C_xF_y$) is attached, the processing profile and dimension of the hole can be improved. Moreover, the $C_5F_8$ gas has a very low globe warming potential (GWP=90 to 100) with a life in air of one year in comparison with $CF_4$ (GWP=6500 with a life of 50000 years) and $C_4F_8$ (GWP=870 with a life of 3200 years). In addition, this gas is of no problem with respect to flammability, explosiveness, toxicity. Aside from the single use of $C_5F_8$, $CF_4$, $CHF_3$, $CH_2F_2$ or $C_4H_8$ may be added. More particularly, the use of a gas containing fluorine (F) enables one to remove the deposit ($C_xF_y$) and to suppress the deposition.

The dilution gas has the function of not only promoting the reaction between an etchant and a film to be etched after the formation of ions through dissociation in a plasma, but also diluting a reaction gas in an etching gas thereby not permitting excessive etching and a deposition reaction. The reason why an argon gas is used as the dilution gas is that this gas is so inert as not to produce a reaction product through chemical reaction with other type of gas. The reaction may be appropriately controlled by addition of a helium gas or the like to the argon gas. An inert gas such as a helium gas or the like may be replaced by argon gas.

According to the embodiment of the invention, the following effects are obtained.
(1) An oxide film is etched in a region where a residence time is short while establishing conditions of a low pressure and a great flow rate of an argon gas (>800 $cm^3$/minute), so that a good ease-in-etching property (e.g. a micro loading effect of 98%), a shard angle of taper (e.g. 89°) and a high silicon nitride selection ratio can be simultaneously realized.
(2) In the SAC process, when the temperature of the semiconductor wafer 2 being etched is raised under such etching conditions as mentioned above, a good ease-in-etching property of the aspect ratio (e.g. 13) and a high silicon nitride selection ratio (e.g. 16.1) can be realized.
(3) According to (2) above, the short-circuiting margin can be extended in the SAC process.
(4) IN the HARC process, when the high frequency power, the electrode gap, the flow rate of $C_5F_8$ gas and the temperature of a semiconductor wafer are optimized under such etching conditions as mentioned above, an opening having an aspect ratio, for example, of 17 and a good doped polysilicon selection ratio (e.g. at 11), and a sharp angle of taper (e.g. at 89°) can be realized.
(5) According to (1), (2), (3) or (4), the yield of DRAM can be improved.
(6) According to (1), (2), (3) or (4), the reliability of DRAM can be improved.
(7) According to (1), (2), (3) or (4), the mass productivity of DRAM can be improved.
(8) According to (1), (2), (3) or (4), the performance of DRAM can be improved.
(9) According to (1), (2), (3) or (4), the capacitance of DRAM can be improved.

The invention has been particularly described based on the embodiments, which should not be construed as limiting the invention thereto. Many variations and modifications may be possible without departing from the spirit of the invention.

In the foregoing, the invention has been illustrated with respect to the application to DRAM that is the art of background of the invention. The invention is not limited to such application to DRAM, but is applicable, for example, to a fabrication method of a semiconductor integrated circuit device having a memory circuit such as SRAM (static random access memory), flush memory (EEPROM: electric erasable programmable read only memory) and the like, a fabrication method of a semiconductor integrated circuit device having a memory circuit such as CMIS (complementary MIS: complementary field effect transistor) circuit, a fabrication method of a semiconductor integrated circuit device having a logic circuit such as a micro processor, or a fabrication method of a semiconductor integrated circuit device of a hybrid type where a memory circuit and a logic circuit are mounted on the same semiconductor substrate.

The effects of typical embodiments of the invention are briefly described below.
(1) According to one embodiment of the invention, an etching gas containing a fluorocarbon gas, oxygen and a dilution gas is used for plasma etching of a semiconductor substrate wherein when an insulating film based on silicon oxide is processed on the semiconductor substrate, a residence time of the etching gas within an etching chamber is set within a range where selectivity to an insulating film based on silicon nitride is improved by using conditions of a low pressure and a large flow rate of the etching gas. This entails improved ease-in-etching property of the silicon oxide insulating film and selectivity to the nitride film.
(2) According to another embodiment of the invention, an etching gas containing a fluorocarbon gas, oxygen and a dilution gas is used for plasma etching of a semiconductor substrate wherein when a silicon oxide insulating film on the semiconductor substrate is processed using a hard mask as an etching mask formed on the silicon oxide insulating film, a residence time of the etching gas within an etching chamber is set within a range where selectivity to the hard mask is improved by using conditions of a low pressure and a large flow rate of the etching gas. This entails improved ease-in-etching property of the silicon oxide insulating film and selectivity to the nitride film.

What is claimed is:

1. A fabrication method of a semiconductor integrated circuit device, comprising the steps of:
   (a) depositing a silicon oxide insulating film over a patterned silicon nitride film with a doped polycrystalline silicon plug over a semiconductor substrate;
   (b) forming a hard mask over said silicon oxide insulating film; and
   (c) subjecting said semiconductor substrate to a plasma etching treatment through the hard mask as an etching mask using an etching gas containing a fluorocarbon gas, oxygen and a dilution gas to process said silicon oxide insulating film, so as to form a hole in said silicon oxide insulating film down to the patterned silicon nitride film in such a manner that an upper surface of the doped polycrystalline silicon plug is exposed,
   wherein a residence time of the etching gas within an etching chamber is set at 50 to 700 ms.

2. A method according to claim 1, wherein a pressure within the chamber during the plasma etching ranges from 0.7 to 7 Pa.

3. A method according to claim 1, wherein a total flow rate of the etching gas passed into the etching chamber ranges from 200 to 1000 cm$^3$/minute.

4. A method according to claim 1, wherein a total flow rate of the etching gas passed into the etching chamber is at 700 cm$^3$/minute or over.

5. A method according to claim 1, wherein a pressure within the etching chamber during the plasma etching ranges from 1.3 to 4 Pa, and the total flow rate of the etching gas passing into the etching chamber is at 700 cm$^3$/minute or over.

6. A method according to claim 1, wherein a flow rate of said dilution gas is larger than the flow rates of said fluorocarbon gas and oxygen.

7. A method according to claim 1, wherein a plasma density during the plasma etching ranges from $1 \times 10^{10}$ to $1 \times 10^{13}$/cm$^3$.

8. A method according to claim 1, wherein a plasma density during the plasma etching ranges from $1 \times 10^{10}$ to $1 \times 10^{12}$/cm$^3$.

9. A method according to claim 1, wherein said fluorocarbon gas is made of $C_5F_8$, and said dilution gas is made of argon.

10. A method according to claim 9, wherein a flow rate of said argon gas ranges from 200 to 1000 cm$^3$/minute.

11. A method according to claim 9, wherein a flow rate of said argon gas ranges from 400 to 800 cm$^3$/minute.

12. A method according to claim 9, wherein a ratio in flow rate between the oxygen and $C_5F_8$ (oxygen/$C_5F_8$) ranges from 0.8 to 1.5.

13. A method according to claim 9, wherein a ratio in flow rate between the oxygen and $C_5F_8$ (oxygen/$C_5F_8$) ranges from 1 to 1.2.

14. A method according to claim 9, wherein a partial pressure of $C_5F_8$ ranges from 0.02 to 0.2 Pa.

15. A method according to claim 9, wherein a partial pressure of $C_5F_8$ ranges from 0.04 to 0.1 Pa.

16. A fabrication method of a semiconductor integrated circuit device, comprising the steps of:
   (a) depositing a silicon oxide insulating film over a patterned silicon nitride film with a doped polycrystalline silicon plug over a semiconductor substrate;
   (b) forming a hard mask over said silicon oxide film; and
   (c) subjecting the semiconductor substrate to a plasma etching treatment through the hard mask as an etching mask using an etching gas containing a fluorocarbon gas, oxygen and a dilution gas to process said silicon oxide insulating film, so as to form a hole in said silicon oxide insulating film down to the patterned silicon nitride film in such a manner that an upper surface of the doped polycrystalline silicon plug is exposed,
   wherein a residence time of the etching gas within an etching chamber is set at 50 to 350 ms.

17. A fabrication method of a semiconductor integrated circuit device, comprising the steps of:
   (a) depositing a silicon oxide insulating film over a patterned silicon nitride film with a doped polycrystalline silicon plug over a semiconductor substrate;
   (b) forming a hard mask over said silicon oxide film; and
   (c) subjecting the semiconductor substrate to a plasma etching treatment through the hard mask as an etching mask using an etching gas containing a fluorocarbon gas, oxygen and a dilution gas to process said silicon oxide insulating film, so as to form a hole in said silicon oxide insulating film down to the patterned silicon nitride film in such a manner that an upper surface of the doped polycrystalline silicon plug is exposed,
   wherein a residence time of the etching gas within an etching chamber is set at 100 to 200 ms.

18. A fabrication method of a semiconductor integrated circuit device, comprising the steps of:
   (a) depositing a silicon oxide insulating film over a patterned silicon nitride film with a doped polycrystalline silicon plug over a semiconductor substrate;
   (b) forming a hard mask over said silicon oxide film: and
   (c) subjecting the semiconductor substrate to a plasma etching treatment through the hard mask as an etching mask using an etching gas containing a fluorocarbon gas, oxygen and a dilution gas to process said silicon oxide insulating film, so as to form a hole in said silicon oxide insulating film down to the patterned silicon nitride film in such a manner that an upper surface of the doped polycrystalline silicon plug is exposed,
   wherein a pressure within the etching chamber during the plasma etching ranges from 0.7 to 7 Pa and a total flow rate of the etching gas passed into the etching chamber is 700 cm$^3$/minute or over.

19. A fabrication method of a semiconductor integrated circuit device, comprising the steps of:
   (a) depositing a silicon oxide insulating film over a patterned silicon nitride film with a doped polycrystalline silicon plug over a semiconductor substrate;
   (b) forming a hard mask over said silicon oxide film; and
   (c) subjecting the semiconductor substrate to a plasma etching treatment through the hard mask as an etching mask using an etching gas containing a fluorocarbon gas, oxygen and a dilution gas to process said silicon oxide insulating film, so as to form a hole in said silicon oxide insulating film down to the patterned silicon nitride film in such a manner that an upper surface of the doped polycrystalline silicon plug is exposed,
   wherein a pressure within the etching chamber during the plasma etching ranges from 1.3 to 4 Pa and a total flow rate of the etching gas passed into the etching chamber is 700 cm$^3$/minute or over.

* * * * *